United States Patent
Liu et al.

(10) Patent No.: US 11,930,676 B2
(45) Date of Patent: Mar. 12, 2024

(54) DISPLAY PANEL AND DISPLAY DEVICE

(71) Applicant: BOE TECHNOLOGY GROUP CO., LTD., Beijing (CN)

(72) Inventors: Lang Liu, Beijing (CN); Jingquan Wang, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 58 days.

(21) Appl. No.: 18/052,653

(22) Filed: Nov. 4, 2022

(65) Prior Publication Data
US 2023/0127411 A1  Apr. 27, 2023

Related U.S. Application Data

(63) Continuation of application No. 17/363,216, filed on Jun. 30, 2021, now Pat. No. 11,532,690.

(30) Foreign Application Priority Data

Aug. 28, 2020  (CN) .......................... 202010882447.1

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *H10K 50/844* (2023.02);
(Continued)

(58) Field of Classification Search
CPC .... H10K 59/131; H10K 59/40; H10K 59/122; H10K 59/121; H10K 77/111;
(Continued)

(56) References Cited

U.S. PATENT DOCUMENTS 10,529,283 B2 * 1/2020 Chai .................... G09G 3/3233
10,599,190 B2   3/2020 Nakamura et al.
(Continued)

FOREIGN PATENT DOCUMENTS

CN     107689196 A    2/2018
CN     108807426 A    11/2018
(Continued)

OTHER PUBLICATIONS

Extended European Search Report issued by the European Patent Office in Application No. 21193457.5, dated Jan. 25, 2022. 14 pages.

(Continued)

*Primary Examiner* — Sardis F Azongha
(74) *Attorney, Agent, or Firm* — Leason Ellis LLP

(57) ABSTRACT

A display panel and a display device are provided. The display panel includes a base substrate, a plurality of pixel drive circuit units, n first signal lines, a touch layer, and a light emitting element. A distance between first extending portions of two adjacent first signal lines is greater than a distance between first bending portions of the two adjacent first signal lines. An orthogonal projection overlap area between the first connecting portion and first extending portions of the n first signal lines is S1, and an orthogonal projection overlap area between the first connecting portion and first bending portions of the n first signal lines is S2. S1≥S2. A length of a first extending portion of at least one first signal line is L1, a distance between the first extending portion of at least one first signal line and the second electrode is H1, and H1≥(S1/n)/L1.

19 Claims, 37 Drawing Sheets

(51) Int. Cl.
  *H10K 50/844* (2023.01)
  *H10K 59/121* (2023.01)
  *H10K 59/122* (2023.01)
  *H10K 59/40* (2023.01)
  *H10K 59/65* (2023.01)
  *H10K 77/10* (2023.01)
  *G06F 3/044* (2006.01)
  *H10K 102/00* (2023.01)

(52) U.S. Cl.
  CPC ......... *H10K 59/121* (2023.02); *H10K 59/122* (2023.02); *H10K 59/40* (2023.02); *H10K 59/65* (2023.02); *H10K 77/111* (2023.02); *G06F 3/0445* (2019.05); *G06F 3/0446* (2019.05); *H10K 2102/311* (2023.02)

(58) Field of Classification Search
  CPC ............... H10K 50/844; G08G 3/0412; G08G 3/04164; G08G 3/0446; G08G 3/044
  See application file for complete search history.

(56) References Cited

U.S. PATENT DOCUMENTS

| | | | |
|---|---|---|---|
| 10,910,461 | B2 | 2/2021 | Lee et al. |
| 10,923,028 | B2 * | 2/2021 | Lin ................ G09G 3/3225 |
| 10,955,965 | B2 * | 3/2021 | Park ............... G06F 3/0446 |
| 11,093,059 | B2 | 8/2021 | Han et al. |
| 11,250,803 | B2 | 2/2022 | Han et al. |
| 11,296,267 | B2 | 4/2022 | Jang et al. |
| 2017/0154566 | A1 | 6/2017 | Ryoo et al. |
| 2019/0051670 | A1 | 2/2019 | Bei et al. |
| 2020/0044006 | A1 | 2/2020 | Lee et al. |
| 2020/0110525 | A1 | 4/2020 | Park et al. |
| 2020/0203458 | A1 | 6/2020 | Jin et al. |
| 2020/0242996 | A1 | 7/2020 | Wang et al. |
| 2020/0251543 | A1 | 8/2020 | Lee et al. |
| 2021/0159300 | A1 | 5/2021 | Cha et al. |
| 2021/0234125 | A1 | 7/2021 | Sung et al. |
| 2021/0408508 | A1 | 12/2021 | Zhang et al. |

FOREIGN PATENT DOCUMENTS

| | | |
|---|---|---|
| CN | 108957881 A | 12/2018 |
| CN | 109752421 A | 5/2019 |
| CN | 109901747 A | 6/2019 |
| CN | 110137369 A | 8/2019 |
| CN | 110288943 A | 9/2019 |
| CN | 110634935 A | 12/2019 |
| CN | 110678997 A | 1/2020 |
| CN | 110797373 A | 2/2020 |
| CN | 110850652 A | 2/2020 |
| CN | 111123587 A | 5/2020 |
| CN | 111381700 A | 7/2020 |
| CN | 211180490 A | 8/2020 |
| WO | 2020004730 A1 | 1/2020 |

OTHER PUBLICATIONS

Office Action for corresponding Chinese application No. 202011457395.X and its English translation, dated Sep. 3, 2021. 20 pages.

Indian Examination Report for corresponding Indian Patent Application No. 202114037697 dated Apr. 26, 2022. 7 pages.

Ex Parte Quayle Action for related U.S. Appl. No. 17/363,216, dated May 17, 2022.

Notice of Allowance for related U.S. Appl. No. 17/363,216, dated Aug. 2, 2022.

* cited by examiner

DISPLAY PANEL AND DISPLAY DEVICE

CROSS-REFERENCE TO RELATED APPLICATIONS

This application is the Continuation application of U.S. patent application Ser. No. 17/363,216, filed on Jun. 30, 2021, which claims priority to and the benefit of Chinese Patent Application No. 202010882447.1 filed on Aug. 28, 2020. The above-identified applications are incorporated by reference herein in their entirety.

TECHNICAL FIELD

Embodiments of the present disclosure relate to a display panel and a display device.

BACKGROUND

In recent years, the mobile display technology develops rapidly, and a new generation of display technology represented by flexible display is being used more and more widely. Meanwhile, the market's demand for display panels with a high screen-to-body ratio is becoming more and more urgent, and the existing design of display panels such as "notch screen" and "water drop screen" gradually cannot meet users' needs. In this context, an on-screen punching technology has emerged as a new design. Flexible display generally uses an organic light-emitting diode technology, and the light-emitting material thereof is an organic light-emitting material that is very sensitive to the surrounding environment. The organic light-emitting material cannot be exposed to an environment with water and oxygen; otherwise, it is prone to corrosion, which causes failure of the organic light-emitting material and abnormal display.

SUMMARY

At least one embodiment of the present disclosure provides a display panel, which comprises a base substrate. The display panel further comprises: a light-transmitting region, a display region at least partially surrounding the light-transmitting region, and a peripheral region between the display region and the light-transmitting region; a plurality of pixel drive circuit units, the plurality of pixel drive circuit units being at least partially in the display region; n first signal lines, configured to supply a first signal to the plurality of pixel drive circuit units, where at least one of the first signal lines comprises a first main body portion located in the display region, a first extending portion and a first bending portion located in the peripheral region, the first extending portion is electrically connected with the first main body portion, and the first bending portion at least partially surrounds the light-transmitting region, and is farther away from the first main body portion than the first extending portion; a touch layer, comprising a first touch signal line in the display region and a first connecting portion in the peripheral region, the first connecting portion being electrically connected with the first touch signal line, where among the n first signal lines, a distance between first extending portions of two adjacent first signal lines is greater than a distance between first bending portions of the two adjacent first signal lines, an orthogonal projection overlap area between the first connecting portion and first extending portions of the n first signal lines on the base substrate is S1, and an orthogonal projection overlap area between the first connecting portion and first bending portions of the n first signal lines on the base substrate is S2, S1≥S2, S1 is greater than zero, and n is an integer greater than 1; and a light emitting element, comprising a first electrode, a light emitting layer, and a second electrode, where the first electrode is on a side of the n first signal lines away from the base substrate, and is electrically connected with at least one pixel drive circuit unit, the second electrode is on a side of the first electrode away from the base substrate, and the light emitting layer is between the first electrode and the second electrode. Among the n first signal lines, a length of a first extending portion of at least one of the first signal lines is L1, in a direction perpendicular to the base substrate, a distance between the first extending portion of at least one of the first signal lines and the second electrode is H1, and the distance satisfies a formula: H1≥(S1/n)/L1.

For example, in the display panel provided by an embodiment of the present disclosure, the L1, the H1, and the S1 satisfy a formula: L1*H1=k*(S1/n), and k is a real number ranging from 1 to 20.

For example, in the display panel provided by an embodiment of the present disclosure, the L1, the H1, and the S1 satisfy a formula: L1*H1=k*(S1/n), and k is a real number ranging from 2 to 10.

For example, in the display panel provided by an embodiment of the present disclosure, in the direction perpendicular to the base substrate, a distance between the first connecting portion and the second electrode is H2, an area of a first extending portion of one of the n first signal lines is A1, and an area of the first connecting portion is A2, H2≥(1/k1)* (A2/nA1)*H1, and k1 is a real number ranging from 5 to 180.

For example, the display panel provided by an embodiment of the present disclosure further comprises: a first insulating layer, a second insulating layer, a third insulating layer, and a fourth insulating layer arranged in a direction away from the base substrate. A first extending portion of at least one of the n first signal lines is between the third insulating layer and the fourth insulating layer.

For example, in the display panel provided by an embodiment of the present disclosure, the first extending portion of at least one of the n first signal lines is on a side of the fourth insulating layer away from the base substrate, and the first extending portion is electrically connected with the first main body portion corresponding to the first extending portion through a via hole.

For example, in the display panel provided by an embodiment of the present disclosure, the plurality of pixel drive circuit units each comprise a first transistor, the first transistor is electrically connected with the light emitting element, and the light emitting element is on a side of the fourth insulating layer away from the base substrate; and the second electrode comprises a first sub-portion and a second sub-portion in the peripheral region, an orthogonal projection of the first sub-portion on the base substrate at least partially overlaps with an orthogonal projection of the fourth insulating layer on the base substrate, an orthogonal projection of the second sub-portion on the base substrate does not overlap with the orthogonal projection of the fourth insulating layer on the base substrate, an orthogonal projection overlap area between the first sub-portion and the first extending portions of the n first signal lines on the base substrate is S3, an orthogonal projection overlap area between the second sub-portion and the first bending portions of the n first signal lines on the base substrate is S4, and S3>S4.

For example, the display panel provided by an embodiment of the present disclosure further comprises: a pixel defining layer. The pixel defining layer is on a side of the fourth insulating layer away from the base substrate and comprises a plurality of pixel openings, and at least a portion of a light emitting layer of the light emitting element is in the plurality of pixel openings. The fourth insulating layer comprises a thinned portion that is in the peripheral region and does not overlap with an orthogonal projection of the first signal line on the base substrate, and a thickness of the thinned portion in the direction perpendicular to the base substrate is less than a thickness of the fourth insulating layer in the display region in the direction perpendicular to the base substrate.

For example, in the display panel provided by an embodiment of the present disclosure, at least one of the first signal lines is configured to receive electric potential of a first voltage range, the first sub-portion is configured to receive electric potential of a second voltage range, and a maximum value of absolute values of the first voltage range is greater than a maximum value of absolute values of the second voltage range.

For example, in the display panel provided by an embodiment of the present disclosure, the second electrode comprises a third sub-portion on the thinned portion, an included angle between a plane where the third sub-portion is located and a plane where the base substrate is located comprises a first slope angle $a1$, an included angle between a plane where the first connecting portion is located and the plane where the base substrate is located comprises a second slope angle $a2$, and the first slope angle $a1$ is greater than or equal to the second slope angle $a2$.

For example, in the display panel provided by an embodiment of the present disclosure, a value range of the second slope angle $a2$ is $0°$ to $10°$.

For example, in the display panel provided by an embodiment of the present disclosure, a width of the first connecting portion is greater than 10 μm; and a value range of a line width of at least one of the first signal lines is 1 μm to 5 μm.

For example, the display panel provided by an embodiment of the present disclosure further comprises: an encapsulation layer between the light emitting element and the touch layer, and a fifth insulating layer in the peripheral region. The encapsulation layer at least comprises a first organic encapsulation layer, and the fifth insulating layer is on a side of the first organic encapsulation layer away from the base substrate; the touch layer comprises a first dummy block, and the first dummy block comprises a first dummy sub-block at least partially provided on the fifth insulating layer; and a distance between the first connecting portion and the base substrate is less than a distance between the first dummy sub-block and the base substrate.

For example, in the display panel provided by an embodiment of the present disclosure, the fifth insulating layer comprises a first side face, the first dummy block is provided on the first side face, and an included angle between the first dummy block and the plane where the base substrate is located comprises a third slope angle $a3$, and $a3 \geq 5*a1 \geq a2$.

For example, in the display panel provided by an embodiment of the present disclosure, a value range of the third slope angle $a3$ is $30°$ to $60°$.

For example, the display panel provided by an embodiment of the present disclosure further comprises: a barrier structure between the display region and the light-transmitting region; an encapsulation layer between the light emitting element and the touch layer, and a fifth insulating layer in the peripheral region, where the encapsulation layer at least comprises a first organic encapsulation layer, and the fifth insulating layer is on a side of the first organic encapsulation layer away from the base substrate; and a first groove, where the first groove is on a side of the barrier structure away from the display region, a thickness of the fifth insulating layer in the first groove is $H8$, and $H8 \leq H2$.

For example, in the display panel provided by an embodiment of the present disclosure, in the direction perpendicular to the base substrate, a distance between the first connecting portion and the second electrode is $H2$. The display panel further comprises: a barrier structure between the display region and the light-transmitting region, and a second groove, the second groove being on a side of the barrier structure away from the display region; and a second dummy block, where the second dummy block is at least partially in the second groove, in the direction perpendicular to the base substrate, a distance between the second dummy block and the first dummy block is $H7$, and the $H7$ is different from the distance $H2$ between the first connecting portion and the second electrode. The second dummy block is farther away from the display region than the second electrode, and the second dummy block is in a floating connection.

For example, in the display panel provided by an embodiment of the present disclosure, an included angle between the second dummy block and the base substrate is less than or equal to an included angle between the first dummy block and the base substrate.

For example, in the display panel provided by an embodiment of the present disclosure, the touch layer further comprises a second touch signal line in the display region. The first touch signal line and the second touch signal line each comprise a plurality of electrode blocks that are electrically connected, two adjacent electrode blocks in the first touch signal line or the second touch signal line are electrically connected through a transfer portion, and a contact area between the transfer portion and the two adjacent electrode blocks is $S4$, $S1 \geq a*S4$, and a is a real number greater than 0.8.

At least one embodiment of the present disclosure further provides a display device, which comprises the display panel described above.

At least one embodiment of the present disclosure further provides a display panel, which comprises a base substrate. The display panel further comprises: a light-transmitting region, a display region at least partially surrounding the light-transmitting region, and a peripheral region between the display region and the light-transmitting region; a plurality of pixel drive circuit units, the plurality of pixel drive circuit units being at least partially in the display region; n first signal lines, configured to supply a first signal to the plurality of pixel drive circuit units, where at least one of the first signal lines comprises a first main body portion in the display region, a first extending portion and a first bending portion in the peripheral region, the first extending portion is electrically connected with the first main body portion, and the first bending portion at least partially surrounds the light-transmitting region, and is farther away from the first main body portion than the first extending portion, among the n first signal lines, a distance between first extending portions of two adjacent first signal lines is greater than a distance between first bending portions of the two adjacent first signal lines; a touch layer, comprising a first touch signal line in the display region and a first connecting portion in the peripheral region, the first connecting portion being electrically connected with the first touch signal line; m second signal lines, where the m second signal lines are configured to supply a second signal to the plurality of pixel drive circuit units, and the first connecting portion at least partially overlaps with an orthogonal projection of the m second signal lines on the base substrate; and a light emitting element, comprising a first electrode, a light emitting layer, and a second electrode, where the first electrode is on a side of the n first signal lines away from the base substrate, and is electrically connected with at least one pixel drive circuit unit, the second electrode is on a side of the first electrode away from the base substrate, and the light emitting layer is between the first electrode and the second electrode. Among the n first signal lines, a distance between first extending portions of two adjacent first signal lines is b1, among the n first signal lines, a distance between a first extending portion of at least one of the first signal lines and the second electrode in the direction perpendicular to the base substrate is H1; among the m second signal lines, a distance between two adjacent second signal lines in a region overlapping with the first connecting portion is b2, and among the m second signal lines, a distance between at least one of the m second signal lines and the second electrode in the direction perpendicular to the base substrate is H5, b1>b2, and H5>H1.

For example, in the display panel provided by an embodiment of the present disclosure, the first extending portion of the first signal line is a straight line segment, and the first bending portion of the first signal line is an arc line segment.

For example, in the display panel provided by an embodiment of the present disclosure, a width of the first connecting portion is greater than 10 μm, and a value range of a line width of at least one of the first signal lines is 1 μm to 5 μm.

For example, in the display panel provided by an embodiment of the present disclosure, a width of the first connecting portion ranges from 20 μm to 110 μm.

For example, the display panel provided by an embodiment of the present disclosure further comprises: a first insulating layer, a second insulating layer, a third insulating layer, and a fourth insulating layer arranged in a direction away from the base substrate. The first extending portion of at least one of the n first signal lines is between the third insulating layer and the fourth insulating layer.

At least one embodiment of the present disclosure further provides a display device, which comprises the display panel described above.

BRIEF DESCRIPTION OF THE DRAWINGS

In order to clearly illustrate the technical solutions of the embodiments of the present disclosure, the drawings of the embodiments will be briefly described in the following. It is obvious that the described drawings are only related to some embodiments of the present disclosure and thus are not limitative to the present disclosure.

DETAILED DESCRIPTION

Figure 1:
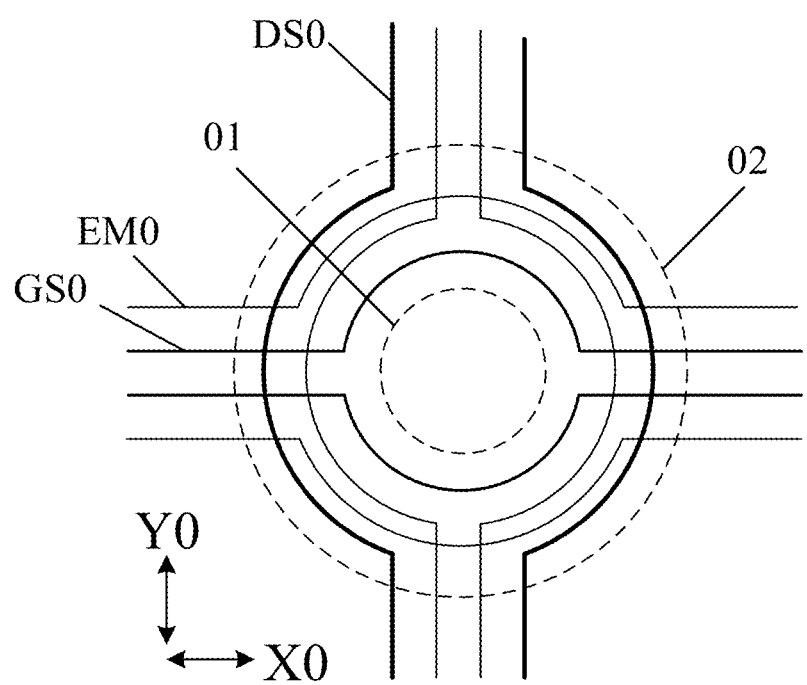
FIG. 1 is a schematic diagram of wiring of a hole region of a display panel.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the absolute position of the object which is described is changed, the relative position relationship may be changed accordingly.

In a related art, because a light-transmitting region exists in a display panel (e.g., the light-transmitting region may have a camera, a sensor, etc., arranged in a corresponding position), and because the signal line in a pixel drive circuit unit P, for example, one or more types of signal lines in a data signal line, or a gate signal line, or a reset signal line are usually made of an opaque metal material, wiring design is needed in the light-transmitting region to improve transmittance of the light-transmitting region. In addition, due to requirements on a width of a frame surrounding the light-transmitting region, denser metal wires may exist in the light-transmitting region, so these denser metal wires may cause electric potential disturbance to the cathode provided on a side thereof away from a base substrate.

An embodiment of the present disclosure discloses a display panel, which includes a base substrate, a plurality of pixel drive circuit units, n first signal lines, a touch layer, and a light emitting element. The base substrate includes a light-transmitting region, a display region at least partially surrounding the light-transmitting region, and a peripheral region between the display region and the light-transmitting region; a plurality of pixel drive circuit units, the plurality of pixel drive circuit units being at least partially located in the display region; n first signal lines, configured to supply a first signal to the plurality of pixel drive circuit units. At least one first signal line includes a first main body portion located in the display region, a first extending portion and a first bending portion located in the peripheral region, the first extending portion is electrically connected with the first main body portion, the first bending portion at least partially surrounds the light-transmitting region, and is farther away from the first main body portion than the first extending portion. Among the n first signal lines, a distance between first extending portions of two adjacent first signal lines is greater than a distance between first bending portions of the two adjacent first signal lines.

In some embodiments of the present disclosure, the signal line around the light-transmitting region is designed as an extending portion and a bending portion. In limited space, a separation distance between signal lines close to the display region is designed to be as large as possible, so as to ensure that some of the signal lines are relatively sparse, so that influence of the signal lines on some cathodes close to the display region is reduced, thereby improving the display effect.

In some embodiments of the present disclosure, the touch layer of the display panel includes a first touch signal line located in the display region and a first connecting portion located in the peripheral region, and the first connecting portion is electrically connected with the first touch signal line. An orthogonal projection overlap area between the first connecting portion and first extending portions of the n first signal lines on the base substrate is S1, an orthogonal projection overlap area between the first connecting portion and first bending portions of the n first signal lines on the base substrate is S2, S1≥S2, S1 is greater than zero, and n is an integer greater than 1. In this way, around the light-transmitting region, the touch signal line in the touch layer may also be designed to wind or jump, avoiding the light-transmitting region, thereby increasing transmittance of the light-transmitting region. In the embodiments of the present disclosure, the first connecting portion connected with the touch signal line in the display region is arranged in a position corresponding to the first extending portions of the n first signal lines, and is arranged in a position corresponding to the first bending portions of the n first signal lines as little as possible, so that in a position close to the display region, influence between the signal line in the pixel drive circuit unit, the cathode, and the connecting portion (e.g., the first connecting portion) of the touch signal line may be minimized in the peripheral region.

In some embodiments of the present disclosure, the light emitting element of the display panel includes a first electrode, a light emitting layer, and a second electrode; the first electrode is located on a side of the n first signal lines away from the base substrate, and is electrically connected with at least one pixel drive circuit unit; the second electrode is located on a side of the first electrode away from the base substrate, and the light emitting layer is located between the first electrode and the second electrode; among the n first signal lines, a length of a first extending portion of at least one first signal line is L1, in a direction perpendicular to the base substrate, a distance between a first extending portion of at least one first signal line and the second electrode is H1, and the distance satisfies a formula: H1≥(S1/n)/L1. In this way, in some embodiments of the present disclosure, in comprehensive consideration of the length of the first extending portion and an average value of the overlap areas between the n first signal lines and the first connecting portion, the distance between the first extending portion and the second electrode (e.g., the cathode) satisfies the above-described formula, which may minimize the influence between the first signal line, the cathode, and the first connecting portion as much as possible.

The embodiments of the present disclosure disclose a display panel. The display panel includes the base substrate. The display panel further includes the light-transmitting region, the display region at least partially surrounding the light-transmitting region, and the peripheral region between the display region and the light-transmitting region; the plurality of pixel drive circuit units, the plurality of pixel drive circuit units being at least partially located in the display region; n first signal lines, configured to supply the first signal to the plurality of pixel drive circuit units. At least one first signal line includes a first main body portion located in the display region, a first extending portion and a first bending portion located in the peripheral region, the first extending portion is electrically connected with the first main body portion, and the first bending portion at least partially surrounds the light-transmitting region, and is farther away from the first main body portion than the first extending portion. Among the n first signal lines, a distance between first extending portions of two adjacent first signal lines is greater than a distance between first bending portions of the two adjacent first signal lines. The display panel further includes the touch layer, the touch layer includes the first touch signal line located in the display region and the first connecting portion located in the peripheral region, and the first connecting portion is electrically connected with the first touch signal line. The orthogonal projection overlap area between the first connecting portion and the first extending portions of the n first signal lines on the base substrate is S1, the orthogonal projection overlap area between the first connecting portion and the first bending portions of the n first signal lines on the base substrate is S2, S1≥S2, S1 is greater than zero, and n is an integer greater than 1. The display panel further includes the light emitting element, the light emitting element includes the first electrode, the light emitting layer, and the second electrode, the first electrode is located on the side of the first signal line away from the base substrate, and is electrically connected with at least one pixel drive circuit unit. The second electrode is located on the side of the first electrode away from the base substrate, and the light emitting layer is located between the first electrode and the second electrode. Among the n first signal lines, a length of a first extending portion of at least one first signal line is L1, in the direction perpendicular to the base substrate, a distance between a first extending portion of at least one first signal line and the second electrode is H1, and the distance satisfies a formula: H1≥(S1/n)/L1.

In some embodiments of the present disclosure, the separation distance between a first extending portion and a first bending portion of the plurality of first signal lines, the position from the display region, the average value of the overlap areas between the n first signal lines and the first connecting portion, the distance between the first extending portion and the second electrode (e.g., the cathode), etc., are considered, which may minimize the influence between the first signal line, the cathode, and the first connecting portion as much as possible.

At least one embodiment of the present disclosure further provides a display device including the above-described display panel.

The embodiments and their examples of the present disclosure will be described in detail below in conjunction with the accompanying drawings.

FIG. 1 is a schematic diagram of wiring of a hole region of a display panel. As shown in FIG. 1, the display panel includes a display region 10, a light-transmitting region 01, and a peripheral region 02 between the display region 10 and the light-transmitting region 01. For example, the light-transmitting region 01 may be configured to allow light to pass through, and to have a camera, a sensor, etc., arranged in a corresponding region. For example, the light-transmitting region 01 may be an opening, or may also be blind hole design that reserves a base substrate or a film layer (e.g., an inorganic insulating layer) with higher transmittance on the base substrate, or may also be blind hole design that removes some film layers (e.g., opaque metal film layers) with lower transmittance in the region on the base substrate. In some embodiments of the present disclosure, the light-transmitting region 01 is described by taking an opening as an example, and devices such as a camera and a sensor are usually arranged in a region where the opening 01 (the light-transmitting region 01) is located.

Figure 3A:
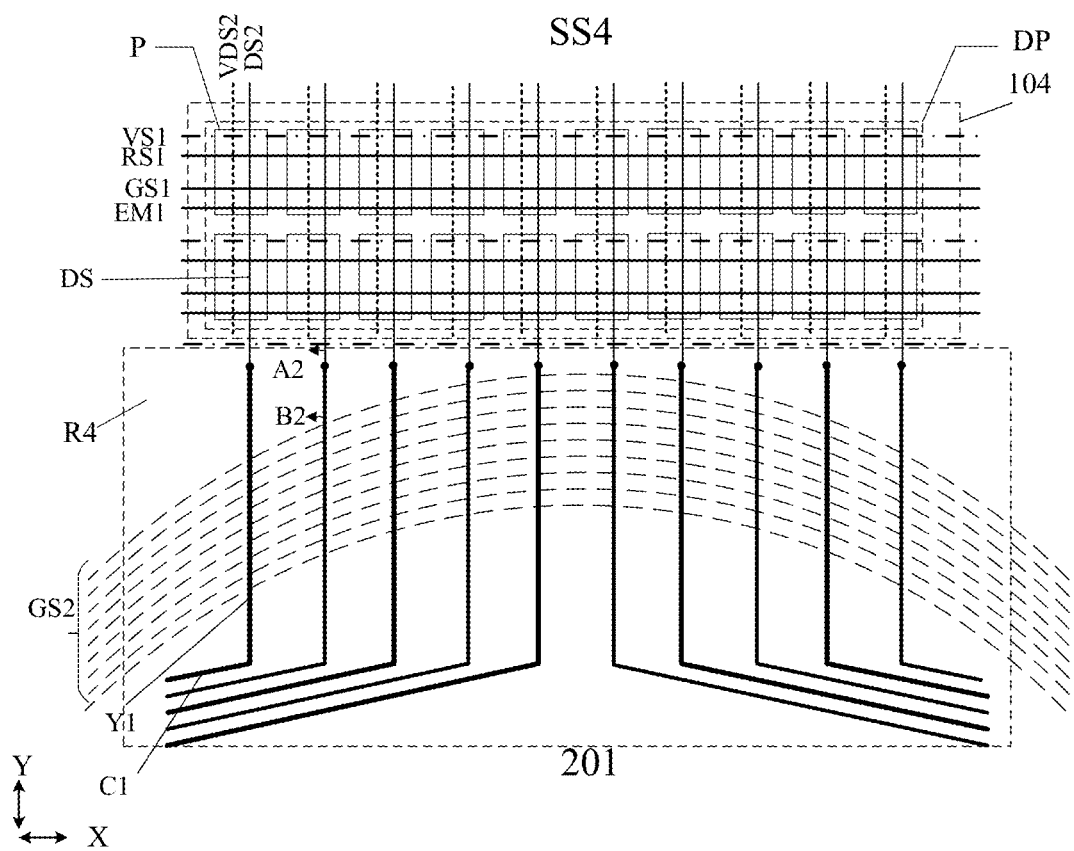
FIG. 3A is an enlarged schematic diagram of a fourth side of a light-transmitting region of a display panel provided by at least one embodiment of the present disclosure.
Figure 3B:
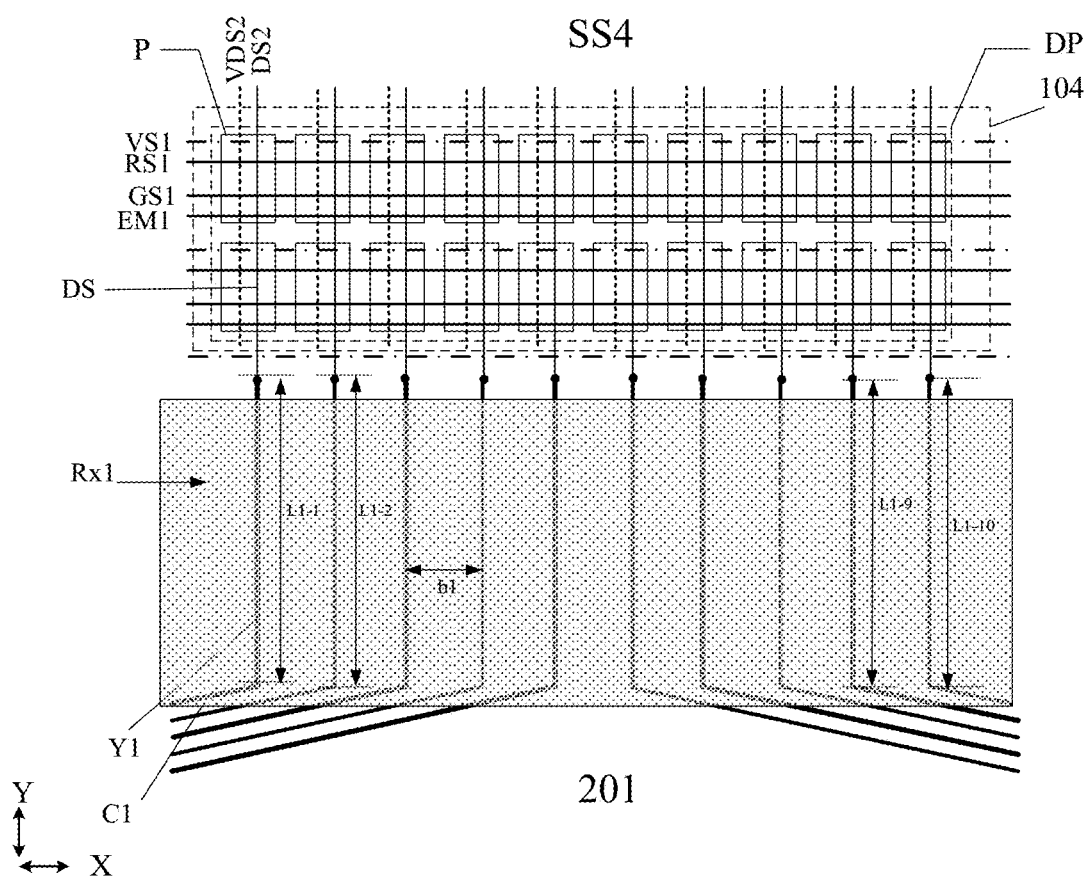
FIG. 3B is an enlarged schematic diagram of a fourth side of a light-transmitting region of a display panel provided by at least another embodiment of the present disclosure.

In some embodiments of the present disclosure, FIG. 3A is an enlarged schematic diagram of a fourth side of a light-transmitting region of a display panel provided by at least one embodiment of the present disclosure; and FIG. 3B is an enlarged schematic diagram of a fourth side of a light-transmitting region of a display panel provided by at least another embodiment of the present disclosure. As shown in FIG. 3A and FIG. 3B, the display panel includes a display region and a plurality of pixel drive circuit units P, and the plurality of pixel drive circuit units P are at least partially located in the display region. The display panel further includes a first signal line DS2 which is configured to supply a first signal to the plurality of pixel drive circuit units P. At least one first signal line includes a first main body portion DS located in the display region, a first extending portion Y1 and a first bending portion C1 located in the peripheral region, the first extending portion Y1 is electrically connected with the first main body portion DS, and the first bending portion C1 at least partially surrounds the light-transmitting region 01 and is farther away from the first main body portion DS than the first extending portion Y1. Among the n first signal lines DS2, a distance between first extending portions Y1 of two adjacent first signal lines DS2 is greater than a distance between first bending portions C1 of the two adjacent first signal lines. In this way, the signal lines around the light-transmitting region are designed as extending portions (e.g., the first extending portions Y1) and bending portions (e.g., the first bending portions C1), in limited space, the separation distance between signal lines close to the display region is designed to be as large as possible, so as to ensure that some of the signal lines are relatively sparse, so that the influence of the signal lines on some cathodes close to the display region is reduced, thereby improving the display effect.

Figure 3C:
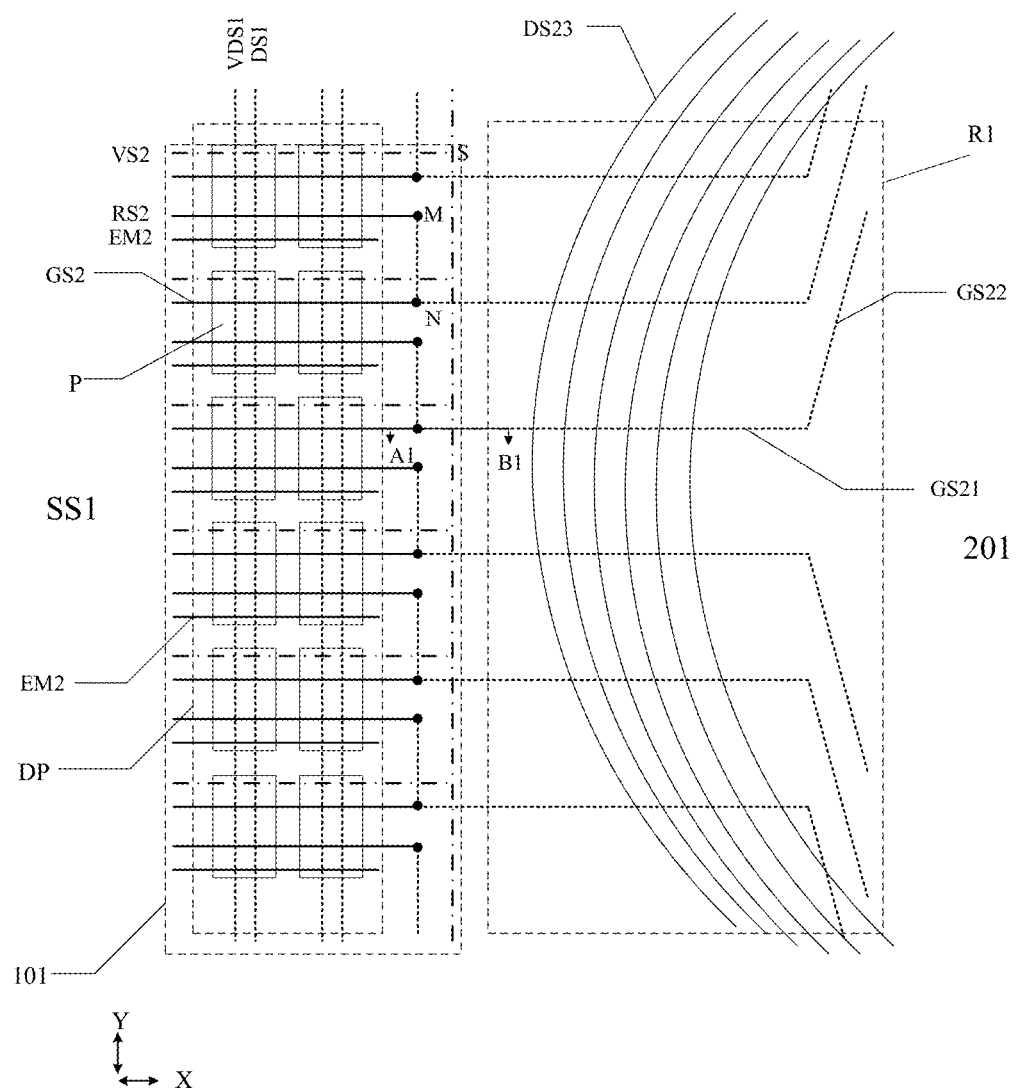
FIG. 3C is an enlarged schematic diagram of a first side of a light-transmitting region of a display panel provided by at least one embodiment of the present disclosure.
Figure 5:
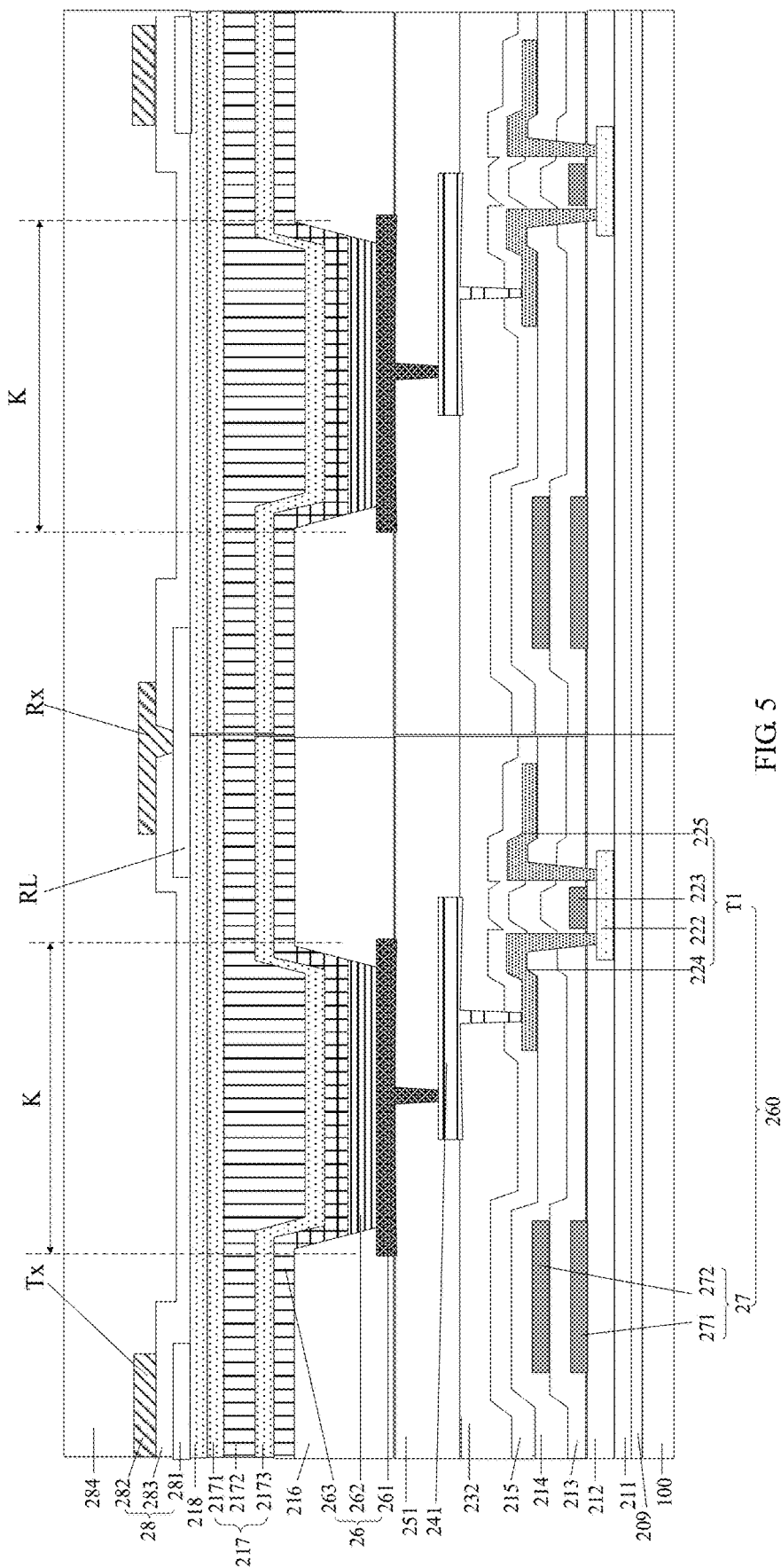
FIG. 5 is a cross-sectional schematic diagram of a display region of a display panel provided by at least one embodiment of the present disclosure.
Figure 6A:
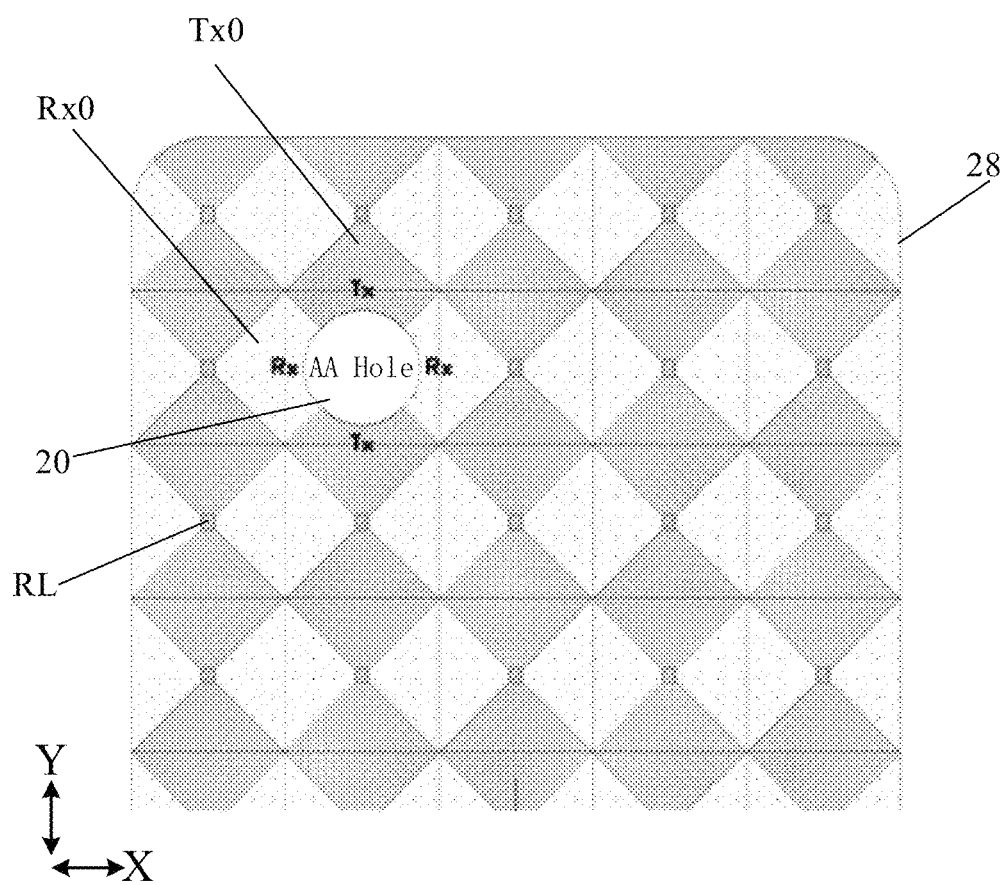
FIG. 6A is a schematic diagram of a touch layer of a display panel provided by at least one embodiment of the present disclosure.
Figure 6B:
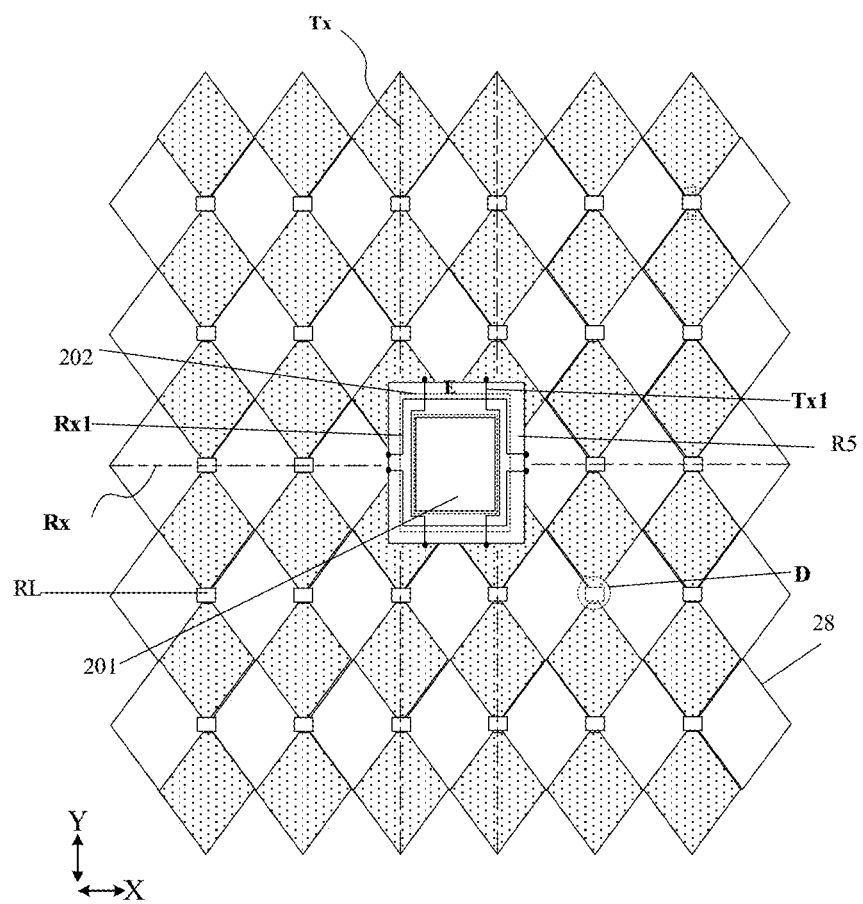
FIG. 6B is a schematic diagram of a touch layer of a display panel provided by at least another embodiment of the present disclosure.

In some embodiments of the present disclosure, FIG. 3C is an enlarged schematic diagram of a first side of a light-transmitting region of a display panel provided by at least one embodiment of the present disclosure, FIG. 5 is a cross-sectional schematic diagram of a display region of a display panel provided by at least one embodiment of the present disclosure, and FIG. 6B is a schematic diagram of a touch layer of a display panel provided by at least another embodiment of the present disclosure. As shown in FIG. 3C, FIG. 5 and FIG. 6B, the display panel further includes a touch layer 28, the touch layer 28 includes a first touch signal line Rx located in the display region 10 and a first connecting portion Rx1 located in a peripheral region 202, and the first connecting portion Rx1 is electrically connected with the first touch signal line Rx; an orthogonal projection overlap area between the first connecting portion Rx1 and first extending portions Y1 of the n first signal lines DS2 on the base substrate is S1, an orthogonal projection overlap area between the first connecting portion Rx1 and first bending portions C1 of the n first signal lines DS2 on the base substrate is S2, S1≥S2, S1 is greater than zero, and n is an integer greater than 1. In this way, around the light-transmitting region, the touch signal line in the touch layer may also be designed to wind or jump, avoiding the light-transmitting region, thereby increasing transmittance of the light-transmitting region. In the embodiments of the present disclosure, the first connecting portion of the touch signal line in the display region is arranged in a position corresponding to the first extending portions Y1 of the n first signal lines DS2, and is arranged in a position corresponding to the first bending portions C1 of the n first signal lines DS2 as little as possible, so that in a position close to the display region, influence between the signal line in the pixel drive circuit unit, the cathode, and the connecting portion (e.g., the first connecting portion Rx1) of the touch signal line may be minimized in the peripheral region.

For example, orthogonal projection overlap areas of first extending portions Y1-1, Y1-2 . . . Y1-$n$ of n first signal lines D0-1, D0-2 . . . D0-$n$ on the base substrate are respectively S1-1, S1-2 . . . S1-$n$, S1 is a sum of S1-1, S1-2 . . . S1-$n$. For example, orthogonal projection overlap areas between the first connecting portion Rx1 and first bending portions C1-1, C1-2 . . . C1-$n$ of then first signal lines D0-1, D0-2 . . . D0-$n$ on the base substrate are respectively S2-1, S2-2 . . . S2-$n$, S2 is a sum of S2-1, S2-2 . . . S2-$n$, where, S1≥S2. In a specific embodiment, S2 may be equal to 0, that is to say, orthogonal projections of the first connecting portion Rx1 and the first bending portions C1-1, C1-2 . . . C1-$n$ of the n first signal lines D0-1, D0-2 . . . D0-$n$ on the base substrate do not overlap with each other. In a specific embodiment, n may be an integer among 5, 6, 7, 8 . . . 20, and as the light-transmitting region increases, the value of n may continue to increase, which is not limited in the present disclosure.

Figure 12A:
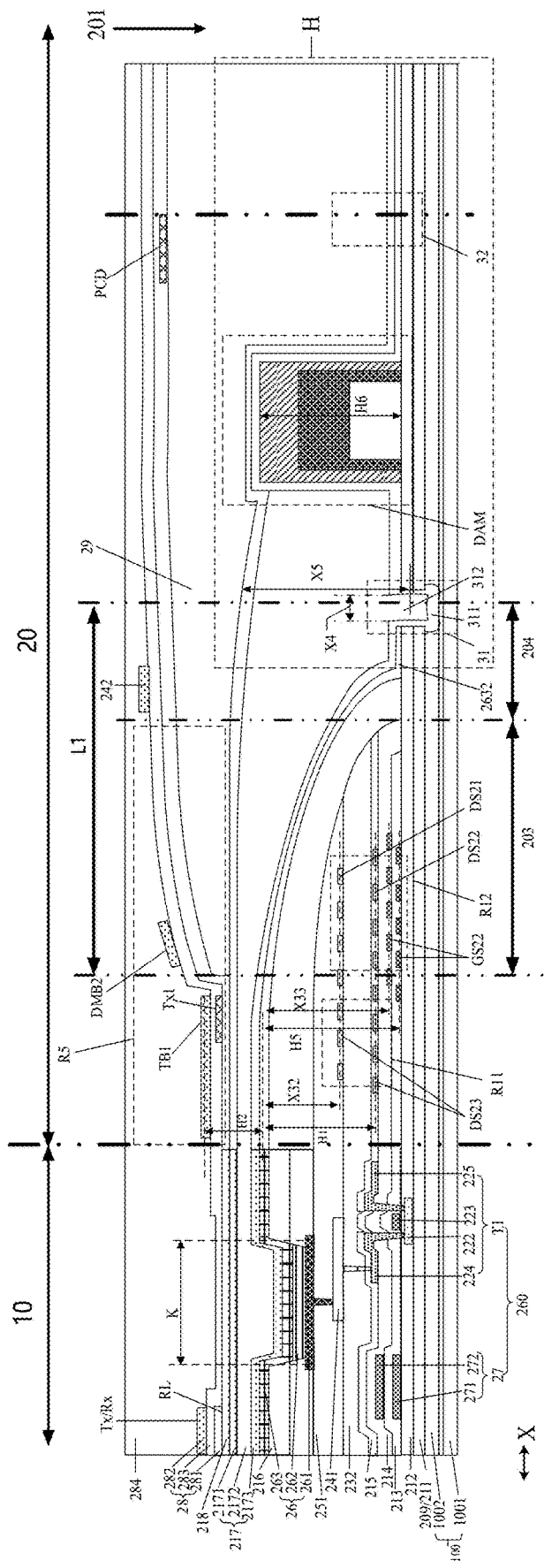
FIG. 12A is a cross-sectional schematic diagram of a display region and a light-transmitting region of a display panel provided by at least another embodiment of the present disclosure.

In some embodiments of the present disclosure, FIG. 12A is a cross-sectional schematic diagram of a display region and a light-transmitting region of a display panel provided by at least another embodiment of the present disclosure. As shown in FIG. 5 and FIG. 12A, the display panel further includes a light emitting element 26; the light emitting element 26 includes a first electrode 261, a light emitting layer 262, and a second electrode 263; the first electrode 261 is located on a side of the first signal line DS2 away from the base substrate 100, and is electrically connected with at least one pixel drive circuit unit P; and the second electrode 263 is located on a side of the first electrode 261 away from the base substrate 100, and the light emitting layer 262 is located between the first electrode 261 and the second electrode 263. Among the n first signal lines DS2, a length of a first extending portion Y1 of at least one first signal line is L1, in the direction perpendicular to the base substrate 100, a distance (e.g., a vertical distance) between a first extending portion Y1 of at least one first signal line and the second electrode is H1, and the distance satisfies a formula: H1≥(S1/n)/L1. In this way, with the conditions together, that is, the length of the first extending portion Y1 and the average value of the overlap areas between the n first signal lines D0 and the first connecting portion, and the distance between the first extending portion Y1 and the second electrode (e.g., the cathode) satisfies the above-described formula, and the influence between the first signal line, the cathode, and the first connecting portion may be minimized.

Figure 3D:
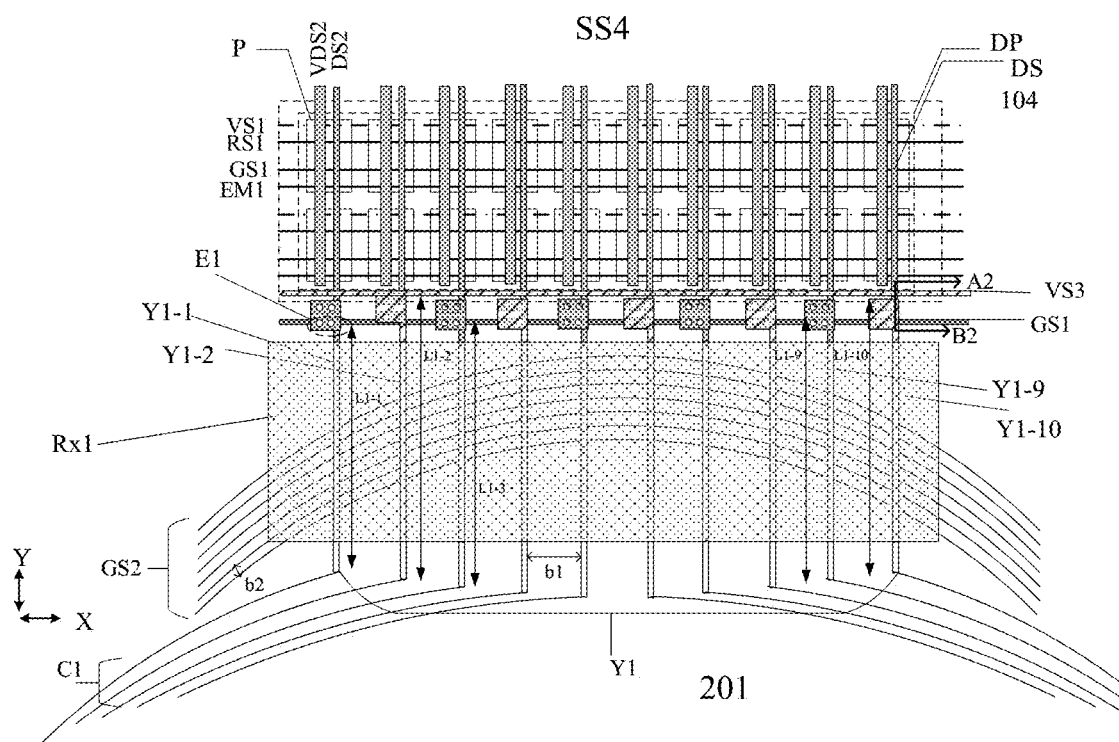
FIG. 3D is an enlarged schematic diagram of a fourth side of a light-transmitting region of a display panel provided by at least another embodiment of the present disclosure.

For example, the first extending portion length L1 may be a length between the first signal line main body portion DS and the first bending portion C1, as shown in FIG. 3D, may be L1-1, L1-2 . . . L1-$n$. For example, in the direction perpendicular to the base substrate 100, the distance H1 between the first extending portion Y1 and the second electrode 263 may be a vertical distance from a surface of the first extending portion to the second electrode 263; or may also be a vertical distance from a bottom face of the first extending portion to the second electrode 263; or may also be a vertical distance from a position that is half of the thickness of the first extending portion to the second electrode 263.

It should be noted that, the vertical distance according to the embodiments of the present disclosure is a distance in the direction perpendicular to the base substrate 100.

It should be noted that, in consideration of a measurement error, the "length, width, thickness, distance, etc." in the present disclosure may allow a measurement error within 25%.

In some embodiments of the present disclosure, as shown in FIG. 1, the display panel includes the light-transmitting region 01 and the peripheral region 02 at least partially surrounding the light-transmitting region 01. The display panel further includes the display region and the plurality of pixel drive circuit units P, and the plurality of pixel drive circuit units P are at least partially located in the display region. The display panel further includes the first signal line DS2 which is configured to supply the first signal to the plurality of pixel drive circuit units P. At least one first signal line includes a first main body portion DS located in the display region, a first extending portion Y1 and a first bending portion C1 located in the peripheral region, the first extending portion Y1 is electrically connected with the first main body portion DS, and the first bending portion C1 at least partially surrounds the light-transmitting region 01 and is farther away from the first main body portion DS than the first extending portion Y1. The display panel further includes the touch layer 28, the touch layer 28 includes the first touch signal line Rx located in the display region and the first connecting portion Rx1 located in the peripheral region 02, and the first connecting portion Rx1 is electrically connected with the first touch signal line Rx. Among the n first signal lines DS2, a distance between first extending portions Y1 of two adjacent first signal lines is greater than a distance between first bending portions C1 of the two adjacent first signal lines. The orthogonal projection overlap area between the first connecting portion Rx1 and the first extending portions Y1 of then first signal lines DS2 on the base substrate is S1, the orthogonal projection overlap area between the first connecting portion Rx1 and the first bending portions C1 of the n first signal lines DS2 on the base substrate is S2, S1≥S2, S1 is greater than zero, and n is an integer greater than 1. The display panel further includes the light emitting element. The light emitting element includes the first electrode, the light emitting layer, and the second electrode 263. The first electrode is located on the side of the first signal line away from the base substrate, and is electrically connected with at least one pixel drive circuit unit P. The second electrode 263 is located on the side of the first electrode away from the base substrate, and the light emitting layer is located between the first electrode and the second electrode 263. Among the n first signal lines D0, a length of a first extending portion Y1 of at least one first signal line is L1, in the direction perpendicular to the base substrate 100, a distance (e.g., the vertical distance) between a first extending portion Y1 of at least one first signal line and the second electrode 263 is H1, and the distance satisfies a formula: $H1 \geq (S1/n)/L1$. Because there are more signal lines arranged, for example, signal lines wind around the light-transmitting region, by adopting the design according to the embodiments of the present disclosure, the distance H1 from the signal line, for example, the extending portion of the first signal line, to the cathode takes into consideration of its own line length and an average value of sums of the overlap areas between the n first signal lines D0 (e.g., D0-1, D0-2, D0-3 ... D0-$n$) and the first connecting portion Rx1, and satisfies $H1 \geq (S1/n)/L1$, so that influence between the first signal line, the cathode, and the first connecting portion is minimized.

For example, as shown in FIG. 3D, description is given by taking the value of n as 10, and a line width of the first signal line D0 as 2 μm. The first extending portion length Y1 of at least one first signal line D0 is: L1-1=160 μm, orthogonal projection overlap areas of first extending portions Y1-1, Y1-2 ... Y1-10 of 10 first signal lines D0-1, D0-2 ... D0-10 on the base substrate are each: S1-1=150*2=300 μm²; when the overlap areas between the first extending portions of the 10 first signal lines and the first connecting portion Rx1 are equal, S1=S1-1*10=3000 μm²; then (S1/n)/L1=1.9 μm; and the distance H1 between the first extending portion Y1-1 of the first signal line D0 and the second electrode 263 is greater than 1.9 μm, which, thus, may ensure relatively less influence of the signal line in this region on the cathode and the touch connecting portion.

For example, the distance H1 may be 2 μm, 3 μm, 4 μm, 5 μm, 6 μm, 8 μm, etc., in consideration of process capability and an actual panel thickness, the distance H1 may be adjusted as long as it is greater than the above-described minimum value.

It should be noted that, the orthogonal projection overlap areas of the first extending portions Y1-1, Y1-2 ... Y1-10 of the 10 first signal lines D0-1, D0-2 ... D0-10 on the base substrate may also be unequal, and actual calculation requirements shall prevail.

In some embodiments of the present disclosure, the display panel further includes a plurality of light emission control signal lines EM0 extending along a first direction X0, a plurality of second signal lines extending along the first direction X0, for example, scan signal lines GS, and a plurality of first signal lines extending along a second direction Y0, for example, data signal lines DS0. The display region may be arranged around the light-transmitting region 01, or may also partly around a left side, a right side, and a lower side of the light-transmitting region 01; or the left side and the lower side of the light-transmitting region 01; or the right side and the lower side of the light-transmitting region 01.

Figure 2:
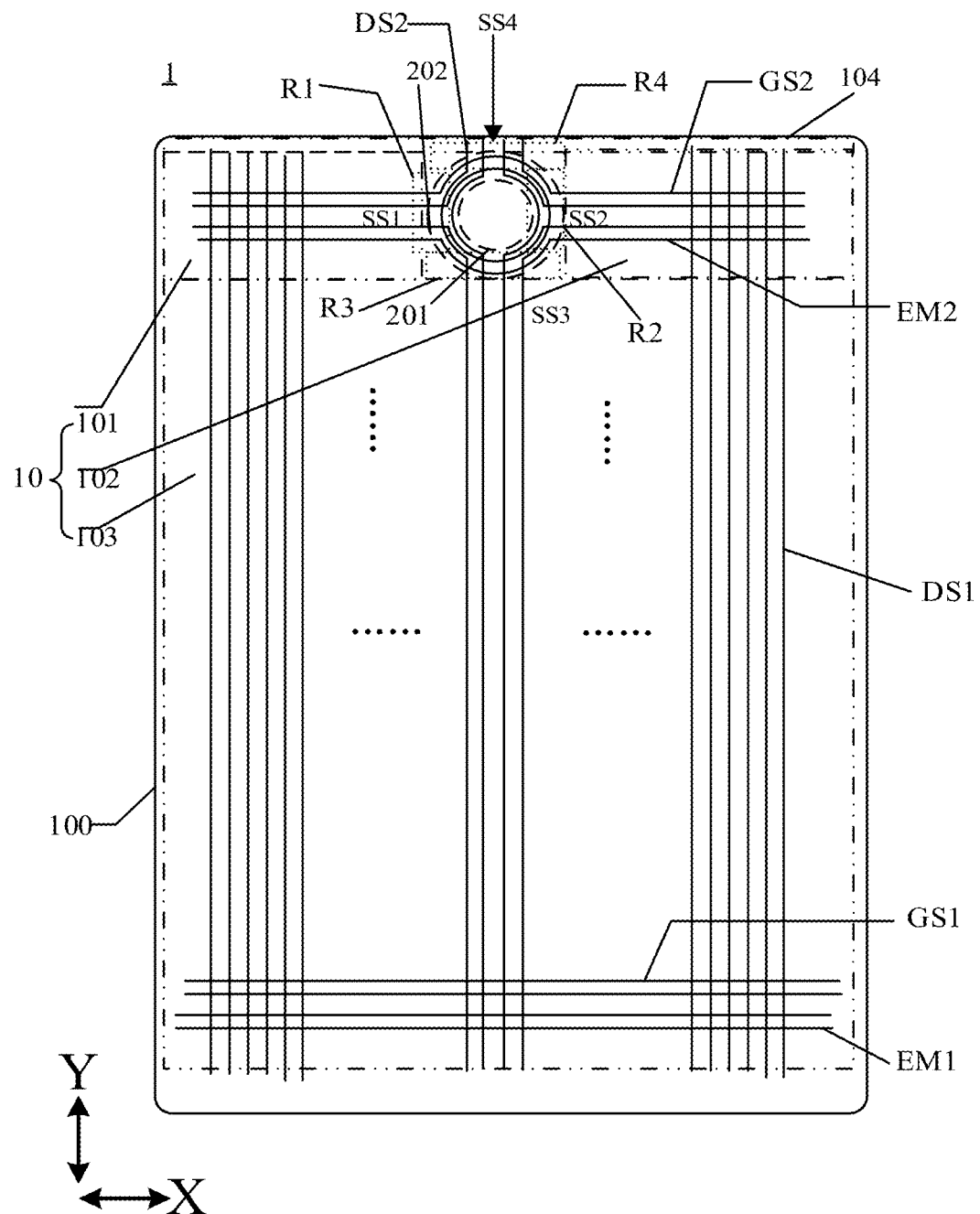
FIG. 2 is a plane view of a display panel provided by at least one embodiment of the present disclosure.

FIG. 2 is a plane view of a display panel provided by at least one embodiment of the present disclosure. As shown in FIG. 2, the display panel 1 includes a base substrate 100, a plurality of second signal lines GS2, GS1, and a plurality of first signal lines DS2, DS1. The plurality of second signal lines GS2, GS1 extend along a first direction X, for example, for supplying a first display signal (e.g., a gate scan signal), and the plurality of first signal lines DS2, DS1 extend along a second direction Y, for example, for supplying a second display signal (e.g., a data signal). The display panel includes a light-transmitting region (an opening 201 is taken as an example in this embodiment), and a peripheral region 202 surrounding the opening 201. The peripheral region 202 includes a first winding region R1 located on a first side SS1, a second winding region R2 located on a second side SS2, a third winding region R3 located on a third side SS3, and a fourth winding region R4 located on a fourth side SS4. The first side SS1 and the second side SS2 are opposite to each other in the first direction X, and the third side SS3 and the fourth side SS4 are opposite to each other in the second direction Y different from the first direction X.

It should be noted that, in the embodiments of the present disclosure, for the convenience of description, the peripheral region 02 is divided into the above-described four winding regions; in actual design, the above-described four winding regions have no specific limits; and in some embodiments of the present disclosure, the above-described four winding regions may be understood as wiring situations of the opening 201 in four directions, i.e., "up, down, left, and right", and are not limited thereto.

In some embodiments of the present disclosure, the display panel may further include a plurality of third signal lines EM1, EM2. The plurality of third signal lines EM1, EM2 extend along the first direction X and are configured to supply a second display signal (e.g., a light emission control signal).

It should be noted that, the opening 201 is a via hole or a notch. For example, when the opening 201 is configured to arrange a camera, the opening 201 is a via hole; and when the opening 201 is configured to arrange a fingerprint recognition sensor, an infrared sensor, a distance sensor, etc., the opening 201 is a notch.

For example, in some embodiments, the first direction X and the second direction Y intersect with each other; and the first direction X and the second direction Y may be perpendicular to each other.

For example, in other embodiments, the display panel may further include two openings; and shapes of the openings may also be different from that of the opening 201 in FIG. 2, for example, the opening is a racetrack shape. The present disclosure is introduced by taking FIG. 2 as an example, and embodiments with other shapes and numbers of openings are modifications of the embodiment shown in FIG. 2, and no details will be repeated here.

For example, the display panel provided by the embodiments of the present disclosure may be a display panel such as an organic light-emitting diode (OLED) display panel or a quantum dot light emitting diode (QLED) display panel, and the specific type of the display panel is not limited in the embodiments of the present disclosure.

For example, as shown in FIG. 2, the display region 10 at least partially surrounds the opening 201, which may also be understood as the display region 10 at least partially surrounds the peripheral region 202. The display region 10 includes a first display sub-region 101, a second display sub-region 102, and a third display sub-region 103. The first display sub-region 101 is located on a first side SS1 of the opening 201; the second display sub-region 102 is located on a second side SS2 of the opening 201; and the third display sub-region 103 is located on a third side SS3 of the opening 201. The plurality of first signal lines DS1 extend along the second direction Y, for example, the display region other than pixel rows and pixel columns occupied by the light-transmitting region (the opening 201), the first signal line DS1 passes through the first display sub-region 101 and the third display sub-region 103, or the second display sub-region 102 and the third display sub-region 103. The plurality of first signal lines DS2 pass through the peripheral region 202 from the third side SS3 of the opening 201 to the fourth side SS4 of the opening 201 along the second direction Y.

For example, as shown in FIG. 2, in the embodiments of the present disclosure, the plurality of second signal lines GS2 pass through the first display sub-region 101, the peripheral region 202, and the second display sub-region 102 along the first direction X, and wire around the opening 201 in the peripheral region 202. The plurality of second signal lines GS2 wire through the third winding region R3 or the fourth winding region R4 of the peripheral region 202. The plurality of third signal lines EM2 pass through the first display sub-region 101 and the third display sub-region 103. The plurality of third signal lines EM1 pass through the third display sub-region 103 along the first direction X.

In some embodiments of the present disclosure, at least one of the signal lines along the X direction such as the plurality of second signal lines GS2 and the plurality of third signal lines EM2 may also be disconnected at the opening 201, without wiring.

In some embodiments of the present disclosure, for example, the second signal line GS2 is a gate scan signal. When the display panel adopts double-sided drive, the second signal line GS2 may also pass through both sides, for example, the left side and the right side of the display panel to supply scan signal to the pixel drive circuit, without wiring design, so as to alleviate the problem of tight signal arrangement space in the peripheral region 202.

For example, as shown in FIG. 2, the display region 10 may further include a fourth display sub-region 104, and the fourth display sub-region 104 is located on a fourth side SS4 of the light-transmitting region. For example, the fourth display sub-region 104 is in contact with the first display sub-region 101 and the second display sub-region 102 in the second direction Y. The plurality of first signal lines DS1, along the second direction Y, pass through the fourth display sub-region 104, the first display sub-region 101, and the third display sub-region 103, or pass through the fourth display sub-region 104, the second display sub-region 102, and the third display sub-region 103. The plurality of first signal lines DS2 pass through the peripheral region 202 from the third display sub-region 103 to the fourth display sub-region 104 along the second direction Y. In other words, the display panel includes a plurality of first signal lines DS1; and in the extension direction thereof, no pixel unit is missing in a position where they pass through due to design of the light-transmitting region (the opening region), so the plurality of first signal lines DS1 does not need wiring design in the light-transmitting region. The display panel includes a plurality of first signal lines DS2, because there are normal pixel units missing in the position along the extension direction thereof, wiring design is performed in the embodiments of the present disclosure so as to ensure that the signal thereof may be supplied to the corresponding pixel unit normally.

It should be noted that, in the embodiments of the present disclosure, for the convenience of description and solution understanding, the display region is divided into a first display sub-region, a second display sub-region, a third display sub-region, and a fourth display sub-region. In actual design, the above-described four display regions have no specific limits; and in some embodiments of the present disclosure, the above-described four display regions may be understood as display positions of the opening 201 in the four directions, i.e., "up, down, left, and right", and are not as limitations to the embodiments of the present disclosure.

It should be noted that, according to the design position of the light-transmitting region 201, at least one of the first display region, the fourth display region and the second display region may be reduced or cancelled according to an actual distance between the light-transmitting region 201 and a frame of the display panel. For example, when the light-transmitting region 201 is arranged as close as possible to an upper frame of the display panel, because the light-transmitting region 201 is very close to the upper frame of the display panel, there is no need to display on an upper portion of the light-transmitting region 201, in this case, the fourth display region may be removed; design of the opening 201 in other positions is the same, and no details are repeated here.

For example, the display region further includes a pixel array, and the pixel array includes a plurality of sub-pixels at least located in the first display sub-region, the second display sub-region, and the third display sub-region. FIG. 3C is an enlarged schematic diagram of a first side of a light-transmitting region of a display panel provided by at least one embodiment of the present disclosure. For example, as shown in FIG. 3C, the display region 10 further includes a pixel array DP, and the pixel array DP includes a plurality of pixel drive circuit units P located in the display region (for example, description is given by taking the first display sub-region 101, which may also be understood as a light-transmitting region (e.g., the opening 201) as an example), e.g., a plurality of pixel drive circuit units P in the first display sub-region 101. For example, as shown in FIG. 3A, the pixel array DP further includes a plurality of pixel drive circuit units P located in the fourth display sub-region 104. The plurality of pixel drive circuit units P are also located in the second display sub-region 102 and the third display sub-region 103 (not shown); and an arrangement mode of the plurality of pixel drive circuit units P in the second display sub-region 102 and the third display sub-region 103 is the same as the arrangement mode of the plurality of pixel drive circuit units P located in the first display sub-region 101 in FIG. 3C and the plurality of pixel drive circuit units P located in the fourth display sub-region 104 in FIG. 3A. The plurality of second signal lines GS2, GS1 are configured to supply first display signals (e.g., gate scan signals) to the plurality of pixel drive circuit units P of the pixel array DP, and the plurality of first signal lines DS2, DS1 are configured to supply second display signals (e.g., data signals) to the plurality of pixel drive circuit units P of the pixel array DP. The plurality of third signal lines EM1, EM2 are configured to supply second display signals (e.g., light emission control signals) to the plurality of pixel drive circuit units P of the pixel array DP.

It should be noted that, FIG. 3A is an enlarged schematic diagram of the fourth side SS4 of the light-transmitting region 201, the enlarged schematic diagram of the third side SS3 of the light-transmitting region 201 that is opposite to the fourth side SS4 is substantially the same in structure as that of FIG. 3A, and no details are repeated here. FIG. 3C is an enlarged schematic diagram of the first side SS1 of the light-transmitting region 201, and the enlarged schematic diagram of the second side SS2 of the light-transmitting region 201 that is opposite to the first side SS1 is substantially the same in structure as that of FIG. 3C, and no details are repeated here.

For example, as shown in FIG. 3A and FIG. 3B, the first signal line DS2 includes a first bending portion C1 located in the peripheral region 202 and a first extending portion Y1 located in the peripheral region 202. The first extending portion Y1 extends along the second direction Y, the first extending portion Y1 is connected with the first bending portion C1, and the first bending portion C1 is provided at least partially surrounding the opening 201.

In some embodiments of the present disclosure, the extending portion of the signal line, for example, the first signal line extending portion Y1, may be substantially linear, for example, the first signal line may be a data line, and the extending portion Y1 of the data line may also be substantially linear extending along the second direction Y. The bending portion of the signal line, for example, the bending portion of the first signal line may have a shape of a broken line or an arc, for example, the first signal line may be a data line, and the bending portion C1 of the data line may be a broken line or an arc segment arranged at least partially surrounding the light-transmitting region 201.

For example, as shown in FIG. 3A and FIG. 3B, the first bending portion C1 may be arranged partially surrounding the opening 201 in the first winding region R1. For example, the first bending portion C1 may be arranged partially surrounding the opening 201 in the fourth winding region R4. It may be understood that, in actual design, the first bending portion C1 may be provided in the peripheral region 202.

For example, film layers in which first extending portions Y1 and first bending portions C1 of two adjacent first signal lines DS2 are located in the peripheral region 202 (e.g., the fourth winding region R4) may be the same or different; and for example, film layers in which first extending portions Y1 and first bending portions C1 of two adjacent first signal lines DS2 are located are different, so that electrical influence between the first signal lines may be reduced, for example, signal crosstalk may be reduced, and so on.

For example, as shown in FIG. 3A and FIG. 3C, the display panel may further include a second signal line GS2; the second signal line GS2 includes a second extending portion GS21 and a second bending portion GS22; the second bending portion GS22 passes through the fourth winding region R4; and the second signal line GS2 and the first signal line DS2 are located in different layers in the peripheral region. In this way, uniformity of signals on the left side and the right side of the light-transmitting region 201 of the display panel may be improved.

For example, the second signal line GS2 may also be disconnected in the light-transmitting region 201, in this case, there is no second signal line GS2, for example, there is no second extending portion GS21, or second bending portion GS22 (a dotted line in FIG. 3A indicates that GS2 may be omitted here) in the peripheral region 202. In this way, the problem of tight wiring space in the peripheral region 202 may be alleviated.

In some embodiments of the present disclosure, as shown in FIG. 3A, in the fourth winding region R4 (e.g., and the third winding region R3), density of the first signal lines DS2, that is, density of the first extending portions Y1 of the first signal lines DS2 is less than density of the second signal lines GS2, i.e., density of the second bending portions GS22 of the second signal lines GS2, which, thus, is favorable for reducing influence of dense wiring of the peripheral region 202 on electric potential of the electrode (e.g., the cathode) of the light emitting element.

For example, as shown in FIG. 3C, in the first winding region R1 (e.g., and the second winding region R2), an orthogonal projection of the second signal line GS2 on the base substrate 100 intersects with an orthogonal projection of the first bending portion C1 of the first signal line DS2 on the base substrate 100. For example, in the first winding region R1 (e.g., and the second winding region R2), density of the second signal lines GS2, for example, density of the second bending portions GS22 of the second signal lines GS2, is less than density of the first signal lines DS2, for example, density of the first extending portions Y1 of the first signal lines DS2, which, thus, is favorable for reducing influence of dense wiring of the peripheral region 202 on electric potential of the electrode (e.g., the cathode) of the light emitting element.

For example, a film layer in which at least a portion of at least one first signal line is located in the opening peripheral region is different from a film layer in which the at least one first signal line is located in the display region. As shown in FIG. 3C, the film layer in which the second signal line extending portion GS21 and the second bending portion GS22 of the second signal line GS2 are located in the first winding region R1 (e.g., and the second winding region R2) of the opening peripheral region 201 is different from the film layer in which the second signal line GS2 is located in the display region 100. For example, the first extending portion Y1 changing layers in routing and the first extending portion Y1 without changing layers in routing may be spaced apart. In other words, the second signal line GS2 changes layers when the second signal line GS2 extends from the first display region 101 to the opening peripheral region 201, so as to reduce routing density of the second signal line GS2, which, thus, is favorable for reducing influence of dense wiring of the peripheral region 202 on electric potential of the electrode (e.g., the cathode) of the light emitting element.

It should be noted that, the wiring "density" according to the embodiments of the present disclosure refers to the number of wires per unit area, for example, the number of wires per unit distance in the first direction or the second direction, or may be understood as that, "density" refers to the distance between two adjacent wires perpendicular to a wiring direction.

For example, as shown in FIG. 3A and FIG. 3C, the display panel 1 further includes reset signal lines RS1, RS2 extending along the first direction X. Each of the reset signal lines RS1, RS2 supplies a reset signal to a corresponding sub-pixel P of the pixel array DP. The plurality of reset signal lines RS2 are disconnected at an edge of the first display region 101 that is close to the peripheral region 202 and connected with the second signal line GS2, for example, the reset signal line RS2 is disconnected at point M and coupled to point N of the second signal line GS2 passing through the next row of sub-pixels P, so as to alleviate the problem of tight wiring space in the peripheral region 202.

For example, as shown in FIG. 3A and FIG. 3C, the display panel 1 further includes initialization signal lines VS1, VS2 extending along the first direction X; and each of the initialization signal lines VS1, VS2 supplies an initialization signal to a corresponding sub-pixel P in the pixel array DP. The plurality of initialization signal lines VS2 pass through the first display sub-region 101 and the second display sub-region 102. The plurality of initialization signal lines VS2 are disconnected at an edge of the first display region 101 that is close to the peripheral region 202, for example, disconnected at point S, so as to alleviate the problem of tight wiring space in the peripheral region 202.

For example, FIG. 3D is an enlarged schematic diagram of a fourth side of a light-transmitting region of a display panel provided by at least another embodiment of the present disclosure. As shown in FIG. 3D, the third signal line EM2 is designed to wind on a side of the first display sub-region 101 and the second display sub-region 102 that are close to the light-transmitting region 202, so as to improve display uniformity.

Figure 3E:
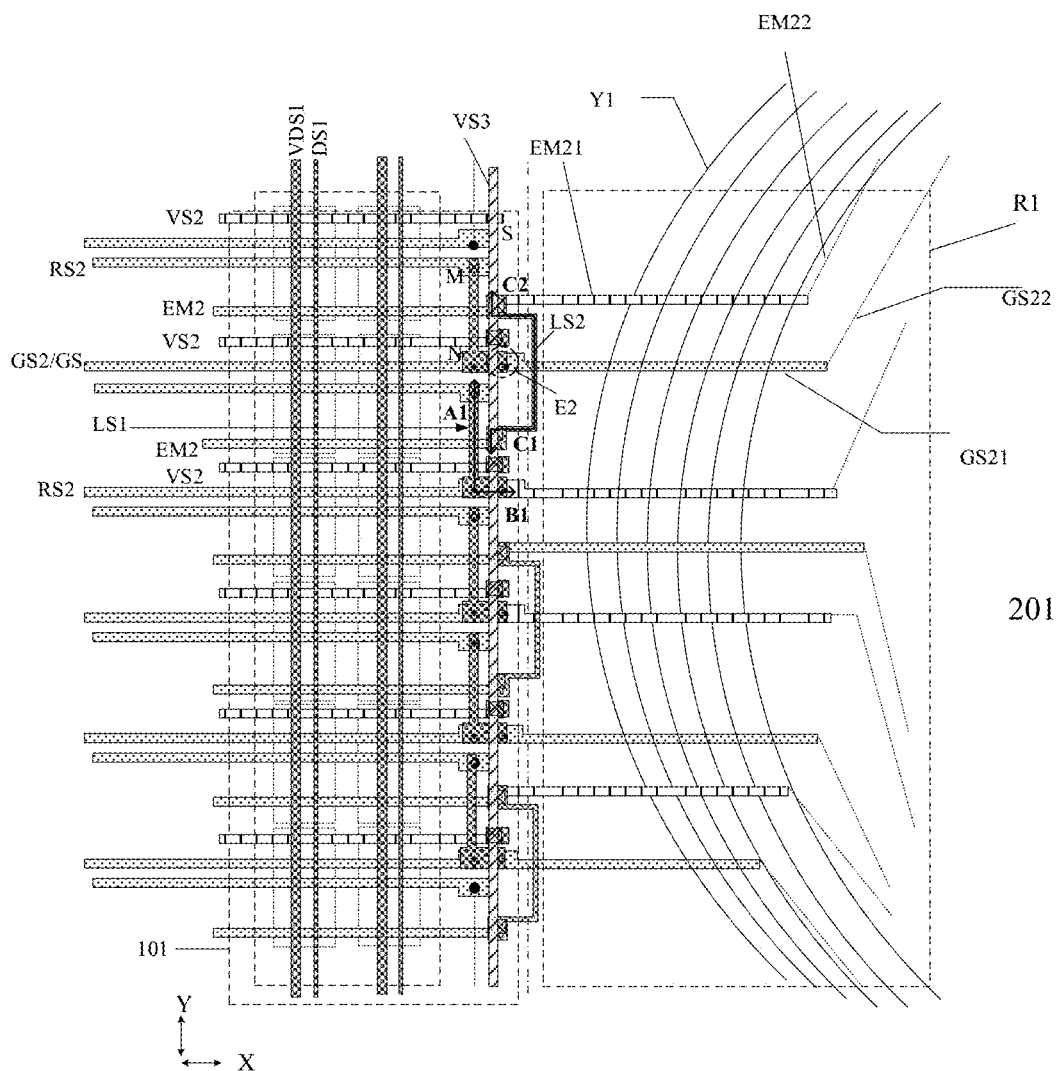
FIG. 3E is an enlarged schematic diagram of a first side of a light-transmitting region of a display panel provided by at least another embodiment of the present disclosure.

For example, FIG. 3E is an enlarged schematic diagram of a first side of a light-transmitting region of a display panel provided by at least another embodiment of the present disclosure. As shown in FIG. 3B and FIG. 3E, the third signal line EM2 is disconnected on a side of the first display sub-region 101 and the second display sub-region 102 that is close to the light-transmitting region 202 (e.g., a dotted line on a right side in FIG. 3E indicates that EM22 may not be provided), so as to reduce wiring density of the peripheral region 202.

For example, as shown in FIG. 3A and FIG. 3C, the display panel 1 further includes a power line VDS1 and a power line VDS2 extending along the second direction Y. For example, each of the power lines VDS1, VDS2 supplies a high-level signal to a corresponding sub-pixel P in the pixel array DP. The power line VDS1 passes through the first display sub-region 101 and the third display sub-region 103, or the second display sub-region 102 and the third display sub-region 103. The power line VDS2 passes through the fourth display sub-region 104, and the power line VDS2 is disconnected at an edge of the fourth display sub-region 104 that is close to the fourth winding region R4, without passing through the fourth winding region R4, so as to reduce wiring density of the peripheral region 202.

It should be noted that, when the third signal line EM2 and the initialization signal line VS2 are disconnected on the side of the first display sub-region 101 and the second display sub-region 102 that is close to the light-transmitting region 202, the display panel 1 may adopt a double-sided driving mode. For example, gate drive circuits are arranged on the left side and the right side of the display panel 1, to respectively connect the third signal line EM2 and the initialization signal line VS2 of the first display sub-region 101 and the second display sub-region 102.

Figure 4A:
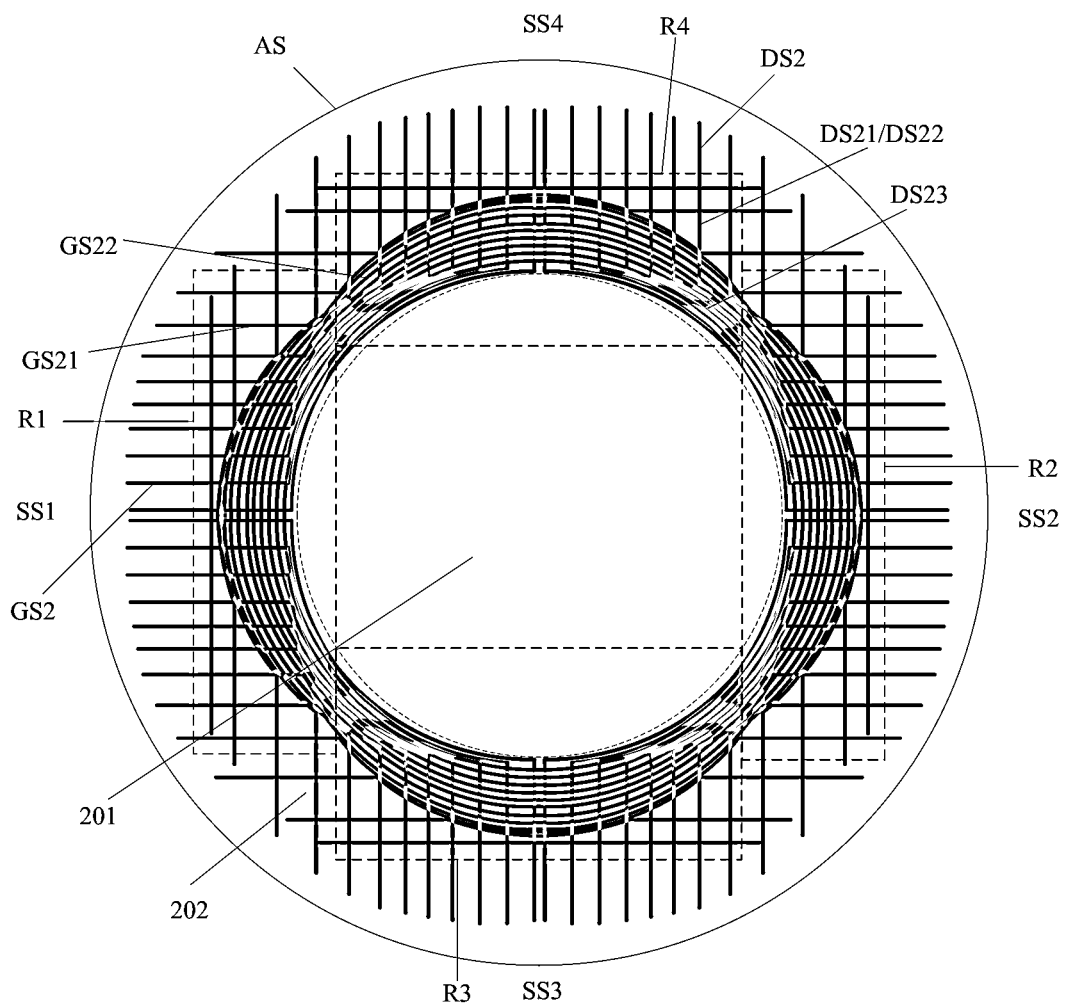
FIG. 4A is a schematic diagram of a light-transmitting region of a display panel provided by at least another embodiment of the present disclosure.

For example, FIG. 4A is a schematic diagram of a display panel provided by at least another embodiment of the present disclosure. As shown in FIG. 4A, the first winding region R1 and the second winding region R2 may be arranged opposite to each other in the first direction X, and design ideas of the two regions are substantially the same, for example, they may be arranged symmetrically; the third winding region R3 and the fourth winding region R4 are arranged opposite to each other, and design ideas of the two regions are substantially the same, for example, they may be arranged symmetrically. It should be noted that, when wiring in the first winding region R1 and the second winding region R2 are introduced below, the first winding region R1 is taken as an example, and the second winding region R2 will not be repeated in detail. When wiring in the third winding region R3 and the fourth winding region R4 are introduced below, the fourth winding region R4 is taken as an example, and the third winding region R3 will not be repeated in detail.

For example, as shown in FIG. 4A, in some embodiments of the present disclosure, distribution density of the first extending portions Y1 of the first signal lines DS2 is less than distribution density of the first bending portions C1 of the first signal lines DS2. It may be understood as that, the separation distance between two adjacent first extending portions Y1 is greater than the separation distance between two adjacent first bending portions C1.

For example, as shown in FIG. 4A, in some embodiments of the present disclosure, the display panel further includes a second signal line. Density of second signal lines GS2 located in the first winding region R1 (or the second winding region R2) is less than density of second signal lines GS2 located in the third winding region R3 (or the fourth winding region R4).

Figure 4B:
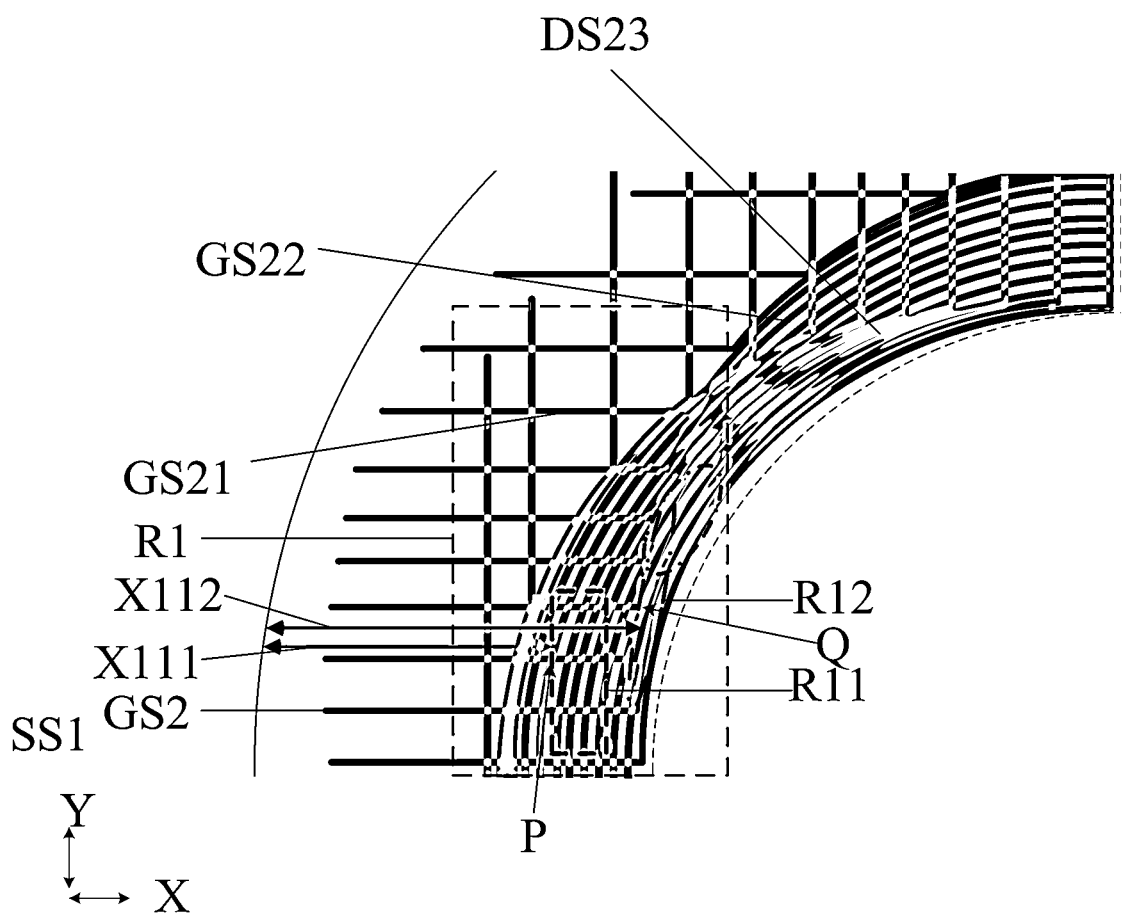
FIG. 4B is an enlarged schematic diagram of a first side of a light-transmitting region of a display panel provided by at least another embodiment of the present disclosure.

For example, FIG. 4B is a partially enlarged schematic diagram of a first side and a fourth side of a light-transmitting region 201 of a display panel provided by at least another embodiment of the present disclosure. As shown in FIG. 4B, the first winding region R1 further includes a first sub-region R11 (a dashed rectangular frame in the figure) and a second sub-region R12 (an elliptical frame in the figure). A distance X111 between the first sub-region R11 and a boundary AS of the display region 10 that is close to the opening 201 is less than a distance X112 between the second sub-region R12 and a boundary of the display region 10 that is close to the first winding region R1. That is to say, the first sub-region R11 is closer to the display region 10 than the second sub-region R12. It should be noted that, the distance X111 and the distance X112 are intended to schematically illustrate the relative positional relationship between the first sub-region R11 and the second sub-region R12.

In some embodiments of the present disclosure, as shown in FIG. 4B, the first sub-region R11 is a region where an orthogonal projection of the second signal line extending portion GS21 on the base substrate and an orthogonal projection of the first bending portion C1 of the first signal line DS2 on the base substrate interest with each other. That is to say, the first sub-region R11 is a region where a straight wire and an arc wire interest with each other. The second sub-region R12 is a region where an orthogonal projection of the second bending portion GS22 on the base substrate and an orthogonal projection of the first bending portion C1 of the first signal line DS2 on the base substrate interest with each other. That is to say, the second sub-region R12 is a region where an arc wire and another arc wire interest with each other.

In some embodiments of the present disclosure, as shown in FIG. 4B, density of second signal lines GS2 and first signal lines DS2 located in the first sub-region R1 is less than density of second signal lines GS2 and first signal lines DS2 located in the second sub-region R2. That is to say, density of second signal line extending portions GS21 and first bending portions C1 in the first sub-region R1 is less than density of second bending portions GS22 and first bending portions C1 in the second sub-region R2.

In some embodiments of the present disclosure, as shown in FIG. 4B, the first sub-region R11 is closer to the display region 10 than the second sub-region R12. It may be understood that, there is a position P where a straight wire and an arc wire interest with each other in the first sub-region R11, and the distance from the position P to the display region is less than the distance from position Q where an arc wire and another arc wire interest with each other in the second sub-region R12 to the display region. Because the second sub-region R12 with denser wiring is farther away from the display region 10 than the first sub-region R11, influence of dense wiring in the opening peripheral region on electric potential of the electrode (e.g., the cathode) of the light emitting element may be reduced.

Figure 4C:
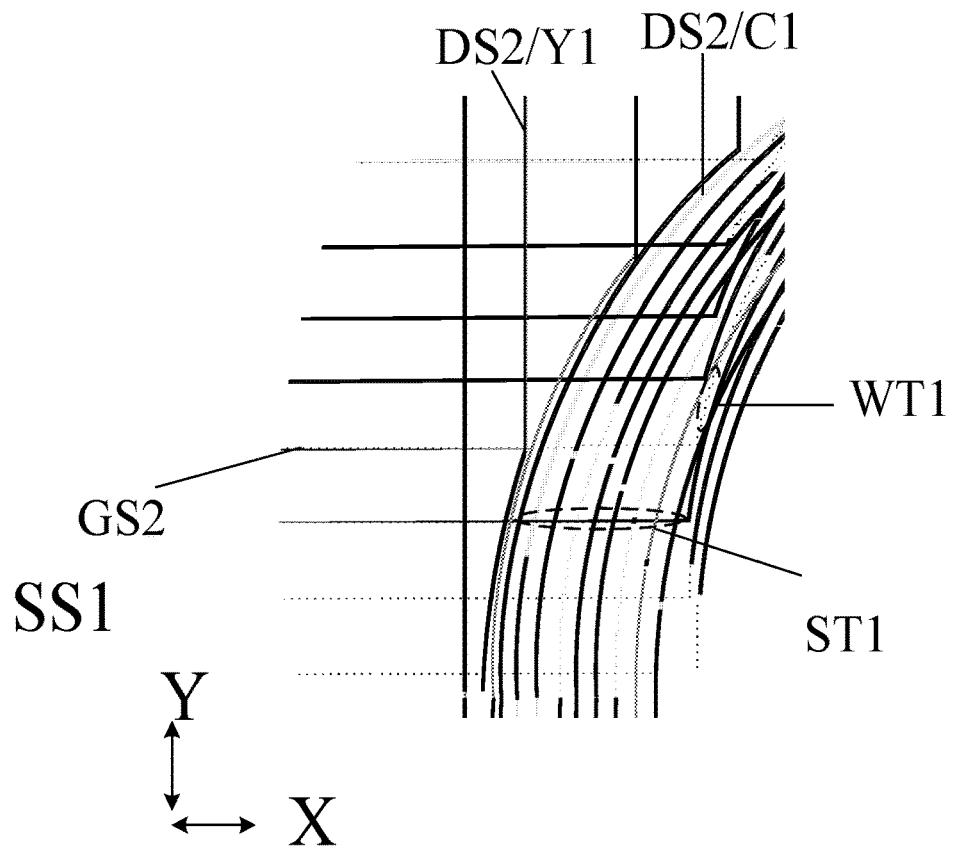
FIG. 4C is an enlarged schematic diagram of a first side of a light-transmitting region of a display panel provided by at least another embodiment of the present disclosure.

For example, FIG. 4C is an enlarged schematic diagram of a first side of a light-transmitting region of a display panel provided by at least another embodiment of the present disclosure. As shown in FIG. 4C, the second signal line extending portion GS21 includes a plurality of second extending overlapping portions ST1 that overlaps by projection with the first signal line DS2, for example, the first bending portion C1. The second bending portion GS22 connected with the second signal line extending portion GS21 includes a second bending overlapping portion WT1 that overlaps by projection with the first signal line DS2, for example, the first bending portion C1.

Figure 4D:
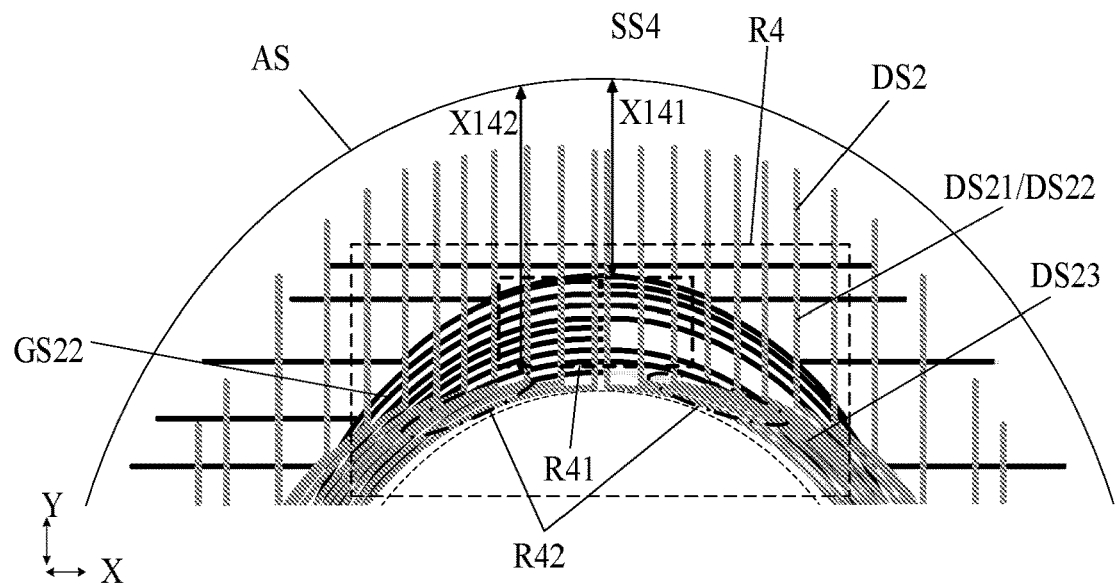
FIG. 4D is an enlarged schematic diagram of a fourth side of a light-transmitting region of a display panel provided by at least another embodiment of the present disclosure.

For example, FIG. 4D is an enlarged schematic diagram of a fourth side of a light-transmitting region of a display panel provided by at least another embodiment of the present disclosure. As shown in FIG. 4C and FIG. 4D, the fourth winding region R4 further includes a third sub-region R41 (a dashed rectangular frame in the figure) and a fourth sub-region R42 (an elliptical frame in the figure). A distance X141 from the third sub-region R41 to a boundary AS of the display region 10 that is close to the light-transmitting region 201 is less than a distance X142 from the fourth sub-region R42 to a boundary AS of the display region 10 that is close to the fourth winding region R4. That is to say, the third sub-region R41 is closer to the display region 10 than the fourth sub-region R42. It should be noted that, the distance X141 and the distance X142 are intended to schematically illustrate the relative positional relationship between the third sub-region R41 and the fourth sub-region R42. In the third sub-region R41, an orthogonal projection of the first extending portion Y1 (shown in FIG. 4C) on the base substrate and an orthogonal projection of the second bending portion GS22 of the second signal line GS2 on the base substrate intersect with each other. That is to say, in the third sub-region R41, a straight wire and an arc wire intersect with each other. In the fourth sub-region R42, an orthogonal projection of the second bending portion GS22 on the base substrate and an orthogonal projection of the first bending portion C1 of the first signal line DS2 on the base substrate intersect with each other. That is to say, in the fourth sub-region R42, an arc wire and another arc wire intersect with each other.

Figure 4E:
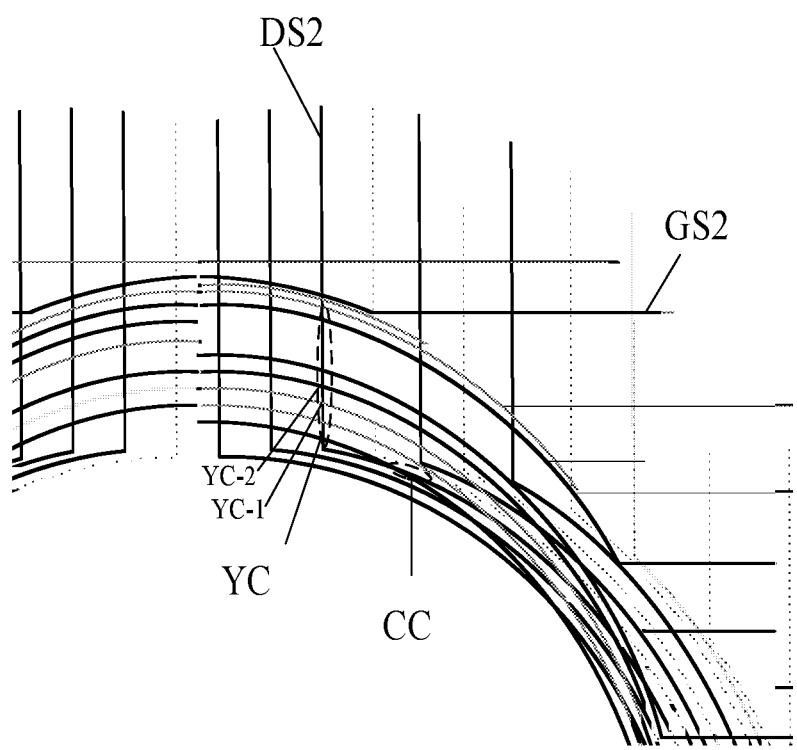
FIG. 4E is a partially enlarged schematic diagram of a fourth side of a light-transmitting region of a display panel provided by at least another embodiment of the present disclosure.
Figure 4F:
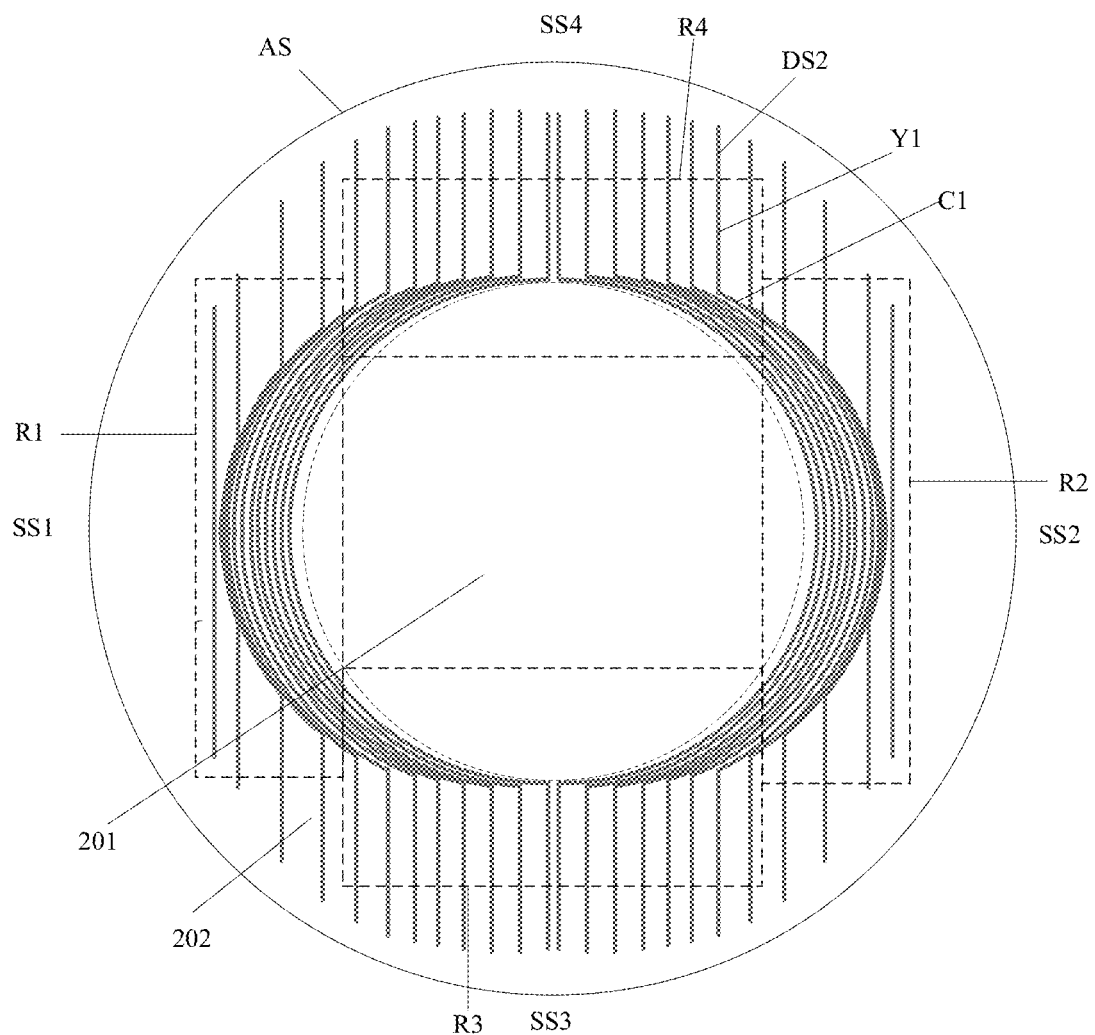
FIG. 4F is a schematic diagram of a light-transmitting region of a display panel provided by at least another embodiment of the present disclosure.

For example, in at least one embodiment of the present disclosure, FIG. 4F is a schematic diagram of a light-transmitting region of a display panel provided by at least another embodiment of the present disclosure. As shown in FIG. 4D and FIG. 4F, density of second signal lines GS2 and first signal lines DS2 located in the third sub-region R41 is less than density of second signal lines GS2 and first signal lines DS2 located in the fourth sub-region R42. That is to say, density of first extending portions Y1 and second bending portions GS22 in the third sub-region R41 is less than density of second bending portions GS22 and first bending portions C1 in the fourth sub-region R42. Because the fourth sub-region R42 with denser wiring is farther away from the display region 10 than the third sub-region R41, influence of dense wiring in the opening peripheral region on electric potential of the electrode (e.g., the cathode) of the light emitting element may be reduced.

FIG. 5 is a cross-sectional schematic diagram of a display region of a display panel provided by at least one embodiment of the present disclosure. As shown in FIG. 5, the display panel 1 includes a barrier layer 209, a buffer layer 211, a first insulating layer 212 (e.g., a first gate insulating layer), a second insulating layer 213 (e.g., a second gate insulating layer), and a third insulating layer 214 (e.g., an interlayer gate insulating layer) and a passivation layer 215 (e.g., an inorganic passivation layer). The barrier layer 209 is located on the base substrate 100, and the buffer layer 211 is located on a side of the barrier layer 209 away from the base substrate 100. Each of the plurality of pixel drive circuit units P in the display region 10 includes a sub-pixel drive circuit 260. The sub-pixel drive circuit 260 may be connected with the second signal line GS1, the first signal line DS1, and the third signal line EM1, etc. The sub-pixel drive circuit 260 includes a first transistor T1 and a light emitting element 26. The first transistor T1 is connected with the light emitting element 26, and the first transistor T1 is configured to supply a light emission drive signal to the light emitting element 26. The display panel 1 may further include a first planarization layer 232, a first transfer electrode 241, and a second planarization layer 251.

For example, the first transfer electrode 241 may be made of a material the same as that of a source-drain electrode of the transistor, for example, one or more of titanium (Ti), aluminum (Al), copper (Cu), molybdenum (Mo), etc. For example, it may be a titanium-aluminum-titanium (Ti/Al/Ti) laminate structure.

For example, the first transistor T1 may be a thin film transistor or a field effect transistor or other switching devices with same characteristics. Here, the thin film transistor is taken as an example for description.

For example, as shown in FIG. 5, the first transistor T1 includes an active layer 222 located on the buffer layer 211, a first insulating layer 212 located on a side of the active layer 222 away from the base substrate 100, a gate electrode 223 located on the first insulating layer 212, a second insulating layer 213 located on a side of the gate electrode 223 away from the base substrate 100, a third insulating layer 214 located on the second insulating layer 213, and two source-drain electrodes (including a source electrode 224 and a drain electrode 225) located on the third insulating layer 214. The buffer layer 211, as a transition layer, may prevent harmful substances in the base substrate from intruding into the interior of the display panel, and may increase adhesion of a film layer in the display panel on the base substrate 100. The barrier layer 1012 may prevent impurities such as water and oxygen from penetrating from the base substrate 100 into functional structures such as the first transistor T1. The barrier layer 209 and the buffer layer 211 may jointly protect other functional structures on the base substrate 100. For example, materials of the barrier layer 209 and the buffer layer 211 may include insulating materials such as silicon oxide, silicon nitride, and silicon oxynitride. Materials of one or more of the third insulating layer 214, the second insulating layer 213, and the first insulating layer 212 may include insulating materials such as silicon oxide, silicon nitride, and silicon oxynitride. The materials of the third insulating layer 214, the second insulating layer 213, and the first insulating layer 212 may be the same or different.

For example, as shown in FIG. 5, the passivation layer 215 is located on a side of the first transistor T1 away from the base substrate and includes a via hole to expose one of the source electrode 224 and the drain electrode 225, for example, expose the source electrode 224. The passivation layer 215 may protect the source electrode 224 and the drain electrode 225 of the first transistor T1 from being corroded by water vapor. For example, materials of the passivation layer 215 may include an organic insulating material or an inorganic insulating material, for example, silicon nitride material, because of a high dielectric constant and a good hydrophobic function thereof, it can well protect the pixel drive circuit 221 from being corroded by water vapor. It should be noted that, the passivation layer 215 is an optional film layer, and in other embodiments, the passivation layer 215 may not be provided, and the embodiments of the present disclosure are not limited thereto.

Figure 3F:
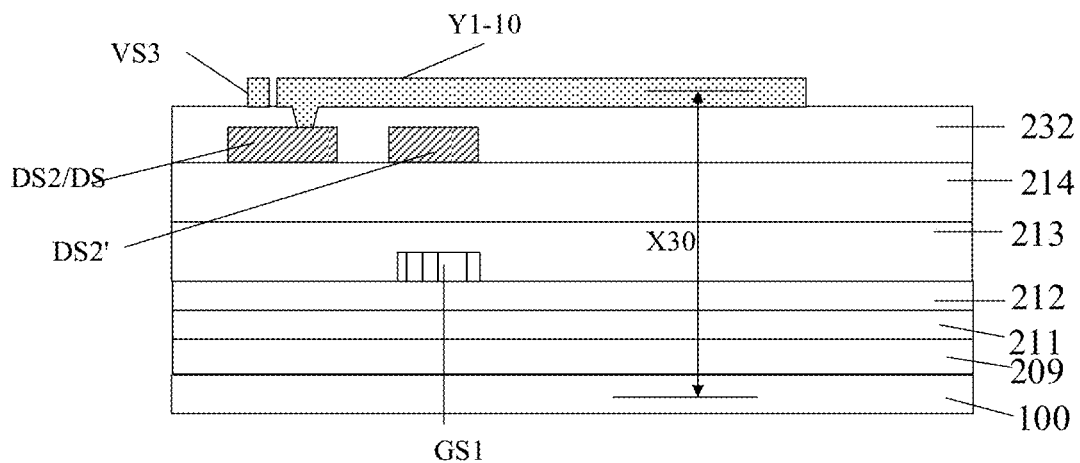
FIG. 3F is a cross-sectional schematic diagram taken along A2-B2 in FIG. 3D provided by at least one embodiment of the present disclosure.
Figure 3G:
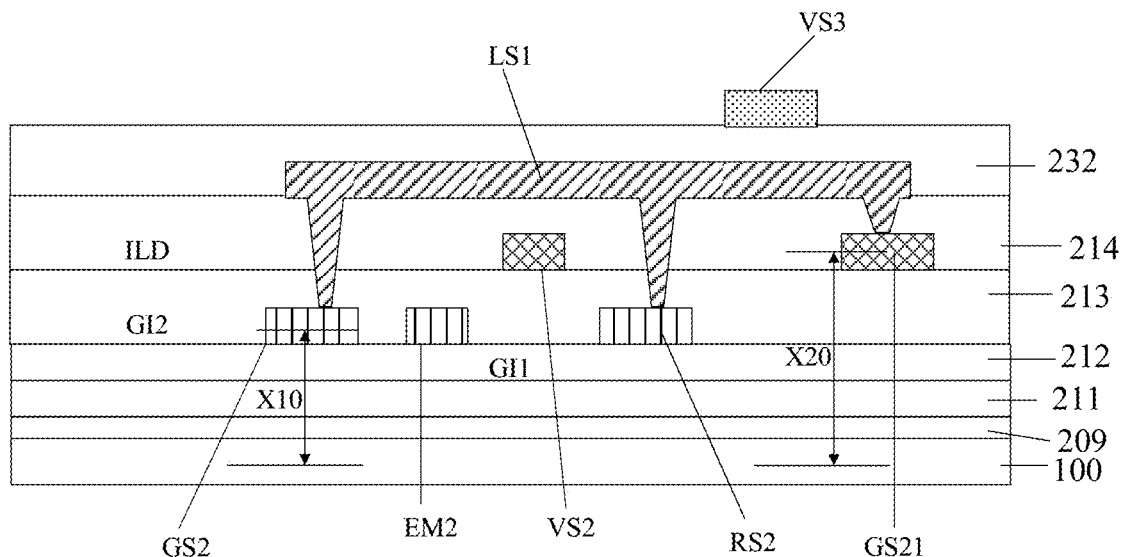
FIG. 3G is a cross-sectional schematic diagram taken along A1-B1 in FIG. 3E provided by at least one embodiment of the present disclosure.
Figure 3H:
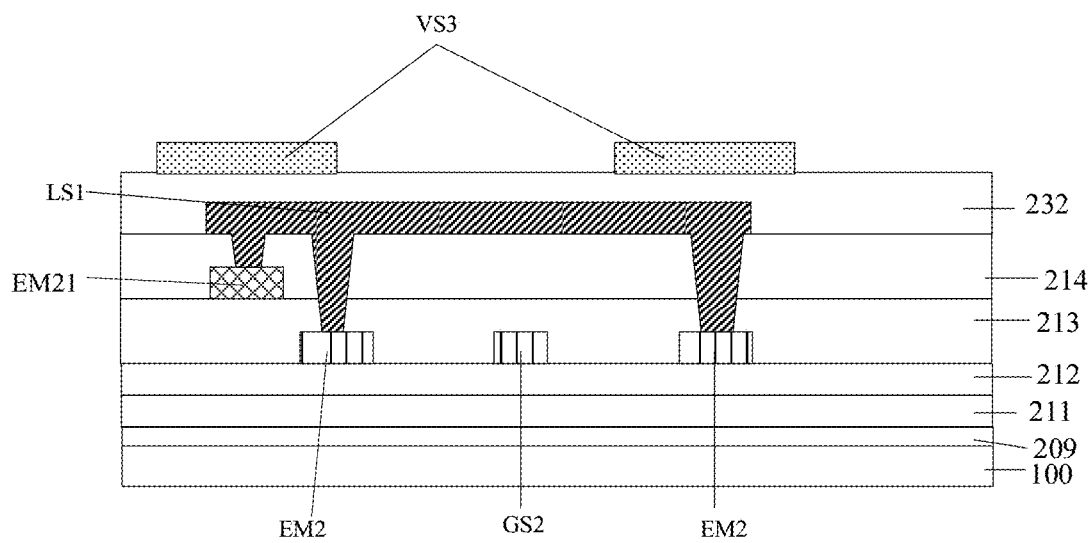
FIG. 3H is a cross-sectional schematic diagram taken along C1-C2 in FIG. 3E provided by at least one embodiment of the present disclosure.

FIG. 3F is a cross-sectional schematic diagram taken along A2-B2 in FIG. 3D provided by at least one embodiment of the present disclosure; FIG. 3G is a cross-sectional schematic diagram taken along A1-B1 in FIG. 3E provided by at least one embodiment of the present disclosure; and FIG. 3H is a cross-sectional schematic diagram taken along C1-C2 in FIG. 3E provided by at least one embodiment of the present disclosure.

For example, as shown in FIG. 3A and FIG. 3D, the display panel may further include an initialization signal line VS3 surrounding the light-transmitting region 201. A section line A2-B2 in FIG. 3D passes through the initialization signal line VS3, the first signal line DS2, the second signal line GS1 (extending along the first direction X), and the first extending portion Y1.

For example, as shown in FIG. 3D and FIG. 3F, the first extending portion Y1 of the first signal line DS2 is located on a side of the fourth insulating layer 232 (e.g., the first planarization layer 232 in FIG. 5, which will be described in detail below) away from the base substrate 100 in the peripheral region 202, for example, taking Y1-10 as an example, it is located on a side of the first planarization layer 232 away from the base substrate 100. The first signal line DS2, for example, the first signal line main body portion DS is located between the third insulating layer 214 and the fourth insulating layer 232 in the display region 10; and the first extending portion Y1 of the first signal line DS2 is connected in the peripheral region 202 through a via hole passing through the fourth insulating layer 232 with a portion of the first signal line main body portion DS that is in the display region 10. When the display panel includes the passivation layer 215 (not shown in the figure), the first extending portion Y1 of the first signal line DS2 is connected in the peripheral region 202 through a via hole passing through the fourth insulating layer 232 and the passivation layer 215 with a portion of the first signal line DS2 that is in the display region 10.

For example, as shown in FIG. 3D and FIG. 3F, the initialization signal line VS3 and the first extending portion Y1 are provided in a same layer, that is, located on a side of the fourth insulating layer 232 away from the base substrate 100. It should be noted that, the passivation layer 215 in FIG. 3G is an optional film layer, in other embodiments, the passivation layer 215 may not be provided, and the embodiments of the present disclosure are not limited thereto. It should be noted that, FIG. 3D is a partial schematic diagram of one side of the light-transmitting region 201, when there is a display region in a position opposite to the partial position in the light-transmitting region 201, the mode in which the first signal line DS2 changes layers may be consistent with the region, or may also be inconsistent, which will not be limited in the embodiments of the present disclosure.

For example, as shown in FIG. 3D, adjacent first extending portions Y1, for example, Y1-10 and Y1-9, may be located in different layers, for example, Y1-9 may be located in a same layer as the main body portion DS electrically connected therewith, that is to say, the adjacent first extending portions Y1 may be located in different film layers, which, thus, can save wiring space.

For example, as shown in FIG. 3F, the display panel may further include a dummy transfer portion DS2', and the dummy transfer portion DS2' is provided in same layer as a portion of the first signal line DS2 in the display region 10 (e.g., the third display sub-region 103 or the fourth display sub-region), that is, located in a same layer as the first signal line main body portion DS, that is, located between the third insulating layer 214 and the fourth insulating layer 232. The dummy transfer portion DS2' may make pattern design of the position where the first signal line DS2 changes layers uniform, so as to ensure uniformity of etching.

In some embodiments of the present disclosure, as shown in FIG. 3C and FIG. 12A, the length L1 of the first extending portion Y1 (e.g., L1-1, L1-2 . . . L1-10), a vertical distance H1 between the first extending portion Y1 and the second electrode 263, and S1 (the orthogonal projection overlap area between the first connecting portion and the first extending portions of the n first signal lines on the base substrate) satisfy the formula: $H1=k*(S1/n)/L1$, where k is a natural number ranging from 1 to 20, and k may also be a real number ranging from 1 to 20. During specific implementation, according to thickness requirements of the panel, for example, k may be a natural number or a real number ranging from 1 to 10, or 1 to 15, or 2 to 10, 2 to 8, 2 to 6, 2 to 4, 3 to 12, 3 to 9, 3 to 6, 3 to 5. In this way, the thickness of the panel may be as thin as possible in the case where influence between the drive circuit signal line (e.g., the first signal line) and the light emitting layer electrode (e.g., the cathode), or between the drive circuit signal line (e.g., the first signal line), the light emitting layer electrode (e.g., the cathode), and the touch layer (e.g., the first connecting portion) around the light-transmitting region is relatively small.

In some embodiments of the present disclosure, as shown in FIG. 3D and FIG. 12A, a vertical distance between the first connecting portion Rx1 and the second electrode is H2, an area of a first extending portion of one of the n first signal lines DS2 is A1, an area of the first connecting portion Rx1 is A2, where H2≥(1/k1)*(A2/nA1)*H1, and k1 is a natural number ranging from 5 to 180, and k1 may also be a real number ranging from 5 to 180.

For example, a vertical distance between the first connecting portion Rx1 and the second electrode is H2, which may be a vertical distance between the surface of the first connecting portion Rx1 and the second electrode 263, or may also be a vertical distance between the bottom face of the first connecting portion Rx1 and the second electrode 263, or may also be a vertical distance from the position that is half of its thickness to the second electrode 263, which will not be limited in the embodiments of the present disclosure.

For example, in consideration of the size of the light-transmitting region 202, if the light-transmitting region 202 is perforated, the aperture of the hole ranges from 2 μm to 5 μm. According to the number of missing pixels, the value of n may be an integer ranging from 1 to 20. In consideration that, for example, it may be 5, 6, 7, 8 . . . 15, the size of the first connecting portion Rx1 in the second direction Y may be, for example, 50 μm to 600 μm, and the size in the first direction X may be 50 μm to 200 μm. Different sizes are designed according to the size of the light-transmitting region 202, the area A2 of the first connecting portion Rx1 may be roughly equal to the size of the first connecting portion Rx1 in the first direction X multiplied by the size in the second direction, and k1 is a natural number ranging from 5 to 180, and k1 may also be a real number ranging from 5 to 180. During specific implementation, in the case where n, A1, A2, H1 are constant, H2 is adjusted according to the natural number or real number of k1 ranging from 5 to 180. For example, the value of k1 may be natural number or real number ranging from 5 to 10, 10 to 20, 20 to 30, 30 to 40 . . . 170 to 180.

In some embodiments of the present disclosure, the resistivity of the first extending portion of at least one of the n first signal lines DS2 is ρ1, and the resistivity of the first connecting portion Rx1 is ρ2. H2≥(1/k1)*(A2*ρ1/nA1*ρ2)*H1; and k1 is a natural number ranging from 5 to 180, and k1 may also be a real number ranging from 5 to 180.

In some embodiments of the present disclosure, the resistivity of the first extending portion of at least one of the n first signal lines DS2 is ρ1, and the resistivity of the first connecting portion is ρ2, where, H2≥(1/k1)*(A2*ρ1/nA1*ρ2)*H1, and k1 is a natural number ranging from 5 to 180, and k1 may also be a real number ranging from 5 to 180.

It should be noted that, in the embodiments of the present disclosure, "*" represents a multiplication symbol.

For example, the material of the first extending portion Y1 and the first connecting portion Rx1 is metal, for example, one or a combination of several of titanium (Ti), aluminum (Al), copper (Cu), and molybdenum (Mo). For example, the materials of the first extending portion Y1 and the first connecting portion Rx1 may be the same or different. For example, the materials of the first extending portion Y1 and the first connecting portion Rx1 may both be an aluminum-titanium-aluminum (Ti/Al/Ti) laminate structure.

For example, as shown in FIG. 3E, the third signal line EM2 may not be disconnected on the side of the first display sub-region 101 and the second display sub-region 102 that is close to the light-transmitting region 202. After passing through the first display sub-region 101 along the first direction X and entering the peripheral region 202, the third signal line EM2 changes layers. When the third signal line EM2 is not disconnected on the side of the first display sub-region 101 and the second display sub-region 102 that is close to the light-transmitting region 202, a gate drive circuit may be arranged on one side of the display panel 1, so as to be connected with the third signal line EM2 connecting the first display sub-region 101 and the second display sub-region 102. A portion of the third signal line EM2 that is located in the peripheral region 202 includes a third signal line extending portion EM21 and a third bending portion EM22. The wiring mode of the third signal line extending portion EM21 and the third bending portion EM22 may be the same as the wiring mode of the second extending portion GS21 and the second bending portion GS22 of the second signal line GS2, and no details will be repeated in the embodiments of the present disclosure. The section line C1-C2 in FIG. 3E passes through the third signal line EM2, the third signal line extending portion EM21, and the initialization signal line VS3, etc.

For example, as shown in FIG. 3E, the second signal line extending portion GS21 further includes a second widened portion E2 electrically connected with the display region. In the position of the second widened portion E2, the extending portion GS21 of the second signal line is electrically connected with the second signal line GS2 of the display region, for example, the second signal line main body portion GS.

For example, as shown in FIG. 3E and FIG. 3G, the display panel includes a second transfer portion LS1, and the second transfer portion LS1 is located between the third insulating layer 214 and the fourth insulating layer 232. The second signal line extending portion GS21 of the second signal line GS2 is located between the second insulating layer 213 and the third insulating layer 214 in the peripheral region 202. The portion of the second signal line GS2 in the display region 10, that is, the second signal line main body portion GS, is located between the first insulating layer 212 and the second insulating layer 213. One end of the second transfer portion LS1 is connected with the second signal line extending portion GS21 through a via hole penetrating through the third insulating layer, and the other end of the second transfer portion LS1 is connected with the main body portion GS of the second signal line GS2 through a via hole penetrating through the third insulating layer 214 and the second insulating layer 213. The third signal line EM2 and the reset signal line RS2 are also located between the first insulating layer 212 and the second insulating layer 213. The second transfer portion LS1 is also connected with the reset signal line RS2 through a via hole penetrating through the third insulating layer. The initialization signal line VS2 is located between the second insulating layer 213 and the third insulating layer 214. The initialization signal line VS3 is located on a side of the fourth insulating layer 232 away from the base substrate 100.

For example, as shown in FIG. 3E and FIG. 3F, the display panel includes a third transfer portion LS2, and the third transfer portion LS2 is located between the third insulating layer 214 and the fourth insulating layer 232. The third signal line extending portion EM21 of the third signal line EM2 is located between the second insulating layer 213 and the third insulating layer 214 in the peripheral region 202, and the portion of the third signal line EM2 in the display region 10 is located between the first insulating layer 212 and the second insulating layer 213. One end of the third transfer portion LS2 is connected with the third signal line extending portion EM21 of the third signal line EM2 through a via hole penetrating through the third insulating layer, and the other end of the third transfer portion LS2 is connected with the portion of the second signal line EM2 in the display region 10 through a via hole penetrating through the third insulating layer 214 and the second insulating layer 213. As shown in the figure, the third transfer portion LS2 is connected with two second signal lines EM2 (located in different rows); and the initialization signal line VS3 is located on a side of the fourth insulating layer 232 away from the base substrate 100.

It should be noted that, the passivation layer 215 in FIG. 3G and FIG. 3H is an optional film layer (not shown in the figure); and in other embodiments, the passivation layer 215 may not be provided, and the embodiments of the present disclosure are not limited thereto.

It should be noted that, the main body portion DS of the first signal line, the main body portion GS of the second signal line, and the portion of the third signal line EM2 in the display region 10 may be understood as being substantially located in the display region; that is to say, at least one of the respective signal lines may be partially located in a dummy pixel region. For example, as shown in FIG. 3D and FIG. 3E, among the pixel units close to the light-transmitting region 201, at least one row or one column of pixels closest to the light-transmitting region 201 may be designed as dummy pixels (not for displaying images), in this case, the main body portions of the respective signal lines, for example, the first signal line main body portion GS may still be electrically connected with a dummy pixel corresponding thereto, and extend to the peripheral region 202 so as to be electrically connected with a corresponding extending portion, for example, Y1. The second signal line and the third signal line are the same, and no details will be repeated here.

It should be noted that, the dummy pixel region according to the embodiments of the present disclosure is a region including dummy pixels (not for displaying an image).

For example, as shown in FIG. 3F and FIG. 3G, a distance X10 between the main body portion GS of the second signal line GS2 and the base substrate 100, and a distance X20 between the second signal line extending portion GS21 of the second signal line GS2 in the peripheral region 202 and the base substrate, are less than a distance between the first signal line DS2 and the base substrate 100, for example, a distance X30 between the first extending portion Y1 of the first signal line DS2 in the peripheral region 202 and the base substrate 100.

It should be noted that, the "distance" according to the embodiments of the present disclosure refers to a distance between a bottom face of film layer A and a bottom face of film layer B, or may also be a distance between a top face of film layer A and a top face of film layer B, or may also be a distance between the top face of film layer A and the bottom face of film layer B, or may also be a distance between the bottom face of film layer A and the top face of film layer B, or may also be a distance between positions of average thicknesses of film layers A and B, which will not be limited in the embodiments of the present disclosure, as long as distances are compared by using a same reference. For example, in FIG. 3F and FIG. 3G, distances are compared by taking positions of half of film layer thicknesses of the component as a reference.

It should be noted that, errors exist in measurement of the film thickness, as long as they are within an error range, for example, 25%; or limited position points may be selected to measure an average value, which will not be limited in the present disclosure.

It should be noted that, in consideration of a measurement error, the "length, width, thickness, distance, etc." in the present disclosure may allow a measurement error within 25%.

For example, the portion of the main body portion DS of the first signal line DS2 that is located between the third insulating layer 214 and the fourth insulating layer 232 in the display region 10 (which may also include a portion extending beyond the dummy pixel region outside the effective display region) may be formed in a same layer as the source electrode 224 and the drain electrode 225 of the first transistor T1, for example, formed by a patterning process with a same material layer, thereby simplifying the fabrication process.

For example, the portion of the main body portion GS of the second signal line GS2 that is located in the display region 10 (which may also include a portion extending beyond the dummy pixel region outside the effective display region) may be formed in a same layer as the gate electrode 223 of the first transistor T1, for example, formed by a patterning process with a same material layer, thereby simplifying the fabrication process.

In some embodiments of the present disclosure, the display panel further includes a second signal line GS2, configured to supply a second signal to the plurality of pixel drive circuit units P. The first connecting portion Rx1 overlaps with projections of m second signal lines GS2 on the base substrate 100, with an overlap area of S5, where S5>S2.

For example, as shown in FIG. 3D and FIG. 3E, the second signal line GS2 is a scan signal line, for example, a gate scan signal line GS22 or a reset signal line RS2; and the first connecting portion Rx1 overlaps with the projections of m second signal lines GS2 on the base substrate 100, for example, overlap areas with the respective projections of the m second signal lines GS2 are S5-1, S5-2 ... S5-$m$; and S5 is a sum of S5-1, S5-2 ... S5-$m$, where S5>S2.

For example, the first connecting portion Rx1 overlaps with the projections of the m second signal lines GS2 on the base substrate 100, for example, overlap areas with the respective projections of them second signal lines GS2 are S5-1, S5-2 ... S5-$m$; and S5 is a sum of S5-1, S5-2 ... S5-$m$, where, S2 is less than (3/4)S5, (2/3)S5, (1/2)S5, etc.

In some embodiments of the present disclosure, among the n first signal lines DS2, a distance between first extending portions Y1 of two adjacent first signal lines DS2 is b1; among them second signal lines GS2, a distance between two adjacent second signal lines in a region overlapping with the first connecting portion Rx1 is b2; and a distance between at least one second signal line among the m second signal lines and the second electrode is H5, where b1>H5/H1)*b2.

For example, a distance between first extending portions Y1-1 and Y1-2 of two adjacent first signal lines DS2 is b1; among the m second signal lines GS2, a separation distance between two adjacent second signal lines GS2-1, GS2-2 in a region overlapping with the first connecting portion Rx1 is b2; and a distance between at least one second signal line among the m second signal lines GS2-1 and the second electrode 263 is H5, where b1>H5/H1)*b2.

In some embodiments of the present disclosure, an area of the region where the m second signal lines GS2 overlap with the first connecting portion Rx1 on the base substrate is A3, the area of the first connecting portion Rx1 is A2, and a vertical distance between the first connecting portion Rx1 and the second electrode is H2, where H2≥(1/k2)*(A2/A3)*H5, and k2 is a natural number ranging from 1 to 15, and k2 may also be a real number ranging from 1 to 15.

For example, areas of the regions where the m second signal lines GS2-1, GS2-2 ... GS2-$m$ overlap with the first connecting portion Rx1 on the base substrate are A3-1, A3-2

A3-$m$, and A3 is a sum of A3-1, A3-2 . . . A3-$m$. The area of the first connecting portion Rx1 is A2, for example, to simplify calculations, A2 may be roughly a size thereof in the first direction X multiplied by a size in the second direction Y. For example, A2 may also be an actual occupied area of the first connecting portion Rx1, and H2 satisfies: H2≥(1/k2)*(A2/A3)*H5. K2 is a natural number or a real number ranging from 1 to 15, for example, k2 may be a natural number or a real number between 1 to 5 or 5 to 10 or 10 to 15, that is, a minimum value of the vertical distance H2 between the first connecting portion Rx1 and the second electrode 263 at least needs to satisfy the above formula, so as to reduce influence between the second signal line GS2, the first connecting portion Rx1, and the second electrode 263. It is further considered that the value of H2 should not be too large; for example, H2 may be less than the range of 10 μm to 16 μm, which may be adjusted according to actual needs during specific implementation, and will not be limited in the present disclosure.

In some embodiments of the present disclosure, the resistivity of at least one of the m second signal lines GS2 is ρ3, and the resistivity of the first connecting portion Rx1 is ρ2, H2≥(1/k2)*(A2*ρ3/A3*ρ2)*H5; and k2 is a natural number ranging from 1 to 15, and k2 may also be a real number ranging from 1 to 15.

For example, the second signal line GS2 and the first connecting portion Rx1 are made of metal, for example, one or a combination of several of titanium (Ti), aluminum (Al), copper (Cu), and molybdenum (Mo); for example, the materials of the second signal line GS2 and the first connecting portion Rx1 may be the same or different; for example, the materials of the second signal line GS2 and the first connecting portion Rx1 may both be a titanium-aluminum-titanium (Ti/Al/Ti) laminate structure. That is to say, a minimum value of the vertical distance H2 between the first connecting portion Rx1 and the second electrode 263 at least needs to satisfy the above formula, so that influence between the second signal line GS2, the first connecting portion Rx1 and the second electrode 263 is reduced; in further consideration of material properties of the signal line, if a material with higher resistivity is chosen, then the minimum value of H2 may be reduced, so that an overall thickness of the panel may be reduced to a certain extent.

For example, as shown in FIG. 5, the active layer 222 may include a source electrode region, a drain electrode region, and a channel region between the source electrode region and the drain electrode region. The third insulating layer 214, the second insulating layer 213, and the first insulating layer 212 have via holes to expose the source electrode region and the drain electrode region. The source electrode and the drain electrode are respectively electrically connected with the source electrode region and the drain electrode region through the via holes in the third insulating layer 214, the second insulating layer 213, and the first insulating layer 212. The gate electrode 223 overlaps with the channel region located between the source electrode region and the drain electrode region in the active layer 222 in the direction perpendicular to the base substrate 100.

For example, as shown in FIG. 5, the first planarization layer 232 (i.e., the fourth insulating layer) is located on a side of the source electrode 224 and the drain electrode 225 away from the base substrate 100, and is configured to provide a first planarized surface for planarizing the surface of the sub-pixel drive circuit 260 away from the base substrate 100. The first planarization layer 232 may planarize an uneven surface caused by the sub-pixel drive circuit 260, and thus prevent unevenness caused by the sub-pixel drive circuit 260 from causing defects in the light emitting element. A via hole is formed in the first planarization layer 232 to expose the source electrode 224 or the drain electrode 225 (expose the source electrode 224 in the case shown in the figure); and the first transfer electrode 241 is formed on a side of the first planarization layer 232 away from the base substrate 100. The first transfer electrode 241 is electrically connected with the source electrode 224 (or the drain electrode 225) through a via hole in the first planarization layer 232 and a passivation layer via hole of the passivation layer. The first transfer electrode 241 may avoid directly forming a straight via hole with a relatively large aperture in the first planarization layer 232, thereby improving quality of electrical connection in the via hole, and meanwhile, the first transfer electrode 241 may also be formed in a same layer as other signal line (e.g., the power line, etc.), which will not lead to an increase in process steps.

For example, the portion of the first extending portion Y1 of the first signal line DS2 in the peripheral region 202 that is located on a side of the first planarization layer 232 away from the base substrate may be formed in a same layer as the first transfer electrode 241, for example, formed by a patterning process with a same material layer, thereby simplifying the fabrication process.

For example, the material of the first planarization layer 232 includes inorganic insulating materials such as silicon oxide, silicon nitride, silicon oxynitride, etc., or may also include organic insulating materials such as polyimide, polyphthalimide, polyphthalamide, acrylic resin, benzocyclobutene or phenolic resin, which will not be limited in the embodiments of the present disclosure.

For example, the material of the first transfer electrode 241 may include a metal material or an alloy material, for example, a metal single-layer or multi-layer structure formed by molybdenum, aluminum, and titanium.

For example, the material of the active layer 222 may include polysilicon or an oxide semiconductor (e.g., indium gallium zinc oxide). The material of the gate electrode 223 may include a metal material or an alloy material, for example, a metal single-layer or multi-layer structure formed of molybdenum, aluminum, and titanium; for example, the multi-layer structure is a multi-metal laminate layer (e.g., a titanium-aluminum-titanium (Ti/Al/Ti) metal laminate structure). Materials of the source electrode 224 and the drain electrode 225 may include a metal material or an alloy material, for example, a metal single-layer or multi-layer structure formed of molybdenum, aluminum, and titanium, for example, the multi-layer structure is a multi-metal laminate layer (e.g., a titanium-aluminum-titanium (Ti/Al/Ti) metal laminate structure). Materials of the respective functional layers will not be specifically limited in the embodiments of the present disclosure.

For example, as shown in FIG. 5, the second planarization layer 251 is provided on a side of the first transfer electrode 241 away from the base substrate 100, for supplying a planarized surface on the side of the first transfer electrode 241 away from the base substrate 100. In addition, a via hole is formed in the second planarization layer 251.

For example, the material of the second planarization layer 251 includes inorganic insulating materials such as silicon oxide, silicon nitride, and silicon oxynitride, or may also include organic insulating materials such as polyimide, polyphthalimide, polyphthalamide, acrylic resin, benzocyclobutene or phenolic resin, which will not be limited in the embodiments of the present disclosure.

For example, as shown in FIG. 5, the size of the first planarization layer 232 in the direction perpendicular to the base substrate 200 ranges from about 0.5 microns to 1.5 microns, for example, the value is about 0.7 microns, here the word "about" indicates that the value may fluctuate within a range of, for example, ±15%, or for another example, ±25%. The size of the second planarization layer 251 in the direction perpendicular to the base substrate 200 ranges from about 0.5 microns to 1.7 microns, for example, the value is about 0.8 microns, here the word "about" indicates that the value may fluctuate within a range of, for example, ±15%, or for another example, ±% 25. In other words, the thickness of the first planarization layer 232 ranges from about 0.5 microns to 1.5 microns, and the thickness of the second planarization layer 251 ranges from about 0.5 microns to 1.7 microns.

In some embodiments of the present disclosure, continuing as shown in FIG. 5, the light emitting element 26 is provided on the second planarization layer 251, that is, the light emitting element 26 is provided on a side of the second planarization layer 251 away from the base substrate 100. The light emitting element 26 includes a first electrode 261 (e.g., an anode), a light emitting layer 262, and a second electrode 263 (e.g., a cathode). The first electrode 261 of the light emitting element 26 is electrically connected with the first transfer electrode 241 through a second via hole 252 in the second planarization layer 251. A pixel defining layer 216 is formed on a side of the first electrode 261 away from the base substrate 100; the pixel defining layer 216 includes a plurality of openings K to define a plurality of pixel drive circuit units P; and the plurality of openings K are in one-to-one correspondence with a plurality of sub-pixels. Each of the openings K exposes the first electrode 261; and the light emitting layer 262 is provided in the opening K of the pixel defining layer 216. The second electrode 263 may be, for example, provided in a portion or the whole of the display region, for example, extending in the peripheral region 202, so that it may be formed on an entire surface during the fabrication process.

For example, the first electrode 261 may include a reflective layer; and the second electrode 263 may include a transparent layer or a semi-transparent layer. Thus, the first electrode 261 may reflect light emitted from the light emitting layer 262, and the light is emitted into an external environment through the second electrode 263, so that the light emission rate may be improved. When the second electrode 263 includes a semi-transmissive layer, some light reflected by the first electrode 261 is reflected again by the second electrode 263, so the first electrode 261 and the second electrode 263 form a resonance structure, so that light emission efficiency may be improved.

For example, the material of the first electrode 261 may include at least one transparent conductive oxide material, including indium tin oxide (ITO), indium zinc oxide (IZO), zinc oxide (ZnO), and the like. In addition, the first electrode 261 may include a metal having high reflectivity as a reflective layer, such as silver (Ag).

For example, with respect to an OLED, the light emitting layer 262 may include small molecular organic materials or polymer molecular organic materials, which may be fluorescent light-emitting materials or phosphorescent light-emitting materials, and may emit red light, green light, blue light, or white light. In addition, the light emitting layer may further include functional layers such as an electron injection layer, an electron transport layer, a hole injection layer, and a hole transport layer as required. With respect to a QLED, the light emitting layer may include quantum dot materials, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots, etc., and a particle size of a quantum dot ranges from 2 nm to 20 nm.

For example, the second electrode 263 may include various conductive materials. For example, the second electrode 263 may include metal materials such as lithium (Li), aluminum (Al), magnesium (Mg), and silver (Ag).

For example, the material of the pixel defining layer 216 may include organic insulating materials such as polyimide, polyphthalimide, polyphthalamide, acrylic resin, benzocyclobutene or phenolic resin, or inorganic materials such as silicon oxide and silicon nitride, which will not be limited in the embodiments of the present disclosure.

For example, as shown in FIG. 5, the display panel 1 further includes a storage capacitor 27; and the storage capacitor 27 may include a first capacitive electrode 271 and a second capacitive electrode 272. The first capacitive electrode 271 is provided between the first insulating layer 212 and the second insulating layer 213; and the second capacitive electrode 272 is provided between the second insulating layer 213 and the third insulating layer 214. The first capacitive electrode 271 and the second capacitive electrode 272 are stacked and at least partially overlap in the direction perpendicular to the base substrate 100. The first capacitive electrode 271 and the second capacitive electrode 272 form a storage capacitor with the second insulating layer 213 as a dielectric material. The first capacitive electrode 271 and the gate electrode 223 in the first transistor T1 are arranged in a same layer. Therefore, the first capacitive electrode 271 and the gate electrode 223 may be formed in a same layer during the fabrication process, for example, formed by a patterning process with a same material layer, thereby simplifying the fabrication process, and reducing fabrication costs of the product.

For example, the portion of the second signal line GS2 in the display region 10 (e.g., the first display sub-region 101 or the second display sub-region 102) may be formed in a same layer as the second capacitive electrode 272, for example, formed by a patterning process with a same material layer, thereby simplifying the fabrication process.

In another example, as a variation of the example shown in FIG. 5, the first capacitive electrode 271 of the storage capacitor is still arranged in a same layer as the gate electrode 223; and the second capacitive electrode 272 of the storage capacitor is arranged in a same layer as the source electrode 224 and the drain electrode 225 in the pixel drive circuit 221, so that the first capacitive electrode 271 and the second capacitive electrode 272 form a storage capacitor with a laminate layer of the second insulating layer 213 and the third insulating layer 214 as a dielectric material.

In yet another example, as a variation of the example shown in FIG. 5, the first capacitive electrode 271 of the storage capacitor is no longer arranged in a same layer as the gate electrode 223, but is located between the second insulating layer 213 and the third insulating layer 214; and the second capacitive electrode 272 of the storage capacitor is arranged in a same layer as the source electrode 224 and the drain electrode 225 in the pixel drive circuit 221, so that the first capacitive electrode 271 and the second capacitive electrode 272 form a storage capacitor with the third insulating layer 214 as a dielectric material.

For example, as shown in FIG. 5, the display panel 1 further includes an encapsulation layer 217. The encapsulation layer 217 is provided on a side of the light emitting element 26 away from the base substrate 100. The encapsulation layer 217 seals the light emitting element 26, so that deterioration of the light emitting element 26 caused by moisture and/or oxygen contained in the environment may be reduced or prevented. The encapsulation layer 217 may have a single-layer structure or a composite-layer structure; and the composite-layer structure includes a stacked structure of an inorganic layer and an organic layer. The encapsulation layer 217 includes at least one encapsulation sublayer. For example, the encapsulation layer 217 may include a first inorganic encapsulation layer 2173, a first organic encapsulation layer 2172, and a second inorganic encapsulation layer 2171 that are sequentially arranged.

For example, the material of the encapsulation layer 217 may include insulating materials such as silicon nitride, silicon oxide, silicon oxynitride, polymer resin, and the like. Inorganic materials such as silicon nitride, silicon oxide, and silicon oxynitride have high compactness and can prevent intrusion of water and oxygen. The material of the organic encapsulation layer may be a polymer material containing a desiccant or a polymer material that can block water vapor, etc., for example, polymer resins, etc. to planarize the surface of the display panel, may relieve stress of the first inorganic encapsulation layer and the second inorganic encapsulation layer, and may also contain water-absorbing materials such as desiccant to absorb substances such as water and oxygen that intrude into the interior.

For example, as shown in FIG. 5, the display panel 1 further includes a sixth insulating layer 218 located in the display region 10. The sixth insulating layer 218 is provided on a side of the encapsulation layer 217 away from the base substrate 100, to cover the encapsulation layer 217 and provide a planarized surface on the side of the encapsulation layer 217 away from the base substrate 100.

For example, the material of the sixth insulating layer 218 may include organic insulating materials such as polyimide, polyphthalimide, polyphthalamide, acrylic resin, benzocyclobutene or phenolic resin, or include inorganic insulating material such as silicon oxide and silicon nitride; for example, the case that the sixth insulating layer 218 is silicon oxide, the sixth insulating layer 218 is silicon nitride, or the sixth insulating layer 218 is a silicon oxide/silicon nitride laminate layer is taken as an example, which will not be limited in the embodiments of the present disclosure.

For example, in some embodiments, in the opening peripheral region, a distance between at least one first signal line and the second electrode is greater than a distance between at least one second signal line and the second electrode. As shown in FIG. 12A, in the peripheral region 202, a distance between the first extending portion Y1 of the first signal line DS2 (e.g., located between the third insulating layer 214 and the fourth insulating layer 232, without changing layers) and the second electrode 263 is H1, a distance between the first extending portion Y1 of the first signal line DS2 (located on a side of the fourth insulating layer 232 away from the base substrate, and changing layers) and the second electrode 263 is X32, a distance between a portion of the bending portion GS22 of the second signal line GS2 that is located between the second insulating layer 213 and the third insulating layer 214 (i.e., changing layers) and the second electrode 263 is X33, a distance between a portion of the bending portion GS22 of the second signal line GS2 that is located on a side of the second insulating layer 213 close to the base substrate 100 (i.e., without changing layers) and the second electrode 263 is H5, the distance H5 is greater than the distance H1, and X33 is greater than X32, so that the distance between the second signal line and the second electrode (e.g., the cathode) is greater than that of the first signal line as a whole.

As shown in FIG. 12A, the distance between the portion of the bending portion GS22 of the second signal line GS2 that is located between the second insulating layer 213 and the third insulating layer 214 (i.e., changing layers) and the second electrode 263 is X33, the distance between the portion of the bending portion GS22 of the second signal line GS2 on the side of the second insulating layer 213 close to the base substrate 100 (i.e., without changing layers) and the second electrode 263 is H5, the distance between the first extending portion Y1 of the first signal line DS2 (e.g., located on the side of the fourth insulating layer 232 away from the base substrate, and changing layers) and the second electrode 263 is X32, and the distance between the portion of the bending portion GS22 of the second signal line GS2 that is located between the second insulating layer 213 and the third insulating layer 214 (i.e., changing layers) and the second electrode 263 is X33, and the distance H5 is greater than the distance H1, and X33 is greater than X32, so that the distance between the second signal line and the second electrode (e.g., the cathode) is greater than that of the first signal line as a whole.

For example, as shown in FIG. 5, the display panel 1 further includes a touch layer 28. The touch layer 28 includes a first touch pattern layer 282, a second touch pattern layer 281 and a touch insulating layer 283 that are located on a side of the sixth insulating layer 218 away from the base substrate. The first touch pattern layer 282 includes a first touch signal line Rx and a second touch signal line Tx that are alternately connected; and the second touch pattern layer 281 is located on a side of the first touch pattern layer 282 close to the base substrate. The touch insulating layer 283 is located between the first touch pattern layer 282 and the second touch pattern layer 281. The second touch pattern layer 281 includes a plurality of first transfer portions RL; the plurality of first transfer portions RL are located in positions where the first touch signal line Rx and the second touch signal line Tx intersect with each other; and the plurality of first transfer portions RL is electrically connected with the first touch signal line Rx through a via hole passing through the touch insulating layer 283. The second touch signal line Tx and the first touch signal line Rx overlap each other in the direction perpendicular to the surface of the substrate 200 and form a touch sensor; and a touch sensor is also formed between the second touch signal line Tx and the first touch signal line Rx adjacent to each other.

For example, in other embodiments, the first touch pattern layer 282 and the second touch pattern layer 281 may include a second touch signal line Tx and a first touch signal line Rx, respectively; the second touch signal line Tx is electrically connected with the first touch signal line Rx through a via hole penetrating through the touch insulating layer 283; the first touch signal line Rx is continuous; and in this case, there is no need to provide the first transfer portion RL. The second touch signal line Tx and the first touch signal line Rx overlap with each other in the direction perpendicular to the surface of the substrate 200 and form a touch sensor; and a touch sensor is also formed between the second touch signal line Tx and the first touch signal line Rx adjacent to each other.

For example, the first touch pattern layer 282 and the second touch pattern layer 281 are made of a transparent conductive material. For example, the transparent conductive material may be a transparent conductive metal oxide material, for example, indium tin oxide (ITO), indium zinc oxide (IZO), zinc oxide (ZnO), aluminum zinc oxide (AZO), indium gallium zinc oxide (IGZO), etc. For example, in other examples, the second touch signal line Tx and the first touch signal line Rx may have a metal mesh structure, for example, the metal mesh may be made of gold (Au), silver (Ag), copper (Cu), aluminum (Al), molybdenum (Mo), magnesium (Mg), tungsten (W) or alloy materials of the above metals.

Figure 6C:
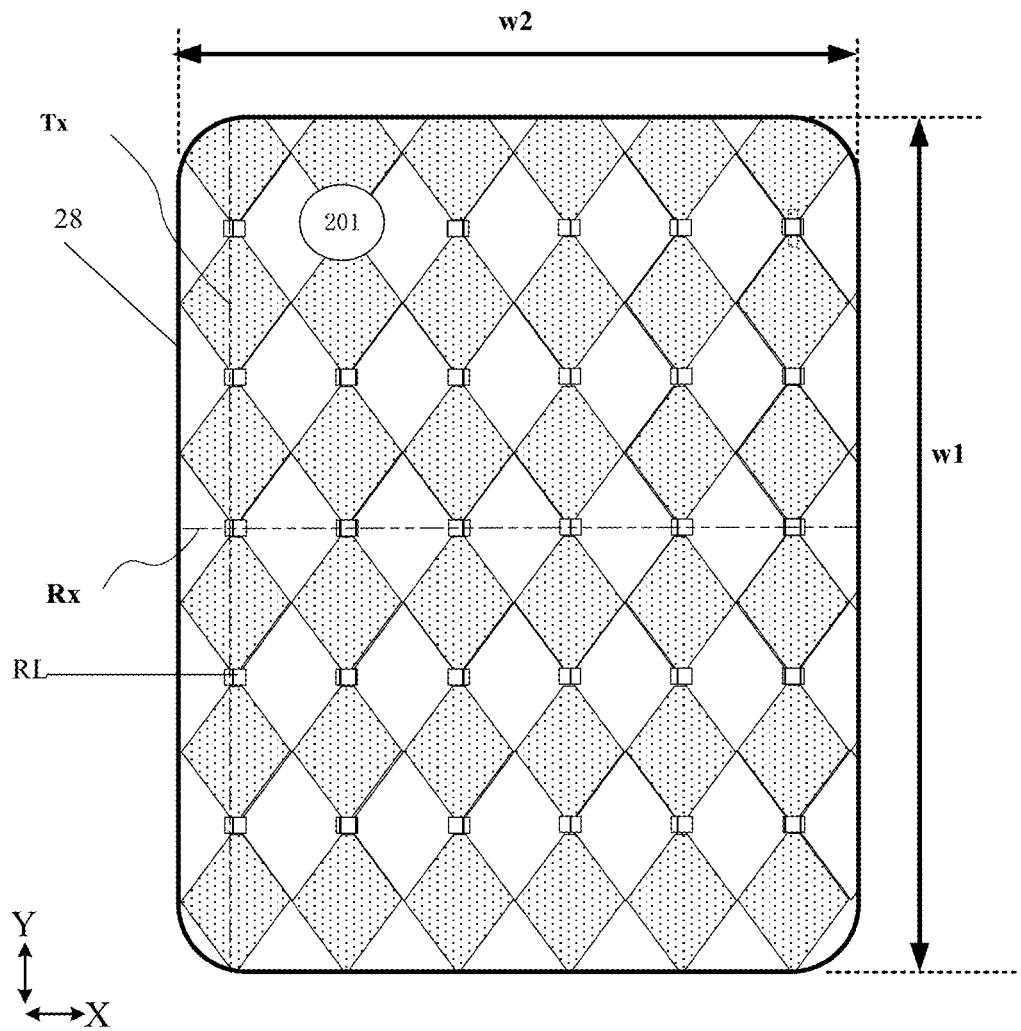
FIG. 6C is a schematic diagram of a touch layer of a display panel provided by at least another embodiment of the present disclosure.

For example, FIG. 6A is a schematic diagram of a touch layer of a display panel provided by at least one embodiment of the present disclosure; FIG. 6B is a schematic diagram of a touch layer of a display panel provided by at least another embodiment of the present disclosure; and FIG. 6C is a schematic diagram of a touch layer of a display panel provided by at least another embodiment of the present disclosure. As shown in FIG. 6A, FIG. 6B, and FIG. 6C, the first touch signal line Rx extends along the first direction X, and the second touch signal line Tx extends along the second direction Y; for example, the first touch signal line Rx and the second touch signal line Tx vertically intersect with each other. For example, the first touch signal line Rx includes a plurality of segments; the second touch signal line Tx is continuous; and in the position where the first touch signal line Rx and the second touch signal line Tx intersect with each other, the first transfer portion RL electrically connects two adjacent segments of the first touch signal line Rx. The first transfer portion RL and the first touch signal line Rx are located in different layers (as shown in FIG. 5). By providing the first touch signal line Rx and the second touch signal line Tx, touch sensitivity of the display panel may be improved. The first touch signal line Rx and the second touch signal line Tx are made of a same material and are formed by a same patterning process. For example, the first touch signal line Rx and the second touch signal line Tx are formed in a metal mesh pattern. The metal mesh has good extendability and flexibility, which can improve bending resistance and processability of the touch electrode, and is suitable for flexible electronic applications. When the touch electrode formed by the metal mesh is integrated in the display panel, metal wires in the metal mesh need to be arranged outside the light-emitting region (e.g., the opening K in FIG. 5) of the light emitting element of the sub-pixel P of the display panel, in order to avoid shielding of light by the metal wires, which may reduced the pixel aperture ratio.

Figure 7A:
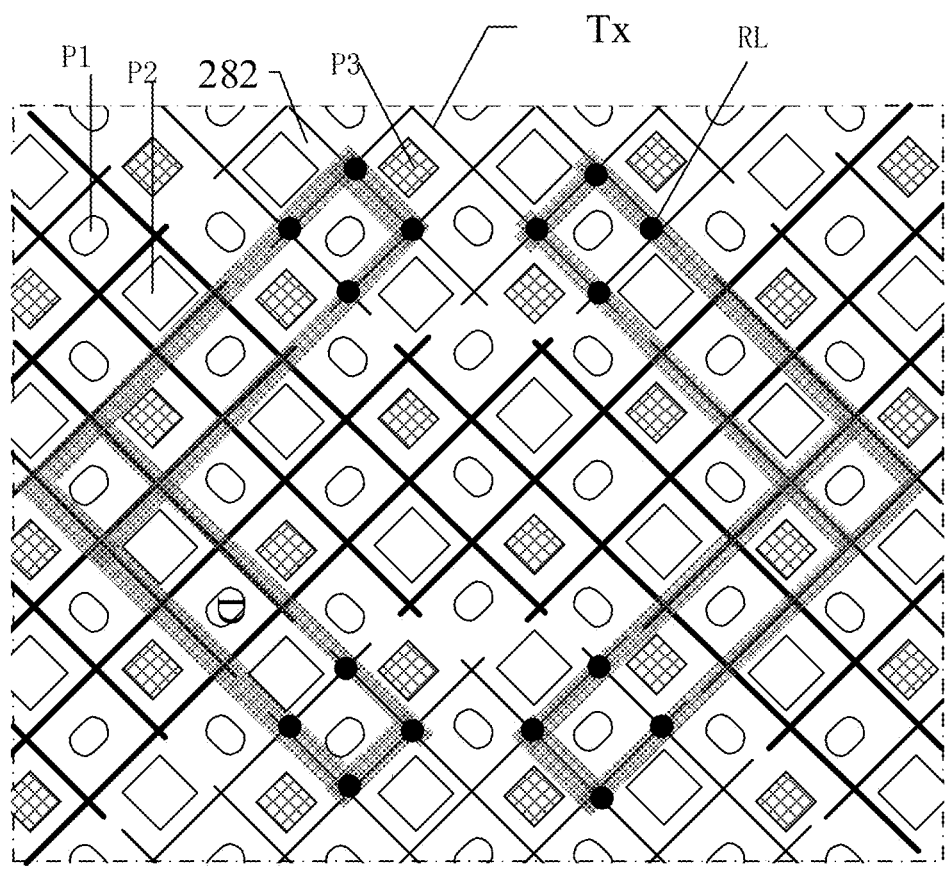
FIG. 7A is an enlarged schematic diagram of region D in FIG. 6B provided by at least one embodiment of the present disclosure.

For example, FIG. 7A is an enlarged schematic diagram of region D in FIG. 6B provided by at least one embodiment of the present disclosure. As shown in FIG. 7A, for example, the metal wires in the metal mesh are arranged corresponding to, for example, pixel spacer regions between light-emitting regions of a sub-pixel P1, a sub-pixel P2, or a sub-pixel P3; and meshes in the metal mesh are arranged in one-to-one correspondence with, for example, the sub-pixel P1, the sub-pixel P2, or the sub-pixel P3, so as to expose the light emitting element of the respective sub-pixels. For example, the light-emitting regions of the light emitting elements of the sub-pixel P1, the sub-pixel P2, or the sub-pixel P3 respectively emit green light, blue light, or red light.

In some embodiments of the present disclosure, as shown in FIG. 6B and FIG. 6C, the touch layer 28 further includes a second touch signal line Tx located in the display region; the first touch signal line Rx and the second touch signal line Tx each include a plurality of electrically connected electrode blocks (e.g., Tx0, Rx0 shown in FIG. 6A); two adjacent electrode blocks in the first touch signal line Rx or the second touch signal line Tx are electrically connected through the first transfer portion RL; and a contact area between the first transfer portion RL and the two adjacent electrode blocks is S4, where, $S1 \geq a*S4$, and a is a natural number or a real number greater than 0.8.

In at least one embodiment of the present disclosure, as shown in FIG. 6A to FIG. 6C, the touch layer 28 further includes a second touch signal line Tx located in the display region; the first touch signal line Rx and the second touch signal line Tx each include a plurality of electrically connected electrode blocks (e.g., Tx0, Rx0 shown in FIG. 6A); two adjacent electrode blocks in the first touch signal line Rx or the second touch signal line Tx are electrically connected through the first transfer portion RL; and a contact area between the first transfer portion RL and the two adjacent electrode blocks is S4, where S1 and S4 satisfy: $1 \leq S1/S4 \leq 18$.

Figure 7B:
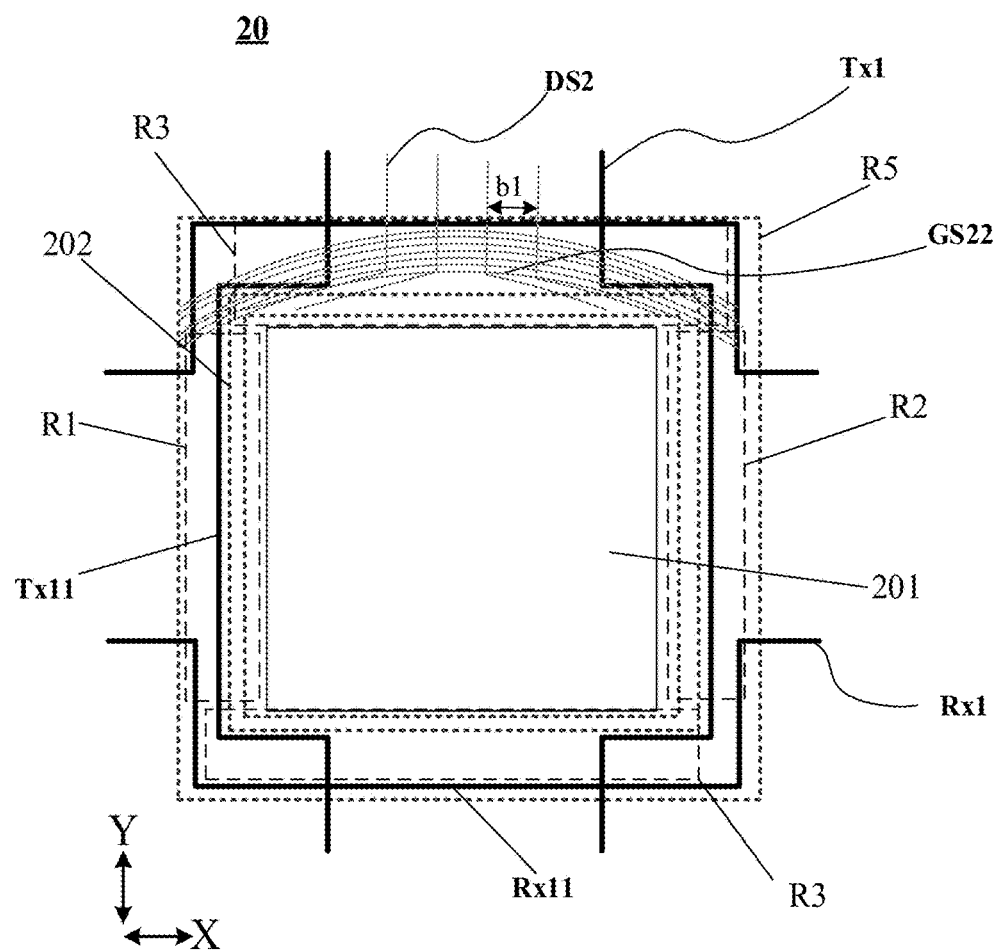
FIG. 7B is an enlarged schematic diagram of region E in FIG. 6B provided by at least one embodiment of the present disclosure.
Figure 7C:
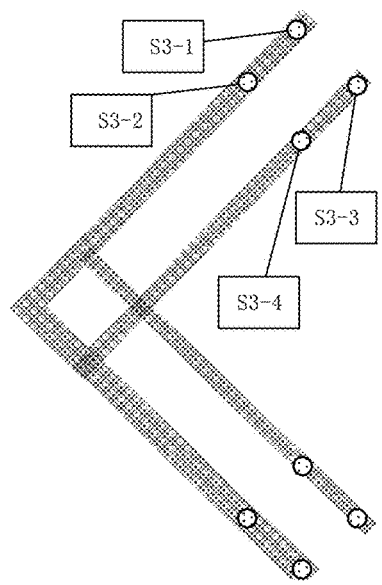
FIG. 7C is a schematic diagram of a first transfer portion of a touch layer provided by at least one embodiment of the present disclosure.

For example, FIG. 7C is a schematic diagram of a first transfer portion of a touch layer provided by at least one embodiment of the present disclosure. As shown in FIG. 7A and FIG. 7C, the contact area between the first transfer portion RL and two adjacent electrode blocks is the portion where Rx contacts the first transfer portion RL. In the embodiments of the present disclosure, the number of contact positions in a via hole may be 16, or may also be 8, 12, 18, 20, etc.; in this embodiment, 16 is taken as an example, and S3 is a sum of S3-1, S3-2, . . . , S3-16.

It should be noted that, areas S3-1, S3-2, S3-3, and S3-4 of the four contact positions are shown in FIG. 7C; other positions are the same; the contact area between the first transfer portion RL and two adjacent electrode blocks in the present disclosure may be understood as that the first transfer portion RL is electrically connected with the two adjacent electrode blocks by contact through a via hole, and the contact area may be a contact area of the first transfer portion RL and the electrode blocks in the via hole.

In some embodiments of the present disclosure, for example, the first touch signal line is disconnected in the peripheral region 202; and the second touch signal line is disconnected in the peripheral region 202. As shown in FIG. 6A and FIG. 6B, the touch layer 28 is disconnected in the peripheral region 202 surrounding the light-transmitting region 201, so that an orthogonal projection of the touch layer 28 on the base substrate 100 and the light-transmitting region 20 do not overlap at least partially.

Figure 8A:
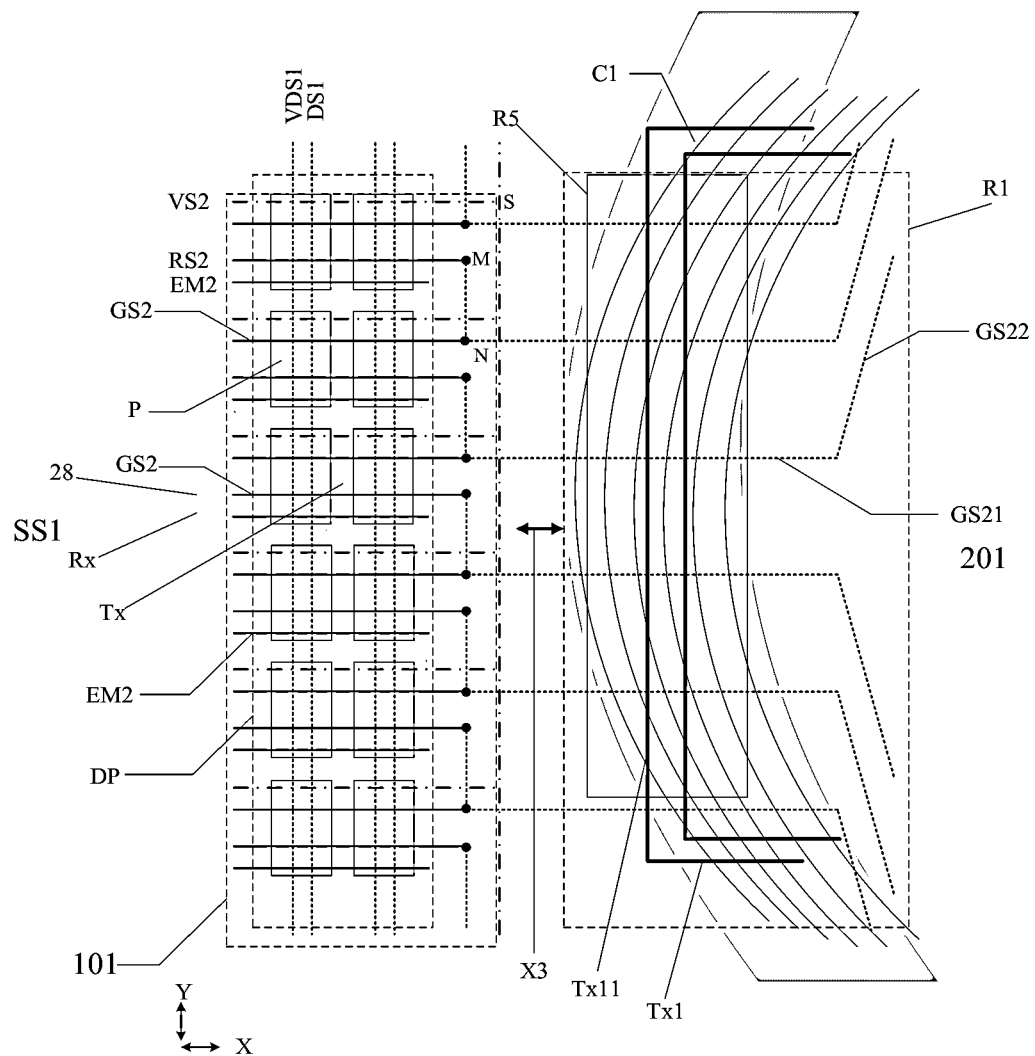
FIG. 8A is an enlarged schematic diagram of a first side of a light-transmitting region of a display panel provided by at least another embodiment of the present disclosure.

For example, FIG. 8A is an enlarged schematic diagram of a first side of a light-transmitting region of a display panel provided by at least another embodiment of the present disclosure. As shown in FIG. 8A, a distance between an edge of the touch layer 28 where the first touch signal line Rx and the second touch signal line Tx are located that is close to the light-transmitting region 201 and light-transmitting region 201 is X3.

In some embodiments of the present disclosure, the touch layer 28 further includes a second touch signal line Tx located in the display region and a second connecting portion Tx2 located in the peripheral region; the second connecting portion Tx2 is electrically connected with the second touch signal line Tx; the second connecting portion Tx2 overlaps with the projections of the m second signal lines GS2 on the base substrate; a length of the first touch signal line Rx in the display region is w1, and a length of the second touch signal line Tx in the display region is w2; an area of the first connecting portion Rx1 is A2, and an area of the second connecting portion Tx2 is A6; a vertical distance between at least one of the m second signal lines and the second electrode is H5; and a vertical distance between a first extending portion of at least one of the n first signal lines and the second electrode is H2, where, $(H5/H2) > (A2*w1/A6*w2)$.

It should be noted that, the "area" of a component according to the embodiments of the present disclosure may be understood as an area of an orthogonal projection of the component on the base substrate. For example, area A2 of the first connecting portion may be understood as a projection area of the first connecting portion Rx1 on the base substrate; or may also be an area of a top surface of the first connecting portion Rx1; the area of the second connecting portion Tx2 is the same, and no details will be repeated here.

For example, as shown in FIG. 6C, the length w1 of the first touch signal line Rx in the display region is the length of one touch signal line in the display region, and during specific implementation, the first touch signal line may be a touch sensing line Rx. For example, the touch sensing line Rx is a strip electrode, and w1 is the length of the strip electrode. For example, the touch sensing line Rx is a metal mesh electrode electrically connected in the first direction, and w1 is a linear length of the metal mesh electrode electrically connected in the first direction, as shown in FIG. 6C. Similarly, the length of the second touch signal line Tx in the display region is w2, which is a length of one touch signal line in the display region. During specific implementation, the second touch signal line may be a touch drive line Tx, the length w2 is understood similar to that of w1, and no details will be repeated here.

In some embodiments of the present disclosure, the first touch signal line may also be configured to receive a touch drive signal; and the second touch signal line may also be configured to receive a touch sensing signal, that is, in horizontal and vertical directions of the display panel, the touch signal may be supplied according to actual design.

In some embodiments of the present disclosure, the display panel may only include the first touch signal line; the first connecting portion Rx1 is configured to connect a touch electrode portion missing in the light-transmitting region; and in this case, self-capacitive recognition may be adopted as a touch mode.

In some embodiments of the present disclosure, at least one second signal line GS2 is configured to receive electric potential of a third voltage range; the first connecting portion is configured to receive electric potential of a fourth voltage range; and a maximum value of the third voltage range is greater than a maximum value of the fourth voltage range.

For example, the second signal line GS2 may be a scan signal line, for example, a gate scan line or a reset signal scan line; the third voltage range is −8 V to +8 V, and the fourth voltage range is 1 V to 5 V; during specific implementation, the voltage value may be selected according to the specific pixel drive circuit, which will not be limited in the present disclosure.

For example, the touch layer 28 further includes at least one first connecting portion and at least one second connecting line located in the opening peripheral region 2; and at least one first connecting portion passes through the opening peripheral region along the first direction from the first side of the light-transmitting region to the second side of the light-transmitting region. FIG. 7B is an enlarged schematic diagram of region E in FIG. 6B provided by at least one embodiment of the present disclosure. As shown in FIG. 6B and FIG. 7B, the touch layer 28 further includes a first connecting portion Rx1 and a second connecting line Tx1 located in the peripheral region 202. The first connecting portion Rx1 is routed around the opening 201 of the light-transmitting region 20 and extends from the first side SS1 of the light-transmitting region 20 to the second side SS2 of the light-transmitting region 20, so as to electrically connect the first touch signal line Rx located on the first side SS1 of the peripheral region 202 of the light-transmitting region 20 and the first touch signal line Rx located on the second side SS2 of the peripheral region 202 of the light-transmitting region 20. The second connecting line Tx1 is routed around the opening 201 of the light-transmitting region 20 and extends from the third side SS3 of the light-transmitting region 20 to the fourth side SS4 of the light-transmitting region, so as to connect the second touch signal line Tx located on the third side SS3 of the peripheral region 202 of the light-transmitting region 20 and the second touch signal line Rx located on the fourth side SS4 of the peripheral region 202.

For example, as shown in FIG. 7B, the first connecting portion Rx1 includes a first bending connecting portion Rx11 located in the peripheral region 202. The second connecting line Tx1 includes a second bending connecting portion Tx11 located in the peripheral region 202. The first bending connecting portion Rx11 passes through the third side SS3 and the fourth side SS4 of the opening peripheral region and winds around the opening 201. The second bending connecting portion Tx11 passes through the first side SS1 and the second side SS2 of the opening peripheral region and winds around the opening 201. An orthogonal projection of the first bending connecting portion Rx11 of the first connecting portion Rx1 on the base substrate and an orthogonal projection of the second bending portion GS22 of the second signal line GS2 on the base substrate do not overlap with each other. That is, the orthogonal projection of the first bending connecting portion Rx11 of the first connecting portion Rx1 in the third winding region R3 and the fourth winding region R4 on the base substrate is closer to the display region than the orthogonal projection of the second bending portion GS22 of the second signal line GS2 on the base substrate. Therefore, the first connecting portion Rx1 does not overlap in the third winding region R3 and the fourth winding region R4 where the second signal lines GS2 are densely routed, so as to reduce influence of the second signal line GS2 on electric potential of the first connecting portion Rx1.

For example, as shown in FIG. 7B, the peripheral region 202 includes a touch signal line winding region R5. The touch signal line winding region R5 surrounds the opening 201. The first bending connecting portion Rx11 of the first connecting portion Rx1 and the second bending connecting portion Tx11 of the second connecting line Tx1 are located in the touch signal line winding region R5. The touch signal line winding region R5 partially overlaps with the third winding region R3 and the fourth winding region R4 passed by the second bending portion GS22 of the second signal line GS2, and the first winding region R1 and the second winding region R2 passed by the first bending portion C1 of the first signal line DS2. The touch signal line winding region R5 is closer to the display region than the first winding region R1, the second winding region R2, the third winding region R3, and the fourth winding region R4.

For example, as shown in FIG. 7B, line widths of the first connecting portion Rx1 and the second connecting line Tx1 are greater than line widths of the second signal line GS2 and the first signal line DS2. The value range of the line widths of the first connecting portion Rx1 and the second connecting line Tx1 is about 10 μm to 50 μm, for example, the value is about 35 μm; here, the word "about" indicates that the value may fluctuate within a range of, for example, ±15%, or for another example, ±% 25. The value range of the line widths of the second signal line GS2 and the first signal line DS2 is about 2 μm to 5 μm, for example, the value is about 3.5 μm; here, the word "about" indicates that the value may fluctuate within a range of, for example, ±15%, or for another example, ±%25.

Figure 8B:
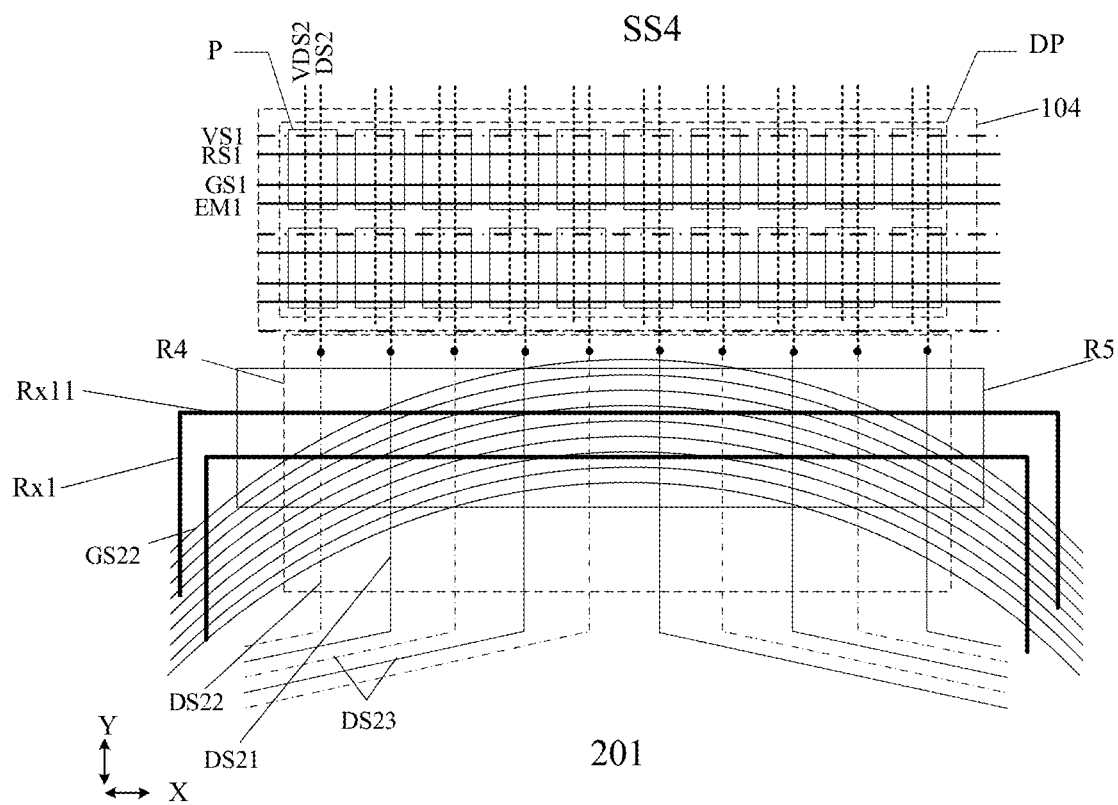
FIG. 8B is an enlarged schematic diagram of a fourth side of a light-transmitting region of a display panel provided by at least another embodiment of the present disclosure.

For example, FIG. 8B is an enlarged schematic diagram of a fourth side of a light-transmitting region of a display panel provided by at least another embodiment of the present disclosure. As shown in FIG. 8A and FIG. 8B, density of the first bending connecting portions Rx11 of the first connecting portion Rx1 in the touch signal line winding region R5 and density of the second bending connecting portions Tx11 of the second connecting line Tx1 in the touch signal line winding region R5 are less than density of the second bending portions GS22 of the second signal line GS2 in the third winding region R3 and the fourth winding region R4, and are less than density of the first bending portions C1 of the first signal line DS2 in the first winding region R1 and the second winding region R2. Therefore, influence of dense wiring in the opening peripheral region on the first touch signal line Rx and the second touch signal line Tx is reduced.

Figure 9A:
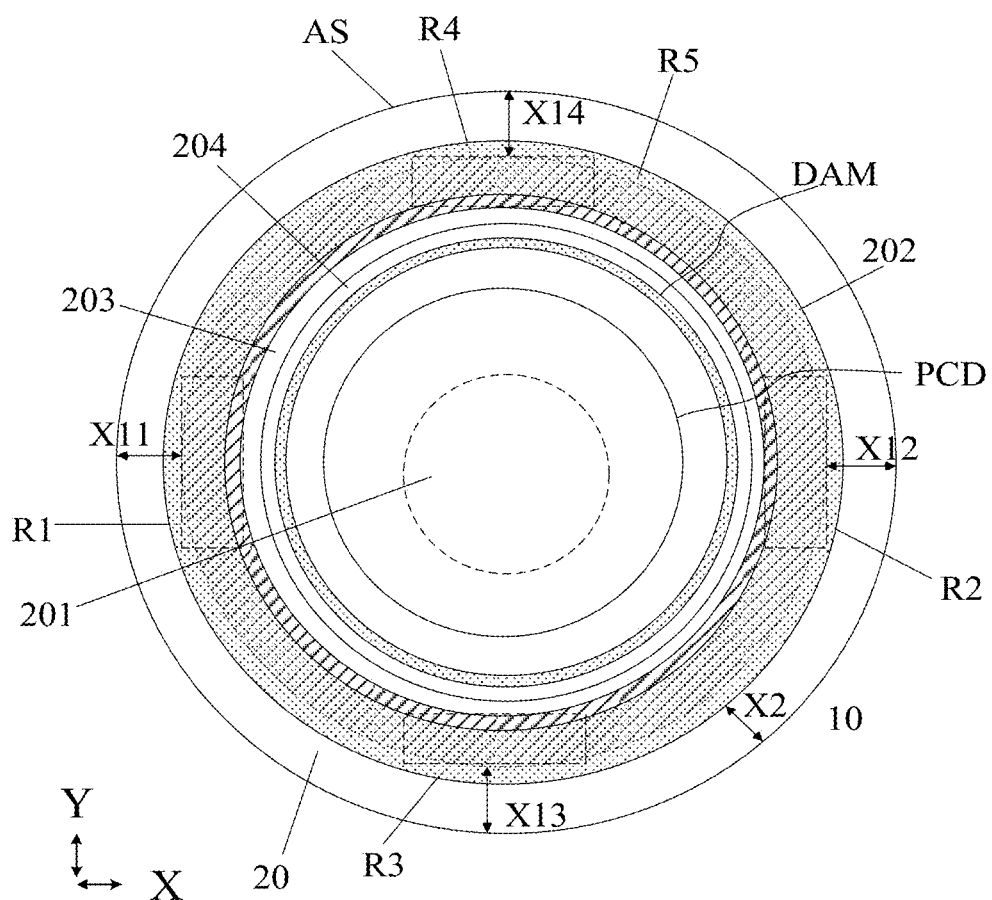
FIG. 9A is an enlarged schematic diagram of a light-transmitting region of a display panel provided by at least one embodiment of the present disclosure.

It should be noted that, the wiring "density" according to the embodiments of the present disclosure refers to the number of wires per unit area, for example, the number of wires per unit distance in the first direction X or the second direction Y. For example, FIG. 9A is an enlarged schematic diagram of a light-transmitting region of a display panel provided by at least one embodiment of the present disclosure. As shown in FIG. 9A, a distance X2 between the touch signal line winding region R5 and the boundary AS of the display region 10 that is close to the light-transmitting region 20 in the radial direction is less than a distance X11 between the first winding region R1 and the boundary AS of the first display region that is close to the light-transmitting region 20 in the first direction X or a distance X12 between the second winding region R2 and the boundary AS of the second display region that is close to the light-transmitting region 20 in the first direction X, and is less than a distance X13 between the third winding region R3 and the boundary AS of the third display region that is close to the light-transmitting region 20 in the second direction Y or a distance X14 between the fourth winding region R4 and the boundary AS of the fourth display region that is close to the light-transmitting region 20 in the second direction Y. Therefore, influence of dense wiring in the opening peripheral region on the first touch signal line Rx and the second touch signal line Tx is reduced.

It should be noted that, FIG. 9A is described by taking the opening 201 and the light-transmitting region 20 as circles. When the opening 201 and the light-transmitting region 20 are rectangles, for example, the distance between the touch signal line winding region R5 and the boundary AS of the display region 10 that is close to the light-transmitting region 20 is a distance along the first direction X or the second direction Y.

Figure 9B:
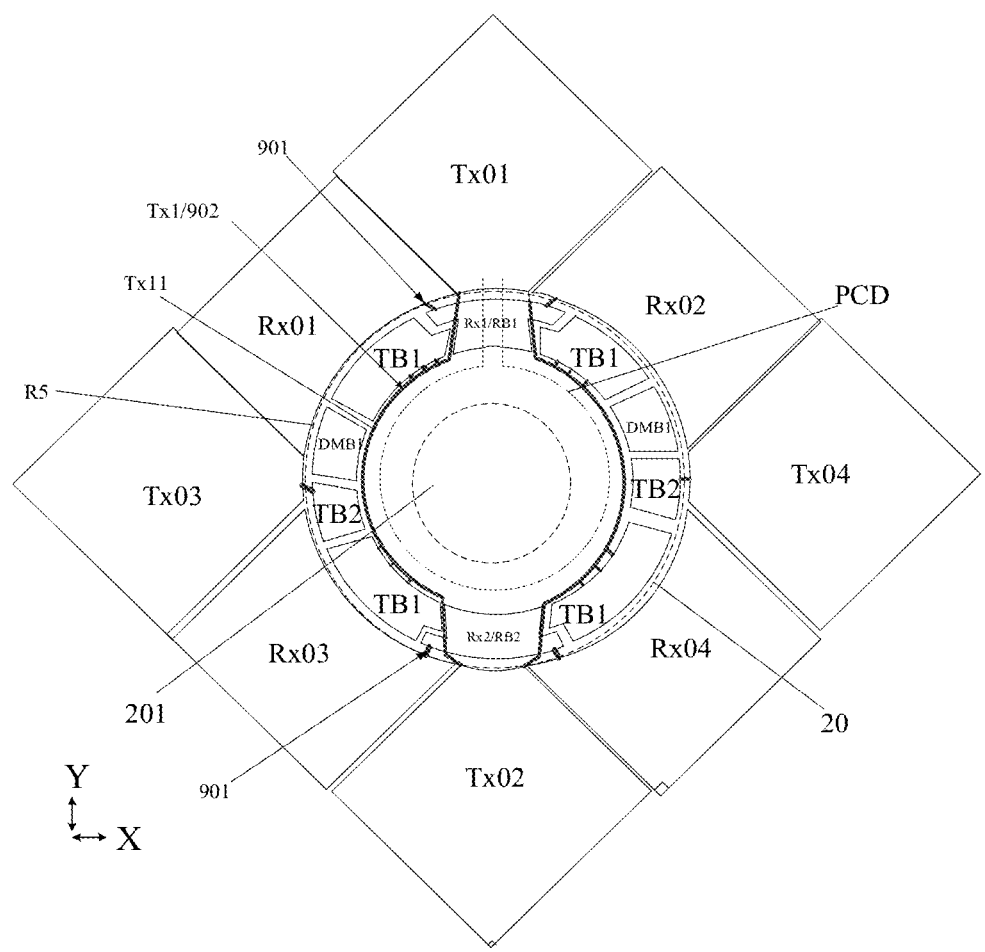
FIG. 9B is an enlarged schematic diagram of a light-transmitting region of a display panel provided by at least another embodiment of the present disclosure.
Figure 10A:
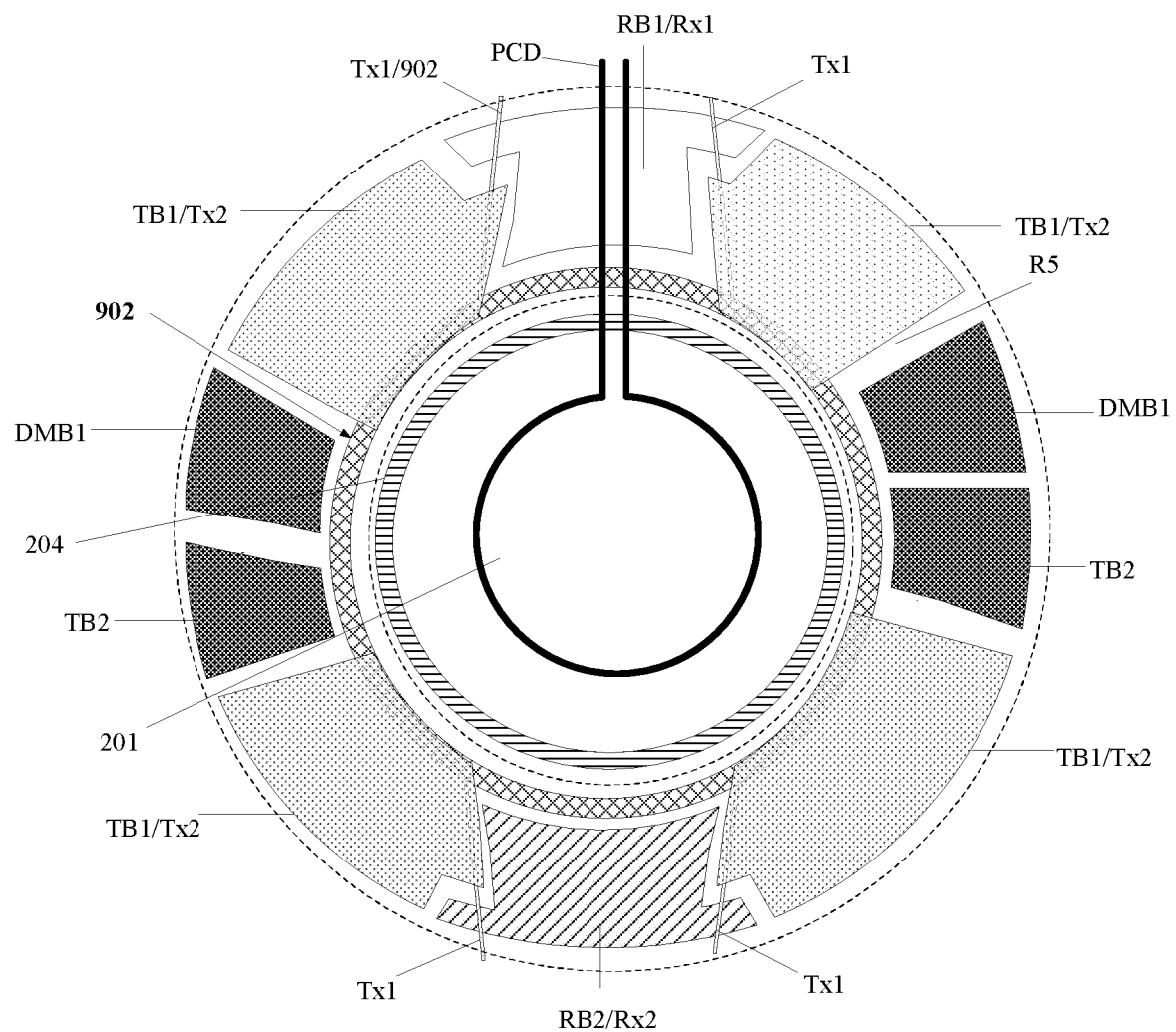
FIG. 10A is an enlarged schematic diagram of a light-transmitting region of a display panel provided by at least another embodiment of the present disclosure.
Figure 10B:
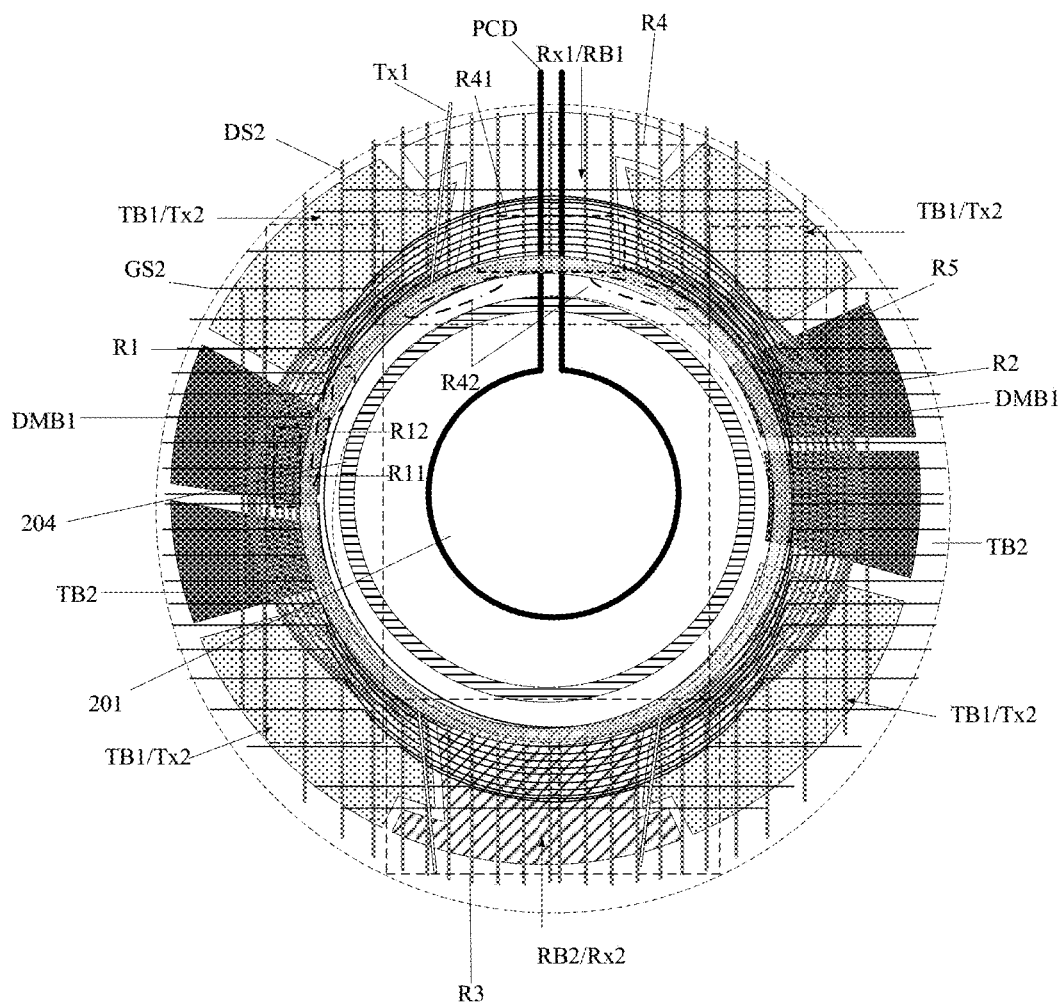
FIG. 10B is an enlarged schematic diagram of a light-transmitting region of a display panel provided by at least another embodiment of the present disclosure.
Figure 10C:
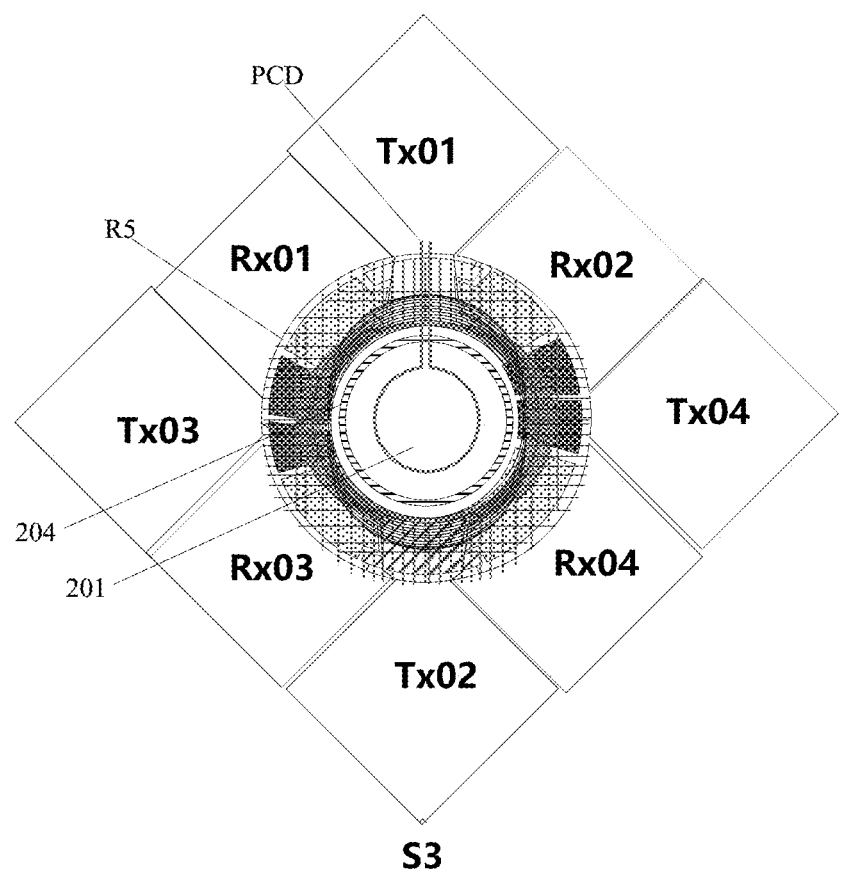
FIG. 10C is a schematic diagram of a light-transmitting region of a display panel provided by at least another embodiment of the present disclosure.
Figure 10D:
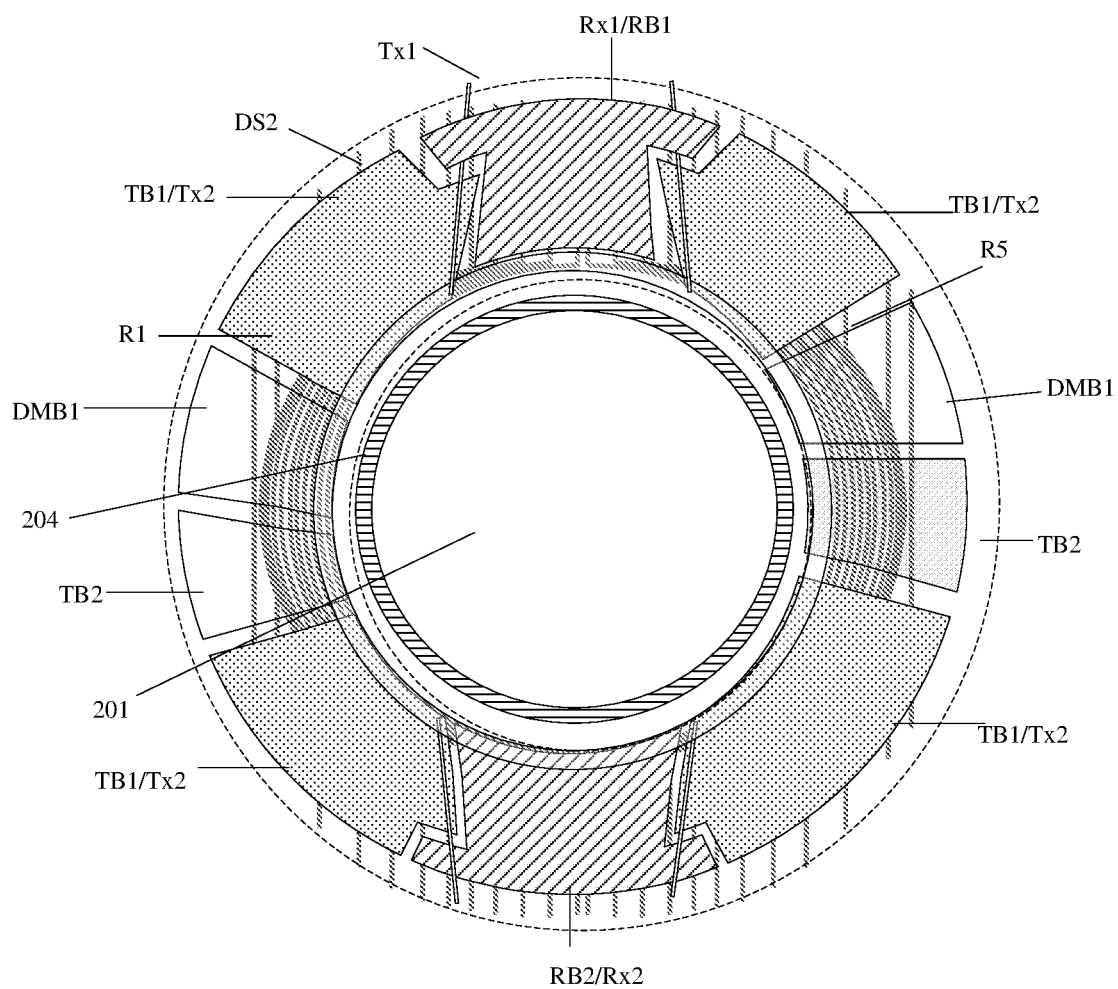
FIG. 10D is a schematic diagram of a light-transmitting region of a display panel provided by another embodiment of the present disclosure.
Figure 10E:
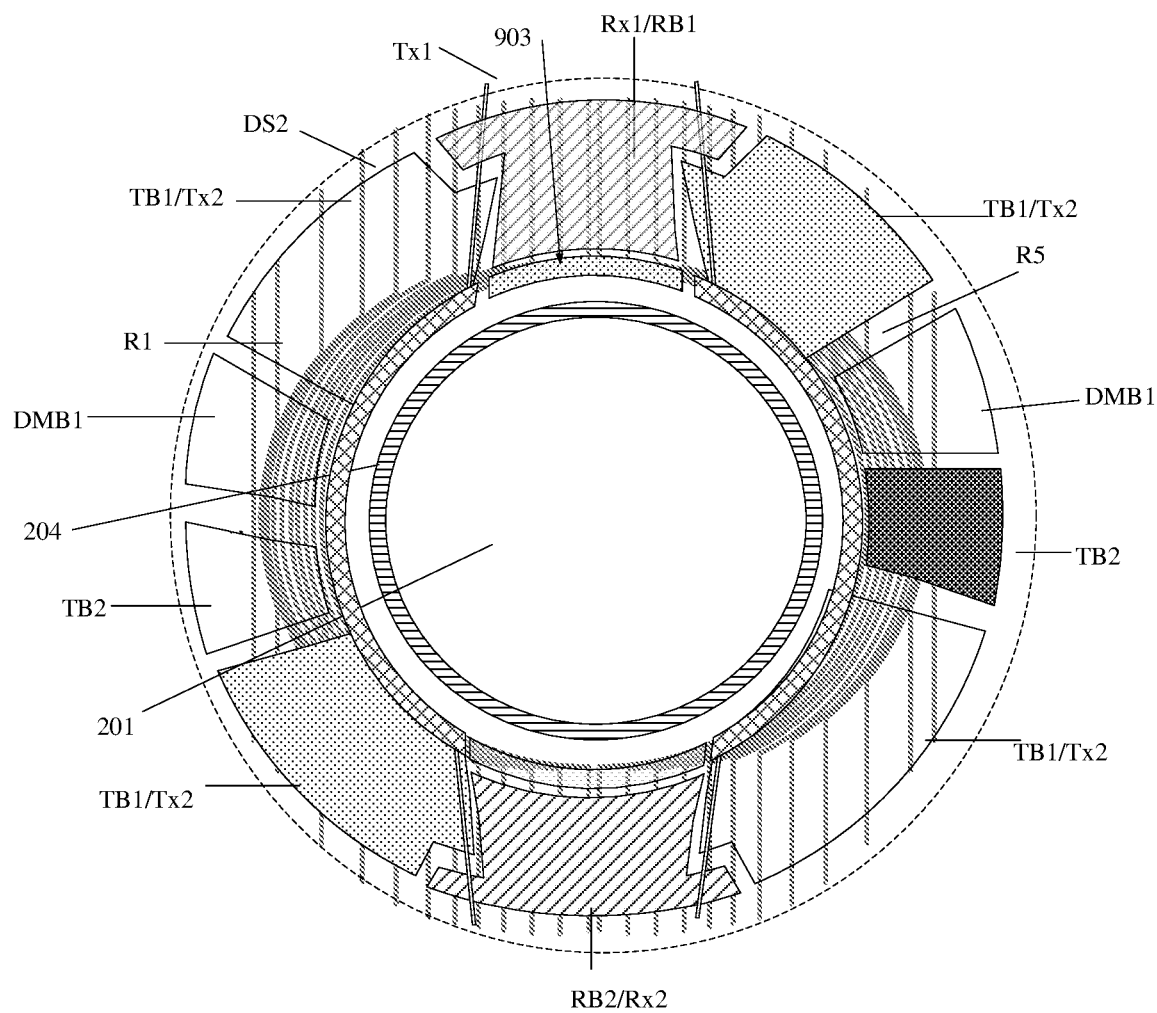
FIG. 10E is a schematic diagram of a light-transmitting region of a display panel provided by another embodiment of the present disclosure.
Figure 11A:
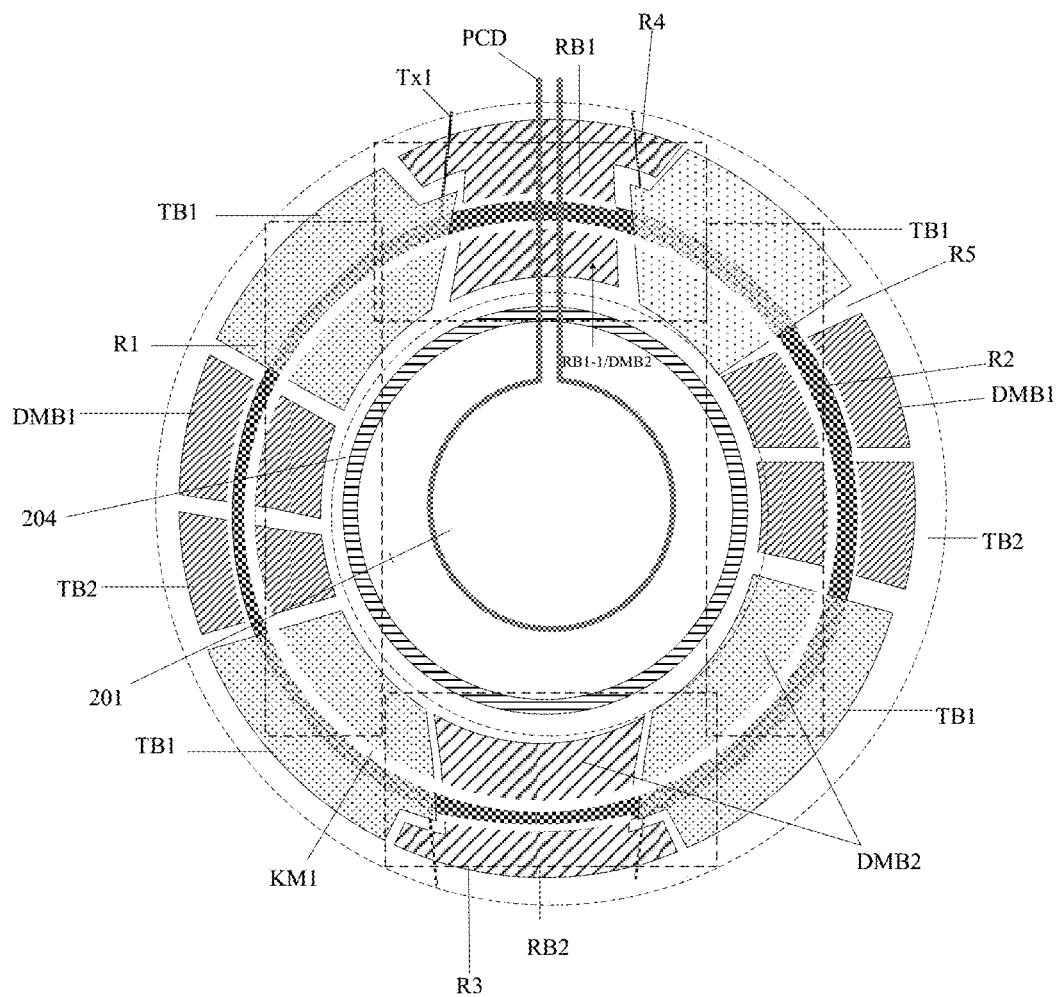
FIG. 11A is an enlarged schematic diagram of a light-transmitting region of a display panel provided by at least another embodiment of the present disclosure.
Figure 11B:
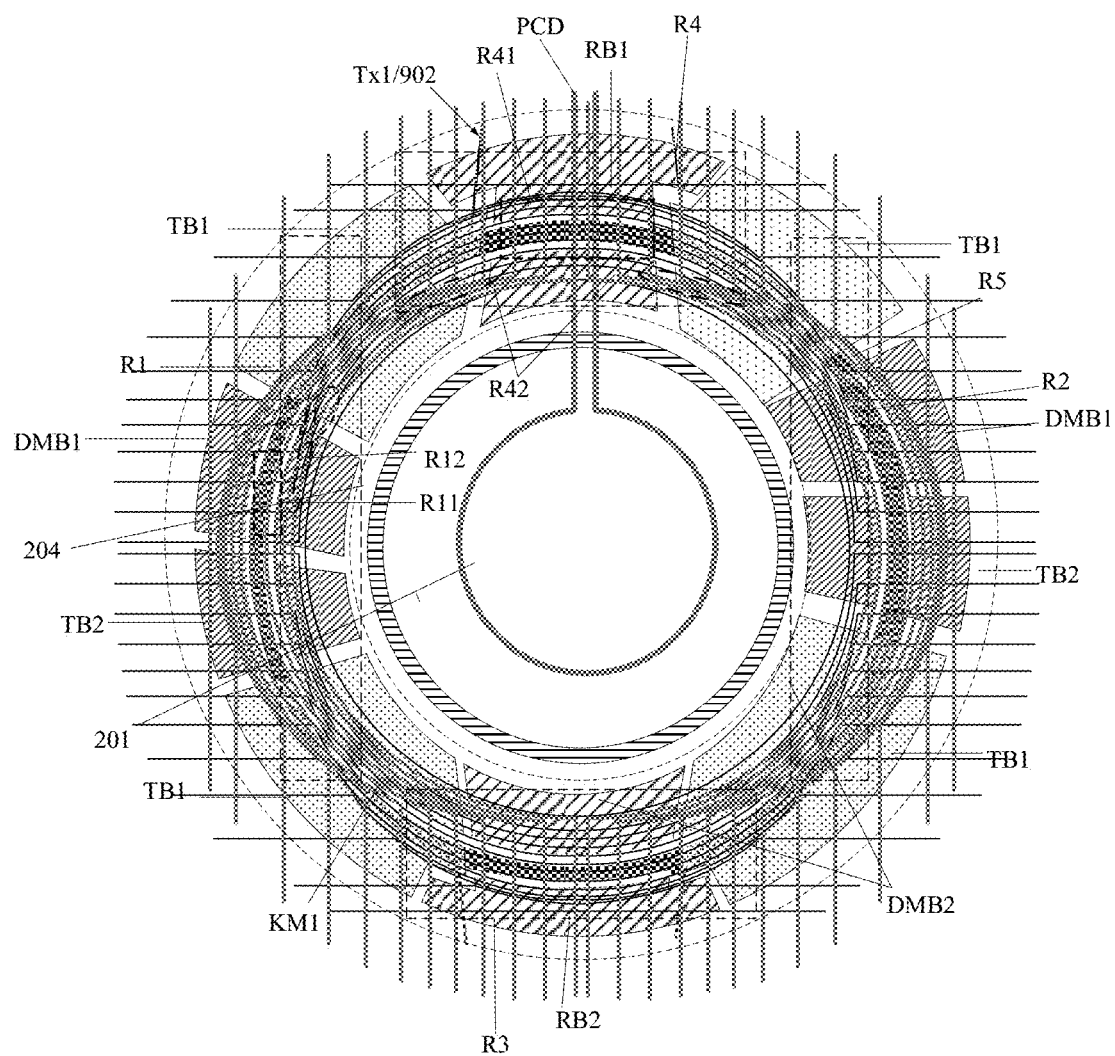
FIG. 11B is an enlarged schematic diagram of a light-transmitting region of a display panel provided by at least another embodiment of the present disclosure.
Figure 11C:
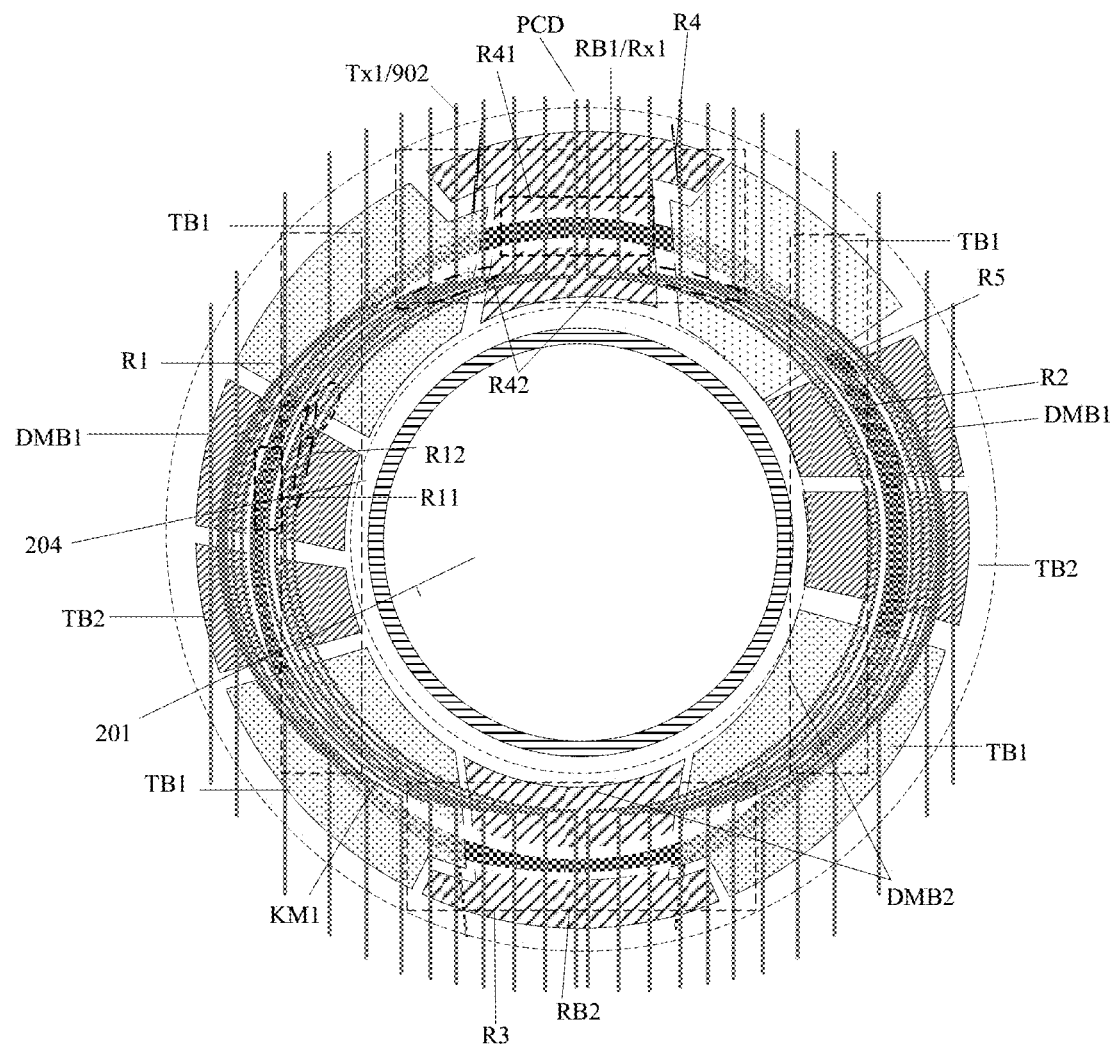
FIG. 11C is an enlarged schematic diagram of a light-transmitting region of a display panel provided by at least another embodiment of the present disclosure.

For example, FIG. 9B is an enlarged schematic diagram of a light-transmitting region of a display panel provided by at least another embodiment of the present disclosure. FIG. 10A is an enlarged schematic diagram of a light-transmitting region of a display panel provided by at least another embodiment of the present disclosure; FIG. 10B is an enlarged schematic diagram of a light-transmitting region of a display panel provided by at least another embodiment of the present disclosure; FIG. 10C is a schematic diagram of a light-transmitting region of a display panel provided by at least another embodiment of the present disclosure;

FIG. 10D is a schematic diagram of a light-transmitting region of a display panel provided by another embodiment of the present disclosure; FIG. 10E is a schematic diagram of a light-transmitting region of a display panel provided by another embodiment of the present disclosure; FIG. 11A is an enlarged schematic diagram of a light-transmitting region of a display panel provided by at least another embodiment of the present disclosure; FIG. 11B is an enlarged schematic diagram of a light-transmitting region of a display panel provided by at least another embodiment of the present disclosure; and FIG. 11C is an enlarged schematic diagram of a light-transmitting region of a display panel provided by at least another embodiment of the present disclosure.

As shown in FIG. 9B to FIG. 11C, the second connecting line Tx1 includes a second connecting sub-block Tx01 located on the fourth side SS4 of the opening 201, a second connecting sub-block Tx02 located on the third side SS3 of the opening 201, a second connecting sub-block Tx03 located on the first side SS1 of the opening 201, and a second connecting sub-block Tx04 located on the second side SS2 of the opening 201. Portions of orthogonal projections of the second connecting sub-block Tx01, the second connecting sub-block Tx02, the second connecting sub-block Tx03, and the second connecting sub-block Tx04 overlap with the light-transmitting region 20; and the overlapping portions are removed, so that an area of each of the second connecting sub-block Tx01, the second connecting sub-block Tx02, the second connecting sub-block Tx03, and the second connecting sub-block Tx04 is less than that of other first connecting portion Tx, so it is necessary to perform resistance compensation on the second connecting sub-block Tx01, the second connecting sub-block Tx02, the second connecting sub-block Tx03, and the second connecting sub-block Tx04. Similarly, the first connecting portion Rx1 includes a first connecting sub-block Rx01 located between the second connecting sub-block Tx01 and the second connecting sub-block Tx03, a first connecting sub-block Rx02 located between the second connecting sub-block Tx01 and the second connecting sub-block Tx04, a first connecting sub-block Rx03 located between the second connecting sub-block Tx02 and the second connecting sub-block Tx03, and a first connecting sub-block Rx04 located between the second connecting sub-block Tx02 and the second connecting sub-block Tx04. Portions of orthogonal projections of the first connecting sub-block Rx01, the first connecting sub-block Rx02, the first connecting sub-block Rx03, and the first connecting sub-block Rx04 overlap with the light-transmitting region 20; and the overlapping portions are removed, so that an area of each of the first connecting sub-block Rx01, the first connecting sub-block Rx02, the first connecting sub-block Rx03, and the first connecting sub-block Rx04 is less than that of other first connecting portion Rx1, so it is necessary to perform resistance compensation on the first connecting sub-block Rx01, the first connecting sub-block Rx02, the first connecting sub-block Rx03, and the first connecting sub-block Rx04.

For example, as shown in FIG. 9B to FIG. 11B, the first connecting portion Rx1 further includes a first connecting portion compensating portion RB1 and a first connecting portion compensating portion RB2 of the touch signal line winding region R5. The first connecting portion compensating portion RB1 is located on an upper side of the touch signal line winding region R5 (i.e., the fourth side SS4); the first connecting portion compensating portion RB1 is adjacent to the first connecting sub-block Rx01 and the first connecting sub-block Rx02; and the first connecting portion compensating portion RB1 is connected with the first connecting sub-block Rx01 and the first connecting sub-block Rx02 through the first connecting portion Rx1, so as to perform resistance compensation on the first connecting sub-block Rx01 and the first connecting sub-block Rx02.

The first connecting portion compensating portion RB2 is located on a lower side of the touch signal line winding region R5 (i.e., the third side SS3); the first connecting portion compensating portion RB2 is adjacent to the first connecting sub-block Rx03 and the first connecting sub-block Rx04; and the first connecting portion compensating portion RB2 is connected with the first connecting sub-block Rx03 and the first connecting sub-block Rx04 through the first connecting portion Rx1, so as to perform resistance compensation on the first connecting sub-block Rx03 and the first connecting sub-block Rx04. The second connecting line Tx1 further includes a second connecting line compensating portion TB1 and a second connecting line compensating portion TB2 of the touch signal line winding region R5. The number of the second connecting line compensating portions TB1 is 4, and the number of the second connecting line compensating portions TB2 is 2. The 4 second connecting line compensating portions TB1 are distributed in a rectangular shape, and the 4 second connecting line compensating portions TB1 are respectively connected with the second bending connecting portion Tx11 of the second connecting line Tx1 that connects the second connecting sub-block Tx01 and the second connecting sub-block Tx02, so as to perform resistance compensation on the second connecting sub-block Tx01 and the second connecting sub-block Tx02. The 2 second connecting line compensating portions TB2 are respectively adjacent to the second connecting sub-block Tx03 and the second connecting sub-block Tx04, and are respectively connected with the second connecting sub-block Tx03 and the second connecting sub-block Tx04 through the second connecting line Tx1, so as to perform resistance compensation on the second connecting sub-block Tx03 and the second connecting sub-block Tx04. The number of the first connecting portion compensating portions RB1 and first connecting portion compensating portions RB2 is less than the number of the second connecting portion compensating portions TB1 and second connecting portion compensating portions TB2, which reduces influence of dense wiring in the opening peripheral region on electric potential of the first touch signal electrode Rx.

For example, as shown in FIG. 9B to FIG. 11B, the first connecting portion compensating portion RB1 and the first connecting portion Rx1 may be an integral structure and located in a same film layer; the first connecting sub-block Rx01 and the first connecting sub-block Rx02 are electrically connected with each other through the first connecting portion Rx1; exemplarily, the first connecting sub-block Rx01 and the first connecting sub-block Rx02 may be a block-shaped electrode structure, or may also be a block-shaped hollow (e.g., a metal mesh) electrode structure, which may be electrically connected with the first connecting portion Rx1 through a connecting bridge 901 (as shown in FIG. 9B).

For example, as shown in FIG. 9B to FIG. 11B, the connecting bridge 901 may also be an integral structure with the first connecting sub-block Rx01 and the first connecting sub-block Rx02, for example, it may be a block-shaped electrode structure, or a block-shaped hollow structure with a protruding portion electrically connected with the first connecting portion Rx1, which will not be limited in this embodiment, as long as the first connecting sub-block Rx01 (the first connecting sub-block Rx01) and the first connecting sub-block Rx02 (the first connecting sub-block Rx02) are electrically connected with the first connecting portion Rx1.

For example, in other examples, the number of the second connecting line compensating portions TB1 may also be 2, 8, etc.; the number of the second connecting line compensating portions TB2 is 4, etc.; and the embodiments of the present disclosure are not limited thereto.

For example, the second connecting line compensating portion TB1 and the second connecting portion Tx2 may be an integral structure, as shown in FIG. 10A, the four portions of the second connecting portion TS2 in the figure (located at upper left, lower left, upper right, and lower right in the figure) and the four second connecting line compensating portions TB1 provided corresponding thereto may be connected as a whole, that is, each correspondingly connected second connecting line compensating portion TB1 and the second connecting portion Tx2 are regarded as one compensating portion. The above-described design is related to the specific design structure, and does not constitute a limitation to the embodiments of the present disclosure.

For example, as shown in FIG. 9B, the second connecting portion Tx2 may be a plurality of block structures, and is located in a same layer as the first connecting portion Rx1. As shown in the figure, the second connecting portion Tx2 includes 4 portions located in top, bottom, left, and right positions in the figure; the two first connecting portions Rx1 are respectively located on a side close to the opening 201 relative to the second connecting portion Tx2; and the two first connecting portions Rx1 are respectively close to the second connecting portion Tx2 located above and the second connecting portion Tx2 located below. For example, as shown in FIG. 9B, a plurality of second connecting portions Tx2 receiving a same signal may be electrically connected through a conductive layer, for example, electrode blocks of the second connecting sub-block Tx01 and the second connecting sub-block Tx02 located on opposite sides of the light-transmitting region 201 are electrically connected through the second connecting line Tx1.

For example, as shown in FIG. 9B, FIG. 10A, and FIG. 10E, the second connecting line Tx1 may be arranged in a ring shape around the light-transmitting region 201, or may also be disconnected to respectively electrically connect, from left and right sides of the light-transmitting region 201, the electrode blocks of the second connecting sub-block Tx01 and the second connecting sub-block Tx02 located in upper and lower positions; and a length and a width of the second connecting line Tx1 are designed according to a size of a capacitor to be formed by the Tx01 and Tx02 electrode blocks.

For example, as shown in FIG. 10E, the width of the second connecting line Tx1 is greater than the line width of the first signal line DS2 and the second signal line GS2. Through disconnection processing, a dummy block 903 may be provided in a position corresponding to the first connecting portion Rx1; in this way, the first bending portion C1 of the first signal line DS2 may be corresponding to the dummy block 903, thereby alleviating mutual influence between the first connecting portion Rx1, the second electrode (the cathode), and the first signal line DS2. For example, as shown in FIG. 8B, FIG. 9A and FIG. 9B, an orthogonal projection of the first connecting portion compensating portion RB2 on the base substrate 100 partially overlaps with the third winding region R3 and the fourth winding region R4 (shown in FIG. 7B) passed by the second bending portion GS22 of the second signal line GS2. An orthogonal projection of the second connecting line compensating portion TB1 and the second connecting line compensating portion TB2 on the base substrate 100 partially overlaps with the first winding region R1 and the second winding region R2 (shown in FIG. 7A) passed by the first bending portion C1 of the first signal line DS2.

For example, the film layer in which at least one second connecting line compensating portion is located is different from the film layer in which the second bending connecting portion is located. As shown in FIG. 9B and FIG. 12A, the second bending connecting portion Tx11 of the second connecting line Tx1 is located in the second touch pattern layer 281 on a side of the touch insulating layer 283 away from the base substrate. The first connecting portion compensating portion RB1, the first connecting portion compensating portion RB2, and the second connecting line Rx1 are located in the first touch pattern layer 282, so that the first connecting portion compensating portion RB1, the first connecting portion compensating portion RB2, and the second connecting line Rx1 can be directly connected without changing layers. The second connecting line compensating portion TB1 and the second connecting line compensating portion TB2 are located in the first touch pattern layer 282 on a side of the touch insulating layer 283 close to the base substrate. That is to say, the second connecting line Tx1 changes layers when passing through the first connecting portion compensating portion RB1 or the first connecting portion compensating portion RB2, without being connected with the first connecting portion compensating portion RB1 or the first connecting portion compensating portion RB2. The second bending connecting portion Tx11 of the second connecting line Tx1 is electrically connected with the second connecting line compensating portion TB1 and the second connecting line compensating portion TB2 through the via hole penetrating through the touch insulating layer 283, thereby reducing overlapping of the second connecting line compensating portion TB1 and the second connecting line compensating portion TB2 with the first connecting portion Rx1 and the second connecting line Tx1 in the first touch pattern layer 282.

For example, as shown in FIG. 9B, the display panel 1 further includes a dummy compensating portion DMB1 located in the touch signal line winding region R5. For example, the number of dummy compensating portions DMB1 is two, which are respectively arranged on both sides of the touch signal line winding region R5, and are configured to planarize the display panel 1.

For example, an orthogonal projection of the first bending connecting portion of at least one first connecting portion on the base substrate overlaps with at least two of the at least one first signal line and the at least one second signal line. An orthogonal projection of the first bending connecting portion of at least one second connecting line on the base substrate overlaps with at least two of the at least one first signal line and the at least one second signal line. As shown in FIG. 12A, the orthogonal projection of the second connecting line Tx1 on the base substrate 100 overlaps with the orthogonal projection of at least two of the second bending portion GS22 of the second signal line GS2 and the first bending portion C1 of the first signal line DS2 on the base substrate 100. The orthogonal projection of the first connecting portion Rx1 on the base substrate 100 overlaps with the orthogonal projection of at least two of the second bending portion GS22 of the second signal line GS2 and the first bending portion C1 of the first signal line DS2 on the base substrate 100. For example, in the fourth winding region R4, the second signal line GS2 is arranged between the first insulating layer 212 and the second insulating layer 213, and between the second insulating layer 213 and the third insulating layer 214, and the first signal line DS2 is arranged between the third insulating layer 214 and the fourth insulating layer 232 and on a side of the fourth insulating layer 232 away from the base substrate. In the fourth winding region R4, the region where four-layer wires are arranged overlaps with the orthogonal projection of the second connecting line Tx1 on the base substrate 100 as much as possible, so as to reduce influence of the densely wiring region on the first connecting portion Rx1.

For example, as shown in FIG. 12A, in the first winding region R1, the first signal line DS2 is arranged between the third insulating layer 214 and the fourth insulating layer 232 and on the side of the fourth insulating layer 232 away from the base substrate, and the orthogonal projection of the first signal line DS2 on the base substrate 100 overlaps with the orthogonal projection of the second connecting line Tx1 on the base substrate 100, so as to reduce influence of the densely wiring region on the first connecting portion Rx1.

For example, as shown in FIG. 9A and FIG. 12A, the opening peripheral region further includes a first opening peripheral sub-region 203 (e.g., a thinned region) and a second opening peripheral sub-region 204 (e.g., a shielding region). The first opening peripheral sub-region 203 is located on a side of the touch signal line winding region R5 close to the opening 201; and the second opening peripheral sub-region 204 is located on a side of the first opening peripheral sub-region 203 close to the opening 201. The first opening peripheral sub-region 203 at least partially overlaps with the touch signal line winding region R5.

For example, the thickness of at least a portion of the fourth insulating layer in the first opening peripheral sub-region in the direction perpendicular to the base substrate is less than the thickness of the fourth insulating layer in the display region in the direction perpendicular to the base substrate. As shown in FIG. 12A, the first planarization layer 232 and the second planarization layer 251 have an arc-shaped surface on a side of the first opening peripheral sub-region 203 away from the base substrate, and the first planarization layer 232 and the second planarization layer 251 have a thickness gradually decreased in a direction approaching the opening 201. By reducing the thicknesses of the first planarization layer 232 and the second planarization layer 251, that is, making the second electrode 263 arc-shaped and extend in a direction approaching the display panel 100, influence of wiring in the first opening peripheral sub-region away from the display region on the second electrode 263 of the light emitting element 26 may be reduced.

For example, the orthogonal projection of the first connecting portion on the base substrate at least partially overlaps with the third sub-region of the fourth winding region, and the orthogonal projection of the second bending connecting portion of at least one second connecting line on the base substrate at least partially overlaps with the first sub-region of the first winding region. As shown in FIG. 10A, FIG. 10B and FIG. 10C, the orthogonal projection of the first connecting portion compensating portion RB1 or the first connecting portion compensating portion RB2 of the first connecting portion Rx1 on the base substrate 100 overlaps with the third sub-region R41, that is to say, the first connecting portion compensating portion RB1 or the first connecting portion compensating portion RB2 of the first connecting portion Rx1 overlaps with a region with less wiring density as much as possible. An orthogonal projection of the second connecting line compensating portion TB1 and the second connecting line compensating portion TB2 of the second connecting line Tx1 on the base substrate 100 overlaps with the first sub-region R11, that is to say, the second connecting line compensating portion TB1 and the second connecting line compensating portion TB2 of the second connecting line Tx1 overlap with a region with less wiring density as much as possible. Therefore, influence of wiring in the peripheral region 202 on electric potential of the first connecting portion Rx1 and the second connecting line Tx1 is reduced.

For another example, an orthogonal projection of at least one first connecting portion compensating portion on the base substrate does not overlap with the fourth sub-region of the fourth winding region, and an orthogonal projection of at least one second connecting line compensating portion on the base substrate at least does not overlap with the second sub-region of the first winding region. As shown in FIG. 11A and FIG. 11B, an orthogonal projection of the first connecting portion compensating portion RB1 or the first connecting portion compensating portion RB2 of the first connecting portion Rx1 on the base substrate 100 does not overlap with a portion of the fourth sub-region R42, that is to say, the first connecting portion compensating portion RB1 or the first connecting portion compensating portion RB2 of the first connecting portion Rx1 does not overlap with a region with greater wiring density. An orthogonal projection of the second connecting line compensating portion TB1 and the second connecting line compensating portion TB2 of the second connecting line Tx1 on the base substrate 100 does not overlap with the second sub-region R12, that is to say, the second connecting line compensating portion TB1 and the second connecting line compensating portion TB2 of the second connecting line Tx1 overlaps with a region with greater wiring density as less as possible. Therefore, influence of wiring in the peripheral region 202 on electric potential of the first connecting portion Rx1 and the second connecting line Tx1 is reduced.

For example, as shown in FIG. 11A and FIG. 11B, the touch signal line winding region R5 includes a first dummy compensating portion DMB2. The first dummy compensating portion DMB2 is located on a side of the first connecting portion compensating portion RB1, the dummy compensating portion DMB1, the second connecting line compensating portion TB1, and the second connecting line compensating portion TB2 close to the opening 201. The first connecting portion compensating portion RB1, the dummy compensating portion DMB1, the second connecting line compensating portion TB1, and the second connecting line compensating portion TB2 may be regarded as forming a ring shape, and the ring shape is divided into two portions through a ring-shaped opening KM1. A portion close to the opening 201 serves as a dummy compensating portion DMB2. According to the amount of signals the first touch signal line Rx and the second touch signal line Tx need to be compensated for, the first connecting portion compensating portion RB1, the second connecting line compensating portion TB1 and the second connecting line compensating portion TB2 may have a portion cut short to serve as a dummy compensating portion. The opening KM1 may be used for routing of the second connecting line Tx1. The orthogonal projection of the first dummy compensating portion DMB2 on the base substrate overlaps with the second sub-region R12 of the first winding region R1 and the fourth sub-region R42 of the fourth winding region R4. That is to say, densely wired regions of the first winding region R1 and the fourth winding region R4 overlap with the first dummy compensating portion DMB2, which may reduce influence of wiring of the peripheral region 202 on electric potential of the first connecting portion Rx1 and the second connecting line Tx1.

For example, as shown in FIG. 12A, the distance L4 between the touch signal line winding region R5 (e.g., the center) and the second opening peripheral sub-region 204 along the first direction X ranges from about 10 μm to 15 μm, for example, a value is about 12.5 μm, here, the word "about" indicates that the value may fluctuate within a range of, for example, ±15%, or for another example, ±%25.

For example, as shown in FIG. 12A, the display panel 1 further includes a fifth insulating layer 29 located in the first opening peripheral sub-region 203 and a region between the first opening peripheral sub-region 203 and the opening 201, and a protective layer 284 located on a side of the touch layer 28 away from the base substrate (e.g., as shown in FIG. 5). The fifth insulating layer 29 is located on a side of the encapsulation layer 217 away from the base substrate 100. The third winding region R3 and the fourth winding region R4 (as shown in FIG. 6B) through which the second signal line GS2 passes partially overlap with the first opening peripheral sub-region 203. The touch signal line winding region R5 partially overlaps with the first opening peripheral sub-region 203. In the first opening peripheral sub-region 203 and the region between the first opening peripheral sub-region 203 and the opening 201, the distance between the touch layer 28 and the display panel 100 is increased by arranging the fifth insulating layer 29, that is, the distances from the first connecting portion Rx1 and the second connecting line Tx1 to the second signal line GS2 and the first signal line DS2 are increased, so that the distance between a portion of the first connecting portion Rx1 and the second connecting line Tx1 that is located in the first opening peripheral sub-region 203 and the base substrate 100 is greater than the distance between a portion of the first connecting portion Rx1 and the second connecting line Tx1 that is located in a region where the touch signal line winding region R5 does not overlap with the first opening peripheral sub-region 203 and the base substrate 100. Therefore, influence of dense wiring of the second signal line GS2 and the first signal line DS2 in the opening peripheral region on electric potential of the first connecting portion Rx1 and the second connecting line Tx1 is reduced.

For example, the material of the fifth insulating layer 29 may include organic insulating materials such as polyimide, polyphthalimide, polyphthalamide, acrylic resin, benzocyclobutene or phenolic resin, or inorganic insulating materials such as silicon oxide and silicon nitride, which will not be limited in embodiments of the present disclosure.

For example, the material of the protective layer 284 may include insulating materials such as silicon nitride, silicon oxide, silicon oxynitride, and polymer resin. Inorganic materials such as silicon nitride, silicon oxide, and silicon oxynitride have high compactness and may prevent intrusion of water and oxygen, etc.; and polymer resins, etc. may planarize the surface of the display panel and relieve stress.

For example, as shown in FIG. 9A and FIG. 12A, the second opening peripheral sub-region 204 further includes a shielding line 242, and the shielding line 242 is configured to shield an interference signal. The display panel 1 further includes an intercepting wall region located between the second opening peripheral sub-region 204 and the opening 201, a detecting line PCD, a first barrier wall region 31 located between the second opening peripheral sub-region 204 and the intercepting wall region, and a second barrier wall region 32 located between the intercepting wall region and the opening 201. The first barrier wall region 31, the second barrier wall region 32 and the intercepting wall region may isolate the display region 10 and the opening region 201, so as to protect the display region 10.

For example, as shown in FIG. 12A, the first barrier wall region 31 includes a groove 311; the groove 311 includes a groove 312 formed in the encapsulation layer 217; and the groove 312 is covered by the first organic encapsulation layer 2172. The groove 311 disconnects the second electrode 263, so as to reduce influence of the opening peripheral region on the second electrode 263. For example, a length X4 of the groove 312 of each of the grooves 311 along the first direction X is about 11 μm to 13 μm, for example, a value is about 12 μm; here, the word "about" indicates that the value may fluctuate within a range of, for example, ±15%, or for another example, ±%25. For example, a distance X5 between the groove 311 (e.g., the center) and the fifth insulating layer 29 (e.g., a surface on a side close to the base substrate) along the direction perpendicular to the base substrate 100 is greater than 5 μm.

Figure 12B:
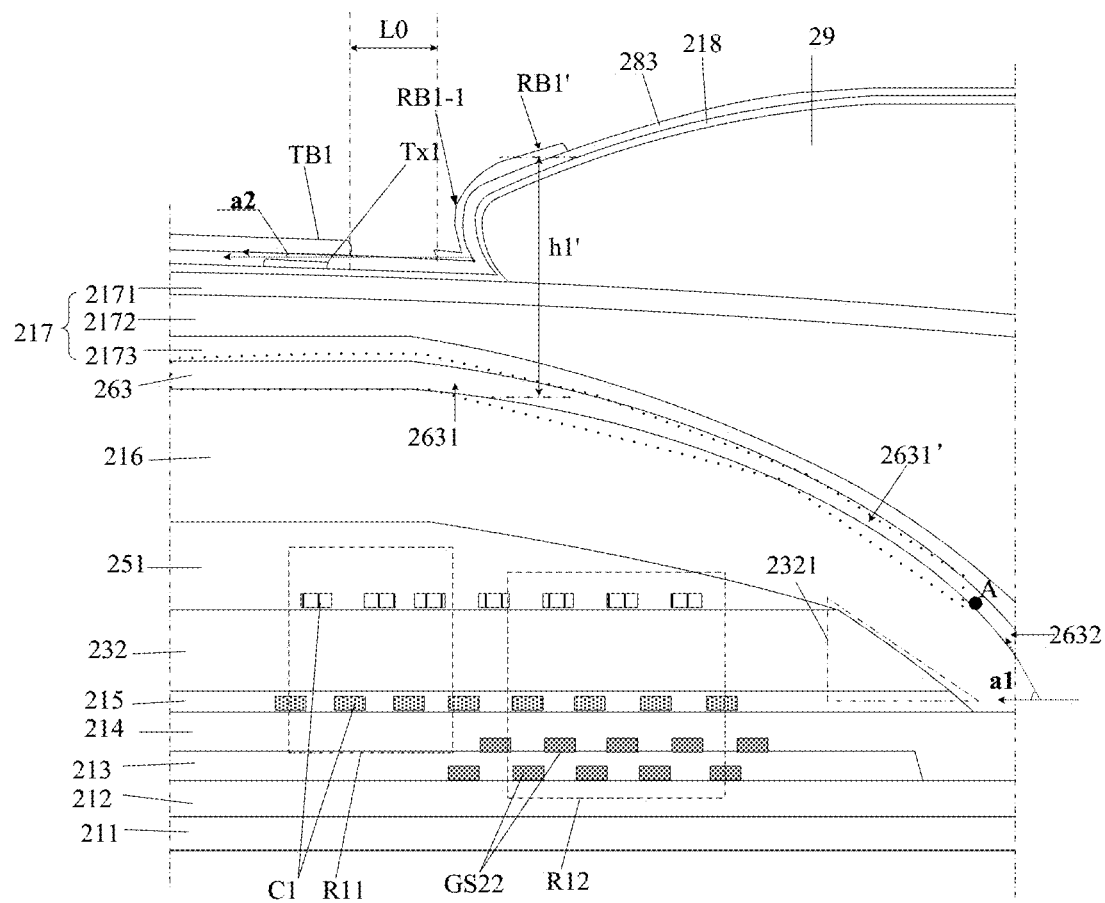
FIG. 12B is a cross-sectional schematic diagram of a display region and a light-transmitting region of a display panel provided by at least another embodiment of the present disclosure.

As shown in FIG. 12A, the second electrode 263 includes a first portion; and the first portion extends to the opening peripheral region 20. For example, another portion of the second electrode 263 is located in the display region. FIG. 12B is an enlarged diagram of a K2 region in FIG. 12A. As shown in FIG. 12B, the first portion of the second electrode 263 includes a first sub-portion 2631 and a second sub-portion 2632. The first sub-portion 2631 is located on the left side in the figure, and the second sub-portion 2632 is located on the right side in the figure. The first sub-portion 2631 at least partially overlaps with the orthogonal projection of the fourth insulating layer 232 on the base substrate 100; and the second sub-portion 2632 does not overlap with the orthogonal projection of the fourth insulating layer 232 on the base substrate 100. That is, the second sub-portion 2632 is a portion that does not overlap with the fourth insulating layer 232. As shown in FIG. 12A, the second sub-portion 2632 extends toward the right side to the first barrier wall region 31. The first sub-portion 2631 at least partially overlaps with orthogonal projections of the first sub-region R11 of the first winding region R1 and the second sub-region R12 of the first winding region R1 on the base substrate 100. The second sub-portion 2632 does not overlap with the orthogonal projections of the first sub-region R11 of the first winding region R1 and the second sub-region R12 of the first winding region R1 on the base substrate 100.

In some embodiments of the present disclosure, as shown in FIG. 12A, the plurality of pixel drive circuit units P each include a first transistor T1; the first transistor T1 is electrically connected with the light emitting element 26; and the light emitting element is located on a side of the fourth insulating layer 232 away from the base substrate 100. The second electrode 263 includes a first sub-portion 2631 and a second sub-portion 2632 located in the peripheral region; the first sub-portion 2631 at least partially overlaps with a projection of the fourth insulating layer 232; and the second sub-portion 2632 does not overlap with the projection of the fourth insulating layer 232. An orthogonal projection overlap area between the first sub-portion 2631 and the first extending portions Y1 of then first signal lines DS2 on the base substrate is S3. An orthogonal projection overlap area between the second sub-portion 2632 and the first bending portions C1 of the n first signal lines DS2 on the base substrate 100 is S4, and S3>S4. For example, S4 may be equal to 0, that is to say, the second sub-portion 2632 does not overlap with the fourth insulating layer 232 while it does not overlap with the projection of the first bending portion C1 on the base substrate 100.

In some embodiments of the present disclosure, as shown in FIG. 4E, FIG. 12A and FIG. 12B, the display panel further includes a second signal line GS2, which is configured to supply a second signal to the plurality of pixel drive circuit units P. One first extending portion Y1 of the n first signal lines includes: a plurality of first extending overlapping portions YC (e.g., YC-1, YC-2, . . . YC-x) that overlap with projections of the plurality of second signal line bending portions GS22. The first bending portion C1 connected with the first extending portion includes a first bending overlapping portion CC that overlaps by projection with at least one bending portion GS22 of the plurality of second signal lines; and the distance from at least one of the plurality of first extending overlapping portions YC (e.g., at least one of YC-1, YC-2, . . . YC-x) on a same first signal line DS2 to the second sub-portion 2632 is greater than the distance from the first bending overlapping portion CC to the second sub-portion.

It should be noted that, overlapping by projection according to the embodiments of the present disclosure refers to that orthogonal projections of the two on the base substrate 100 overlap with each other.

For example, as shown in FIG. 4E, FIG. 12A and FIG. 12B, in the direction perpendicular to the base substrate 100, an insulating layer, for example, an interlayer insulating layer, is provided between the first signal line DS2 and the second signal line GS2; and a planarization layer is provided between the first signal line DS2 and the second electrode 263 (e.g., the cathode). The distance from the first extending overlapping portion YC and the first bending overlapping portion CC to the second sub-portion 2632 is related to the thickness of the planarization layer (further related to thicknesses of the planarization layer, the interlayer insulating layer, etc.) therebetween; the distance from the first extending overlapping portion YC and the first bending overlapping portion CC to the second sub-portion 2632 in the present disclosure may be understood as a distance from the first extending overlapping portion YC and the first bending overlapping portion CC to a same position point, for example, point A, on the second sub-portion 2632.

In some embodiments of the present disclosure, the first extending portion Y1 of the first signal line is a straight line segment; and the first bending portion C1 is an arc line segment.

In some embodiments of the present disclosure, as shown in FIG. 3C, FIG. 12A, and FIG. 12B, one first extending portion Y1 of the n first signal lines DS includes a widened portion E1 electrically connected with the display region; and the distance from the widened portion E1 on a same first signal line to the second sub-portion 2632 is greater than the distance from the first extending overlapping portion YC or the first bending overlapping portion CC to the second sub-portion 2632.

For example, in the direction perpendicular to the base substrate 100, a planarization layer is provided between the first signal line DS2 and the second electrode 163 (e.g., the cathode). The distance from the widened portion E1, the first extending overlapping portion YC, and the first bending portion C1 to the second sub-portion 2632 is related to the thickness of the insulating layer, for example, the thickness of the planarization layer, or the thickness of the planarization layer, the thickness of the interlayer insulating layer, etc., between each of the three and the second electrode 163. In the present disclosure, the distance from the widened portion E1, the first extending overlapping portion YC and the first bending portion C1 to the second sub-portion 2632 may be understood as a distance from the three to a same position point, for example, point A, on the second sub-portion 2632. In this way, the second sub-portion 2632 may be kept as far away from the display region as possible, and the first bending portion C1 closer to it may be kept as far away from the display region as possible, so that influence on the display is minimized.

In some embodiments of the present disclosure, as shown in FIG. 5, FIG. 12A and FIG. 12B, the display panel includes a pixel defining layer 216; the pixel defining layer 216 is located on a side of the fourth insulating layer 232 away from the base substrate 100 and includes a plurality of pixel openings K; at least a portion of the light emitting layer 262 of the light emitting element 26 is located in the plurality of pixel openings K; the fourth insulating layer 232 includes a thinned portion 2321 that is located in the peripheral region and does not overlap with the projection of the first signal line; and a thickness of the thinned portion in the direction perpendicular to the base substrate 100 is less than a thickness of the fourth insulating layer in the direction perpendicular to the base substrate 100 in the display region. That is, the portion of an edge of the fourth insulating layer 232 that is close to the light-transmitting region 201 (e.g., an opening) is thinned.

As shown in FIG. 12B, the fourth insulating layer 232 includes a thinned portion 2321 (the portion framed by a dashed line in the figure) that does not overlap with the second signal line GS2 and the projection of the second signal line GS2 on the base substrate 100. The surface on a side of the thinned portion 2321 away from the base substrate 100 is an inclined surface. The thickness of the thinned portion 2321 in the direction perpendicular to the base substrate 100 is less than the thickness of the fourth insulating layer 232 in the first sub-region R11 in the direction perpendicular to the base substrate 100. That is, the portion of an edge of the fourth insulating layer 232 that is close to the opening 201 is thinned.

In some embodiments of the present disclosure, the first connecting portion includes a first connecting sub-portion; an orthogonal projection of the first connecting sub-portion on the base substrate does not overlap with the orthogonal projections of the first bending portions of the n first signal lines on the base substrate; among the n first signal lines, a distance between first extending portions of two adjacent first signal lines is greater than a distance between first bending portions of two adjacent first signal lines; and the projection of the first connecting sub-portion is located within a projection range of the second electrode, and a vertical distance H3 between the first connecting sub-portion and the second electrode is greater than a vertical distance H4 from the first main body portion of the first signal line to the second electrode.

For example, the first connecting portion Rx1 and the first connecting sub-portion may be an integral structure, and in this case, the vertical distance H3 between the first connecting sub-portion and the second electrode 263 may be understood to be substantially equal to the distance H2 between the first connecting portion Rx1 and the second electrode 263.

For example, the first main body portion DS of the first signal line and the first extending portion Y1 may be arranged in a same layer; and in this case, the vertical distance H4 between the first main body portion DS of the first signal line and the second electrode 263 is approximately equal to the vertical distance H1 between the first extending portion Y1 and the second electrode 263. For another example, in the case where the first main body portion DS and the first extending portion Y1 electrically connected therewith are located in different layers, the vertical distance H4 between the first main body portion DS of the first signal line and the second electrode 263 is greater or less than the vertical distance H1 between the first extending portion Y1 and the second electrode 263, and the difference between the two is the thickness of the intermediate insulating layer.

As shown in FIG. 4C and FIG. 12B, in the direction perpendicular to the base substrate 100, a distance from a plurality of second extending overlapping portions ST1 on a same second signal line GS2 to the second sub-portion 2632 of the second electrode 263 is greater than a distance from the second bending overlapping portion WT1 to the second sub-portion 2632 of the second electrode 263. That is to say, the second bending overlapping portion WT1 is closer to the opening 201 than the first extending overlapping portion ST1. Because the portion of the edge of the fourth insulating layer 232 that is close to the opening 201 is thinned, the second sub-portion 2632 of the second electrode 263 bends and extends toward the side close to the base substrate 100 in the thinned region. Thus, the distance from the plurality of second extending overlapping portions ST1 to the second sub-portion 2632 of the second electrode 263 is greater than the distance from the second bending overlapping portion WT1 to the second sub-portion 2632 of the second electrode 263.

As shown in FIG. 3D, FIG. 4C and FIG. 12B, in the first direction X, a distance from the second widened portion E2 on a same second signal line GS2 to the second sub-portion 2632 of the second electrode 263 is greater than a distance from a plurality of second extending overlapping portion ST1 or a plurality of second bending overlapping portions WT1 to the second sub-portion 2632 of the second electrode 263. That is, the second widened portion E2 is closer to the display region than the plurality of second extending overlapping portion ST1 or the plurality of second bending overlapping portions WT1.

As shown in FIG. 3D, FIG. 4C and FIG. 12B, a distance between two adjacent second widened portions E2 is greater than a distance between two adjacent second bending overlapping portions WT1 or two adjacent second extending overlapping portions ST1.

In some embodiments of the present disclosure, at least one first signal line DS1/DS2 is configured to receive electric potential of the first voltage range; the first sub-portion is configured to receive electric potential of the second voltage range; and the maximum value of the absolute value of the first voltage range is greater than the maximum value of the absolute value of the second voltage range.

In some embodiments of the present disclosure, the first voltage range is 0 V to +8 V; and the second voltage range is −2 V to −5 V. For example, the first signal line may be a data signal line, and the first voltage range is a data line voltage range; and for example, the second voltage range is a cathode voltage range, and the first sub-portion is configured to receive cathode voltage electric potential.

In some embodiments of the present disclosure, at least one second signal line GS2 is configured to receive electric potential of a third voltage range; the first connecting portion is configured to receive electric potential of the fourth voltage range; and the maximum value of the third voltage range is greater than the maximum value of the fourth voltage range.

For example, the second signal line GS2 may be a scan signal line, for example, a gate scan line or a reset signal scan line; the third voltage range is −8 V to +8 V, and the fourth voltage range is 1 V to 5 V; during specific implementation, the voltage value may be selected according to the specific pixel drive circuit, which will not be limited in the present disclosure.

In some embodiments of the present disclosure, as shown in FIG. 12B, the second electrode 263 includes a third sub-portion 2631' located on the thinned portion; for example, an included angle between a portion 2631' (the third sub-portion 2631') of the first sub-portion 2631 that is located on the thinned portion and a plane where the base substrate 100 is located includes a first slope angle a1; an included angle between a plane where the first connecting portion Rx1 is located and the plane where the base substrate is located includes a second slope angle a2; and the first slope angle a1 is greater than or equal to the second slope angle a2.

For example, as shown in FIG. 12B, the included angle between the portion 2631' (the third sub-portion 2631') of the first sub-portion 2631 that is located on the thinned portion 2321 and the plane where the base substrate 100 is located has an increasing trend along the portion towards the base substrate 100. The first slope angle a1 is the maximum value of the included angle between a tangent plane of the portion 2631' (the third sub-portion 2631') located on the thinned portion 2321 and the plane where the base substrate 100 is located. During specific implementation, a2 is less than or equal to 5°, for example, it may be 0°, 1°, 2°, 3°, etc. In the embodiments of the present disclosure, it may also be a value greater than 5°, as long as the first slope angle a1 is greater than or equal to the second slope angle a2.

In some embodiments of the present disclosure, as shown in FIG. 12A, the display panel 1 further includes a barrier structure DAM located in the display region and the light-transmitting region; a thickness of the barrier structure DAM is H6; the second electrode 263 further includes a partition portion 2633; a distance from the partition portion 2633 to the barrier structure DAM is L2; and the first slope angle a1 is less than acrtan(H6/(L2/10)).

In some embodiments of the present disclosure, a first organic encapsulation layer 2172 is further provided above the second sub-portion 2632; and the first slope angle a1 is less than acrtan(H6/(L2/10)). In this way, organic layer flow above the second electrode 263 may be further slowed down, so as to improve encapsulation performance.

In some embodiments of the present disclosure, the value range of the second slope angle a2 is 0° to 10°.

In some embodiments of the present disclosure, the width of the first connecting portion Rx1 is greater than 10 µm; and the value range of the line width of at least one first signal line is 1 µm to 5 µm. For example, in some examples, the value rang of the width of the first connecting portion Rx1 is 20 µm to 110 µm.

For example, the value of the line width DS of the first signal line is 1.5 µm to 3 µm, and the width of the first connecting portion Rx1 is a size in the second direction Y, which, during specific implementation, may be 20 µm, 40 µm, 50 µm, 60 µm, 70 µm, 90 µm, 110 µm, 130 µm, 150 µm, 170 µm, 190 µm, and values between these points. The width of the first connecting portion Rx1 needs to be actually designed according to a size of the hole and a width of a frame around the hole, which will not be limited in this embodiment.

In some embodiments of the present disclosure, as shown in FIG. 12B, the display panel further includes an encapsulation layer 217 located between the light emitting element 26 and the touch layer 28 as well as a fifth insulating layer 29 located in the peripheral region; the encapsulation layer 217 at least includes a first organic encapsulation layer; the fifth insulating layer is located on a side of the first organic encapsulation layer 2172 away from the base substrate 100; the touch layer 28 includes a first dummy block RB1-1; the first dummy block includes a first dummy sub-block RB1' at least partially provided on the fifth insulating layer; and a distance between the first connecting portion Rx1 and the base substrate 100 is less than a distance between the first dummy sub-block RB1' and the base substrate 100.

For example, as shown in FIG. 12B, a thickness of the fifth insulating layer 29 is greater than 2 µm, for example, a thickness range of the fifth insulating layer 29 is 2 µm to 11 µm, for example, (unit: µm) 3, 4, 5, 6, 7, 8, 9, 10, and intermediate values between the respective point values; a distance between the first dummy sub-block RB1' and the base substrate 100 is greater than a distance between the first connecting portion Rx1 and the base substrate 100, for example, it is designed to be greater than 2 µm so that influence between the first dummy sub-block RB1', the second electrode, and the signal line therebelow may be alleviated.

In some embodiments of the present disclosure, as shown in FIG. 12B, the fifth insulating layer 29 includes a first side face; the first dummy block RB1-1 is provided on the first side face; and an included angle between the first dummy block RB1-1 and the plane where the base substrate is located includes a third slope angle a3, where a3≥5*a1≥a2.

In some embodiments of the present disclosure, as shown in FIG. 12B, for example, an angle range of the third slope angle a3 is 30° to 60°.

In some embodiments of the present disclosure, as shown in FIG. 12A to FIG. 12D, the display panel further includes a barrier structure DAM located between the display region and the light-transmitting region, an encapsulation layer 217 located between the light emitting element 26 and the touch layer 28, and a fifth insulating layer 29 located in the peripheral region; the encapsulation layer 217 at least includes a first organic encapsulation layer 2172; the fifth insulating layer 29 is located on a side of the first organic encapsulation layer 2172 away from the base substrate 100; and the display panel further includes a first groove 312-1, the first groove 312-1 is located on a side of the barrier structure DAM away from the display region, and a thickness of the fifth insulating layer 29 in the groove is H8, where H8≤H2.

For example, a thickness of the fifth insulating layer 29 in the groove may range from 5 µm to 10 µm, for example, may be 6 µm, 7 µm, 8 µm, 9 µm, so as to improve flatness of the transparent region 201 or the peripheral region 202 around the transparent region 201 and the display region 10.

Figure 12C:
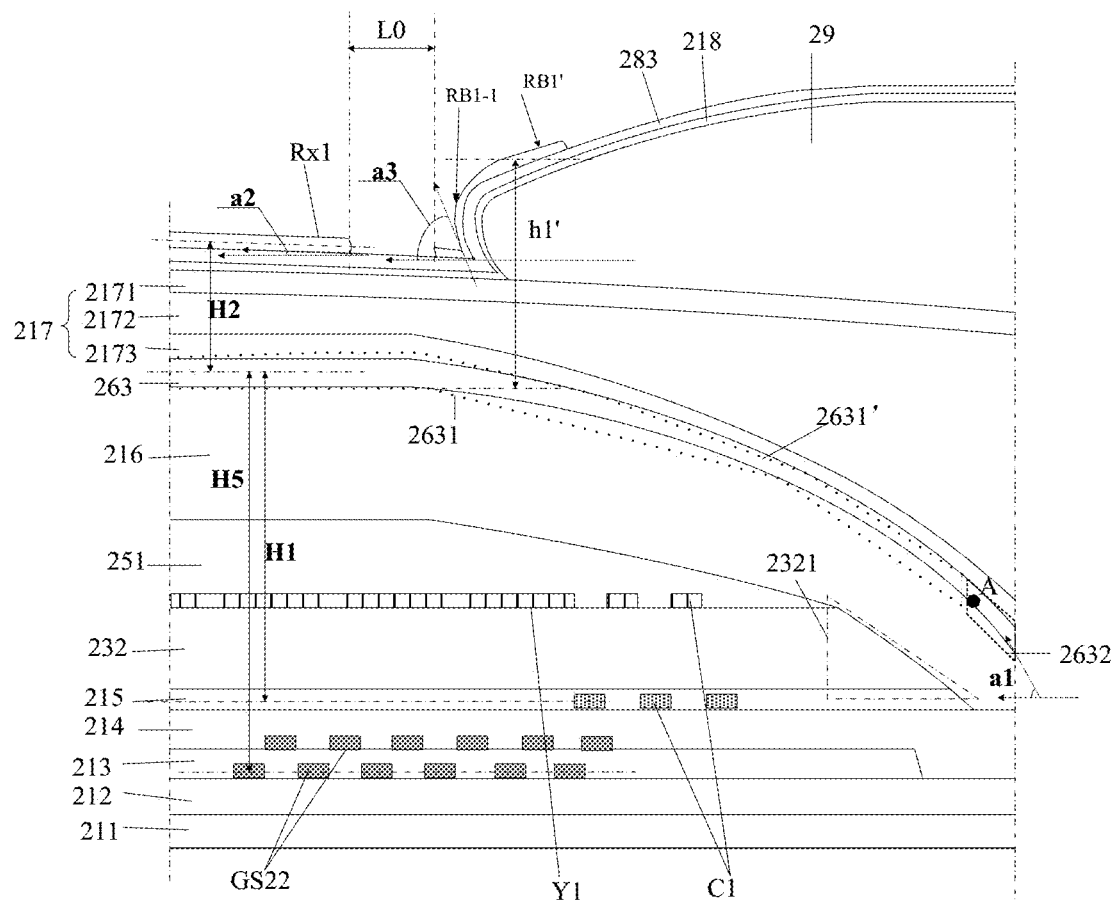
FIG. 12C is a cross-sectional schematic diagram of a display region and a light-transmitting region of a display panel provided by at least another embodiment of the present disclosure.
Figure 12D:
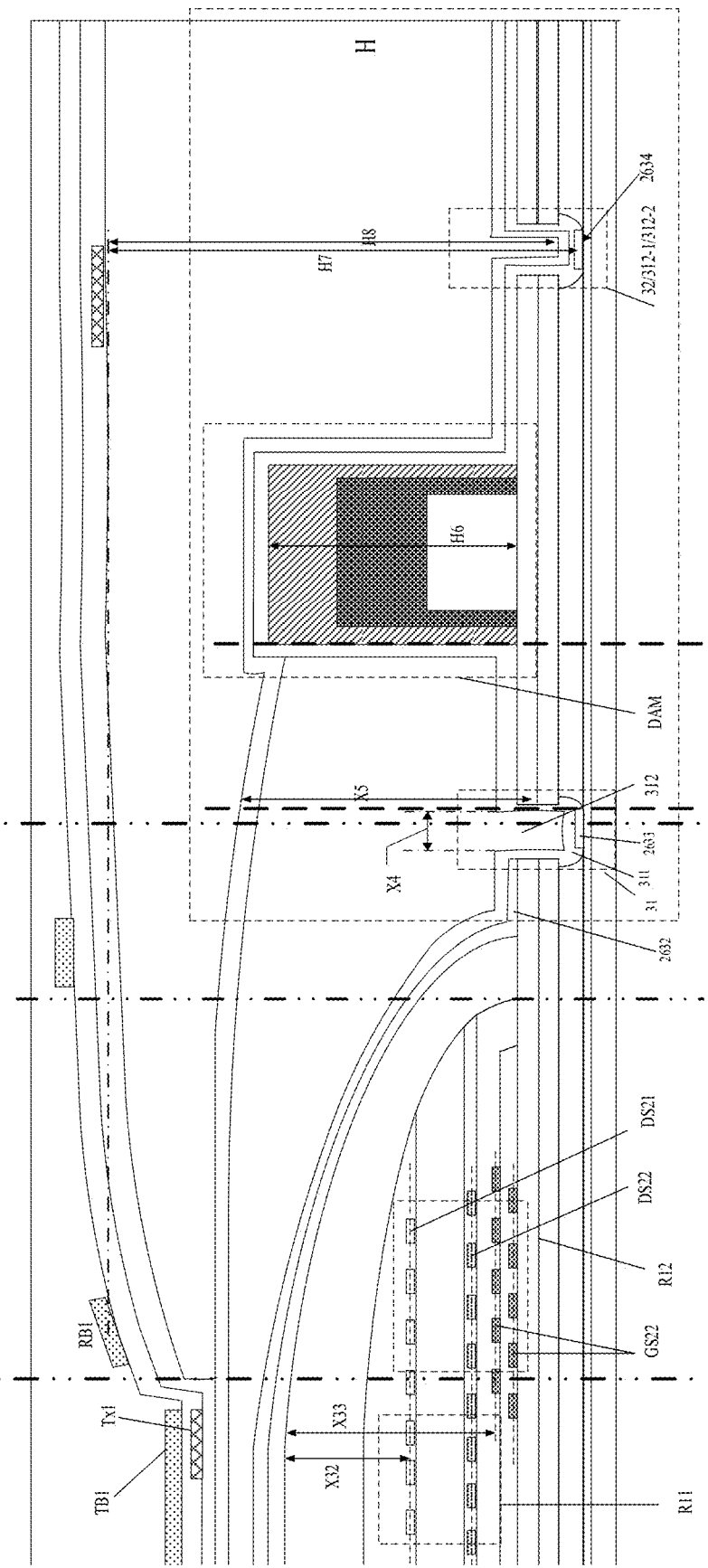
FIG. 12D is a partial enlarged schematic diagram of FIG. 12A.

In some embodiments of the present disclosure, as shown in FIG. 12D, a vertical distance between the first connecting portion Rx1 and the second electrode 263 is H2, and the display panel further includes a barrier structure located between the display region and the light-transmitting region as well as a second groove 312-2; the second groove is located on a side of the barrier structure DAM away from the display region; the display panel further includes a second dummy block 2634; the second dummy block 2634 is at least partially located in the second groove 312-2; a vertical distance between the second dummy block 2634 and the first dummy block DMB2 is H7; H7 is different from the vertical distance H2 between the first connecting portion and the second electrode; the second dummy block 2634 is farther away from the display region than the second electrode 263; and the second dummy block 2634 is in a floating connection.

It should be noted that, the first groove 312-1 and the second groove 312-2 according to the embodiments of the present disclosure may be a same groove, as shown in FIG. 12D, or may also be a plurality of separated grooves, which will not be limited in the embodiments of the present disclosure.

For example, the second barrier wall region 32 may include a plurality of grooves having a same structure as the first groove 312-1. The number ranges from, for example, 4 to 8, or more, with a protective layer covering above, which is favorable for encapsulation performance.

In some embodiments of the present disclosure, as shown in FIG. 12D, an included angle between the second dummy block 2634 and the base substrate is less than or equal to an included angle between the first dummy block DMB2 and the base substrate 100.

In some embodiments of the present disclosure, as shown in FIG. 12B, the display panel further includes an encapsulation layer 217 located between the light emitting element and the touch layer 28 (e.g., the touch layer 28 includes structures such as a second connecting line compensating portion TB1 and a second connecting line Tx1, etc.) as well as a fifth insulating layer 29 located in the peripheral region; the encapsulation layer 217 at least includes a first organic encapsulation layer 2172; the fifth insulating layer 29 is located on a side of the first organic encapsulation layer 2172 away from the base substrate 100; the touch layer 28 includes a first dummy block RB1-1; there is a gap L0 between the first dummy block RB1-1 and the first connecting portion Rx1; one first extending portion Y1 of one of then first signal lines includes a widened portion E1 electrically connected with the display region; a minimum linear distance between the widened portion E1 and the first extending overlapping portion YC on the signal line is L3; an area of the first dummy block RB1-1 is A4; an area of the widened portion E1 is A5; a vertical distance between the first dummy block RB1-1 and the second electrode is h1'; and a vertical distance between the widened portion and the second electrode is h2', where h1'/h2'>(A5/A4)*(L0/L3).

For example, the widened portion E1 of the first extending portion Y1 and the first extending portion are an integral structure; and in this case, the vertical distance h2' between the widened portion and the second electrode is equal to the vertical distance H1 between the first extending portion Y1 and the second electrode.

For example, the value of L0 ranges from 9 μm to 13 μm, the value range of L3 is 4 μm to 10 μm; for example, the value of L0 ranges from 10 μm to 11 μm, or from 12 μm to 13 μm; and the value range of L3 is 5 μm to 6 μm, 7 μm to 8 μm, 9 μm to 10 μm, 11 μm to 12 μm, or the like.

Figure 13:
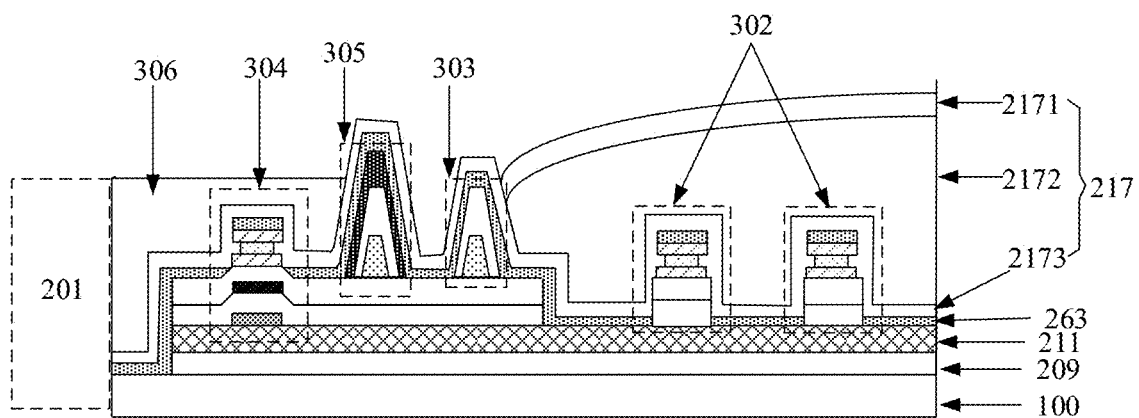
FIG. 13 is a schematic diagram of region H in FIG. 12A provided by at least one embodiment of the present disclosure.

For example, FIG. 13 is a schematic diagram of region H in FIG. 12A provided by at least one embodiment of the present disclosure. As shown in FIG. 13, the intercepting wall region DAM includes a first intercepting wall 303 and a second intercepting wall 305; the first barrier wall region 31 includes a first barrier wall 302; and the second barrier wall region 32 includes a second barrier wall 304. The number of first barrier walls 302 shown in FIG. 10 is 2.

For example, as shown in FIG. 13, the number of first barrier wall 302 according to at least one embodiment of the present disclosure may also be 1; and the first barrier wall 302 may also be designed as the structure of the third groove 312 in FIG. 12A; meanwhile, the second barrier wall 304 may also be designed as the structure of the third groove 312 in FIG. 12A, that is to say, it is designed as a structure in which the base substrate is grooved.

For example, in the first barrier wall region 31 and/or the second barrier wall region 32, a combination of the structure of the third groove 312 and the structure of the first barrier wall 302 may also be designed; and the number of third grooves 312 and first barrier walls 302 may be one or more, which will not be limited in the embodiments of the present disclosure.

For example, only one of the first intercepting wall 303 and the second intercepting wall 305 may be retained, which may also be understood that only one intercepting wall is provided in the intercepting wall region DAM, as shown in FIG. 12A, as long as the height of the DAM can prevent overflow of the first organic encapsulation layer; and during specific implementation, the DAM has a height between 3 μm and 7 μm, which may be, for example, between 4 μm and 6 μm.

Figure 14A:
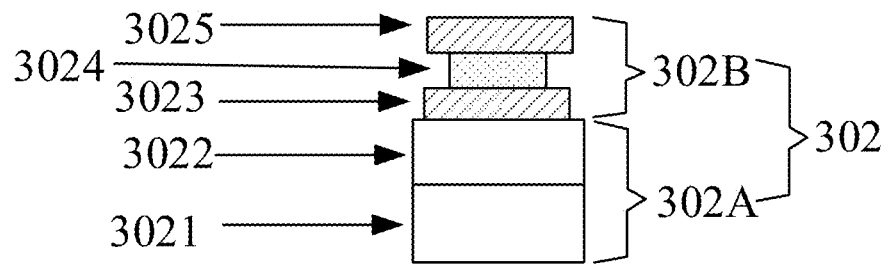
FIG. 14A is a cross-sectional schematic diagram of a first barrier wall in a display panel provided by at least one embodiment of the present disclosure.
Figure 14B:
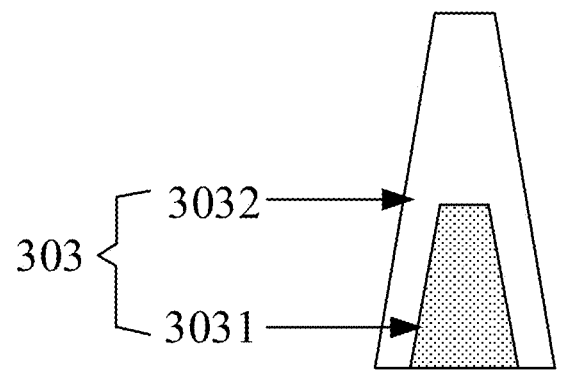
FIG. 14B is a cross-sectional schematic diagram of a first intercepting wall in a display panel provided by at least one embodiment of the present disclosure.
Figure 14C:
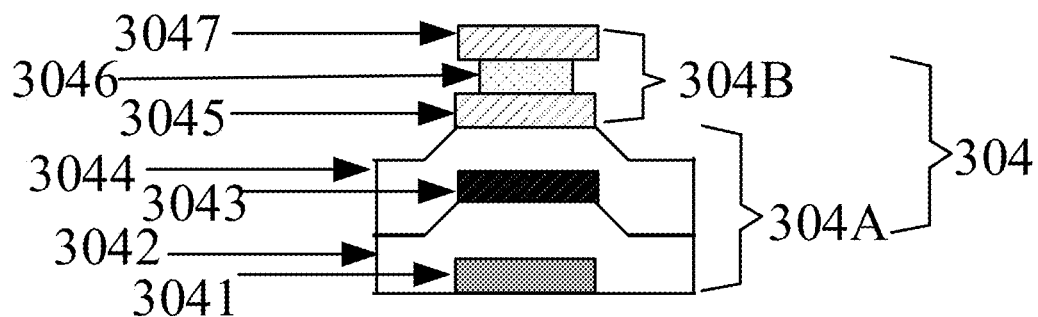
FIG. 14C is a cross-sectional schematic diagram of a second barrier wall in a display panel provided by at least one embodiment of the present disclosure.
Figure 14D:
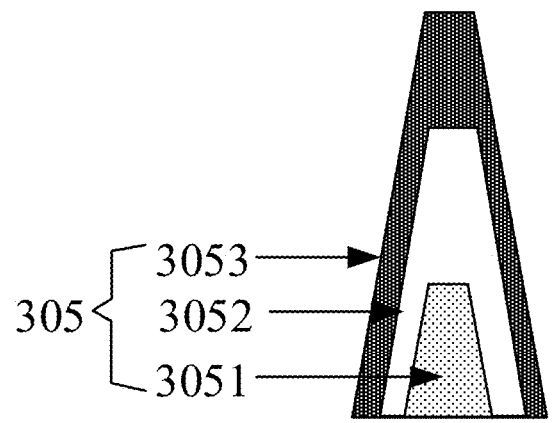
FIG. 14D is a cross-sectional schematic diagram of a second intercepting wall in a display panel provided by at least one embodiment of the present disclosure.

For example, FIG. 14A is a cross-sectional schematic diagram of a first barrier wall in a display panel provided by at least one embodiment of the present disclosure; FIG. 14B is a cross-sectional schematic diagram of a first intercepting wall in a display panel provided by at least one embodiment of the present disclosure; FIG. 14C is a cross-sectional schematic diagram of a second barrier wall in a display panel provided by at least one embodiment of the present disclosure; and FIG. 14D is a cross-sectional schematic diagram of a second intercepting wall in a display panel provided by at least one embodiment of the present disclosure.

For example, as shown in FIG. 13 and FIG. 14A, the first barrier wall 302 includes a first metal layer structure 302B; and at least one side face of the opening 201 of the first metal layer structure 302B has a notch. For example, a side face of the first metal layer structure 302B that faces the opening 201 and a side face thereof that faces away from the opening 201 each have a notch, that is, the situation shown in FIG. 11A. In other examples, one side face of the first metal layer structure 302B is provided with a notch. The first barrier wall 302 may disconnect the functional layer formed on an entire surface of the display panel, for example, the second electrode 263 of the light emitting element 26.

As shown in FIG. 13 and FIG. 14B, the first intercepting wall 303 includes a first insulating layer structure. The first insulating layer structure includes, for example, a laminate layer of a plurality of insulating sub-layers. FIG. 10 and FIG. 11B show a laminate layer including two insulating sub-layers 3031, 3032. The first intercepting wall 303 may intercept some functional layers formed in the display region 10, so as to prevent materials of these functional layers from approaching or entering the opening 201.

As shown in FIG. 13 and FIG. 14C, the second barrier wall 304 includes a second metal layer structure 304B and a first laminate structure 304A; the second metal layer structure 304B is located on the first laminate structure 304A; and at least one side face of the second metal layer structure 304B that surrounds the opening 201 has a notch. For example, a side face of the second metal layer structure 304B that faces the opening 201 and a side face thereof that faces away from the opening 201 each have a notch, that is, the situation shown in FIG. 13 and FIG. 14C. In other examples, one side face of the second metal layer structure 304B has a notch. For example, the first laminate structure 304A includes a laminate layer having a metal layer and an insulating layer. The second barrier wall 304 may also disconnect the functional layer formed on the entire surface of the display panel, so as to achieve a double barrier effect together with the first barrier wall 302; in this case, even if one of the first barrier wall 302 and the second barrier wall 304 fails, the other one of the first barrier wall 302 and the second barrier wall 304 can also achieve a barrier effect. In addition, the second barrier wall 304 is close to the opening 201, and when the opening 201 is formed, for example, by stamping or cutting, the second barrier wall 304 may also prevent cracks that may be generated when forming the opening 201 from expanding, so as to prevent the cracks from extending to the display region 10.

For example, the number of first barrier walls 302, first intercepting walls 303, and second barrier walls 304 may be one or more. FIG. 13 shows the case of two first barrier walls 302, one first intercepting wall 303, and one second barrier wall 304 as an example, but this does not constitute a limitation to the embodiments of the present disclosure.

For example, in some examples, the second metal layer structure 304B of the second barrier wall 304 and the first metal layer structure 302B of the first barrier wall 302 have a same structure and include a same material. Therefore, in the fabrication process of the display panel, the second metal layer structure 304B of the second barrier wall 304 and the first metal layer structure 302B of the first barrier wall 302 may be formed by a same patterning process with a same material layer, thereby simplifying the fabrication process of the display panel.

For example, in some embodiments, as shown in FIG. 14C, the laminate layer of the first laminate structure 304A of the second barrier wall 304 includes a first metal sub-layer 3041, a first insulating sub-layer 3042, a second metal sub-layer 3043, and a second insulating sub-layer 3044 sequentially arranged on the base substrate 100. For example, the first metal sub-layer 3041 is provided in a same layer as the gate electrode 223; the first insulating sub-layer 3042 is provided in a same layer as the first insulating layer 212 or the second insulating layer 213; the second metal sub-layer 3043 is provided in a same layer as the second capacitive electrode 272; and the second insulating sub-layer 3044 is provided in a same layer as the third insulating layer 214. Therefore, these functional layers arranged in a same layer may be formed by a same patterning process with a same material layer, thereby simplifying the fabrication process of the display panel.

For example, the mode of the second barrier wall 304 may be various. For example, in some examples, as shown in FIG. 11C, the first insulating sub-layer 3042 and the second insulating sub-layer 3044 of the second barrier wall 304 may respectively have a same pattern as the first metal sub-layer 3041 and the second metal sub-layer 3043, which is embodied as having a same width in FIG. 11C. In this case, in the fabrication process, the first insulating sub-layer 3042 and the second insulating sub-layer 3044 may be further formed into corresponding patterns by an etching process.

For example, in some embodiments, as shown in FIG. 14A, the first barrier wall 302 may further include a second insulating layer structure 302A; and the first metal layer structure 232B is located on the second insulating layer structure 302A. For example, the second insulating layer structure 302A includes a plurality of insulating sub-layers, for example, as shown in FIG. 11A, includes insulating sub-layers 3021 and 3022. For example, the insulating sub-layer 3021 is provided in a same layer as the first insulating layer 212 or the second insulating layer 213; and the insulating sub-layer 3022 is provided in a same layer as the third insulating layer 214, so that these functional layers arranged in a same layer may be formed by a same patterning process with a same material layer. The arrangement of the second insulating layer structure 302A can enhance the barrier effect of the first barrier wall 302, and is favorable for forming the first inorganic encapsulation layer 2173 on the first barrier wall 302, for example, by deposition, etc., to better form along the surface topography of the first barrier wall 302.

For example, as shown in FIG. 14B, the first intercepting wall 303 includes a plurality of insulating sub-layers, and as shown in FIG. 14B, including an insulating sub-layer 3031 and an insulating sub-layer 3032. For example, the insulating sub-layers 3031 and 3032 are in one-to-one correspondence with and arranged in a same layer as two of the first planarization layer 232, the second planarization layer 251, and the pixel defining layer 216. For example, the insulating sub-layer 3031 is provided in a same layer as the first planarization layer 232; and the insulating sub-layer 3032 is provided in a same layer as the second planarization layer 251. Therefore, in the fabrication process, these functional layers arranged in a same layer may be formed by a same patterning process with a same material layer.

For example, as shown in FIG. 13, the second intercepting wall 305 is higher than the first intercepting wall 303. Therefore, the second intercepting wall 305 and the first intercepting wall 303 together may achieve a double interception effect.

For example, in some examples, as shown in FIG. 14D, the second intercepting wall 305 includes a plurality of insulating sub-layers, and as shown in FIG. 14D, including an insulating sub-layer 3051, an insulating sub-layer 3052, and an insulating sub-layer 3053. For example, the insulating sub-layer 3051 is provided in a same layer as the first planarization layer 232; the insulating sub-layer 3052 is provided in a same layer as the second planarization layer 251; and the insulating sub-layer 2053 is provided in a same layer as the pixel defining layer 216. Therefore, in the fabrication process, these functional layers arranged in a same layer may be formed by a same patterning process with a same material layer.

For example, the three metal sub-layers 3023/3024/3025 of the first metal layer structure 302B and the three metal sub-layers 3045/3046/3047 of the second metal layer structure 304B are respectively in one-to-one correspondence with and made of a same material as three metal layers of the source electrode 224 and the drain electrode 225. Therefore, the first metal layer structure 302B, the second metal layer structure 304B, as well as the source electrode 224 and the drain electrode 225 may be formed by a same patterning process with a same three-layer metal material.

At least one embodiment of the present disclosure further provides a display pane. The display panel includes a base substrate, a light-transmitting region, a display region at least partially surrounding the light-transmitting region, a peripheral region between the display region and the light-transmitting region; a plurality of pixel drive circuit units, the plurality of pixel drive circuit units being at least partially located in the display region; and n first signal lines, configured to supply a first signal to the plurality of pixel drive circuit units. At least one of the first signal lines includes a first main body portion located in the display region, a first extending portion and a first bending portion located in the peripheral region. The first extending portion is electrically connected with the first main body portion, and the first bending portion at least partially surrounds the light-transmitting region and is farther from the first main body portion than the first extending portion. Among the n first signal lines, a distance between first extending portions of two adjacent first signal lines is greater than a distance between first bending portions of two adjacent first signal lines. The display panel further includes a touch layer, including a first touch signal line located in the display region and a first connecting portion located in the peripheral region, and the first connecting portion is electrically connected with the first touch signal line. The display panel further includes m second signal lines, and the m second signal lines are configured to supply a second signal to the plurality of pixel drive circuit units. The first connecting portion at least partially overlaps with an orthogonal projection of the m second signal lines on the base substrate. The display panel further includes a light emitting element, including a first electrode, a light emitting layer and a second electrode. The first electrode is located on a side of the n first signal lines away from the base substrate, and is electrically connected with at least one pixel drive circuit unit, the second electrode is located on a side of the first electrode away from the base substrate, and the light emitting layer is located between the first electrode and the second electrode. Among the n first signal lines, a distance between first extending portions of two adjacent first signal lines is b1, a distance between a first extending portion of at least one first signal line among the n first signal lines and the second electrode in the direction perpendicular to the base substrate is H1. A separation distance between two adjacent second signal lines among the m second signal lines in a region overlapping with the first connecting portion is b2; and a distance between at least one of the m second signal lines and the second electrode in the direction perpendicular to the base substrate is H5, where, b1>b2, H5>H1. In the embodiments of the present disclosure, in limited space, the distance between signal lines close to the display region is designed to be as large as possible so as to ensure that some of the signal lines have relatively sparse density, so that influence of the signal lines on some of cathodes close to the display region is reduced; and in addition, second signal lines with dense arrangement in a corresponding position are arranged away from the second electrode, thereby alleviating influence on the second electrode and improving the display effect.

In at least one embodiment of the present disclosure, as shown in FIG. 3D and FIG. 12A to FIG. 12D, the display panel includes a base substrate 100, a light-transmitting region 201, a display region 10 at least partially surrounding the light-transmitting region 201, and a peripheral region 202 between the display region 10 and the light-transmitting region; a plurality of pixel drive circuit units P, the plurality of pixel drive circuit units P being at least partially located in the display region; n first signal lines DS2, configured to supply a first signal to the plurality of pixel drive circuit units P. At least one of the first signal line DS2 includes a first main body portion DS located in the display region, a first extending portion Y1 and a first bending portion C1 located in the peripheral region 202. The first extending portion Y1 is electrically connected with the first main body portion DS, and the first bending portion C1 at least partially surrounds the light-transmitting region 201 and is farther from the first main body portion DS than the first extending portion Y1. A distance between first extending portions Y1 of two adjacent first signal lines DS2 among the n first signal lines DS2 is greater than a distance between first bending portions C1 of two adjacent first signal lines. The display panel further includes a second signal line GS2, and the second signal line GS2 is configured to supply a second signal to the plurality of pixel drive circuit units P. The first connecting portion Rx1 at least partially overlaps with an orthogonal projection of the m second signal lines GS2 on the base substrate. Among the n first signal lines DS2, a distance between first extending portions Y1 of two adjacent first signal lines DS2 is b1; among the n first signal lines, a distance between a first extending portion Y1 of at least one first signal line DS2 and the second electrode 263 in the direction perpendicular to the base substrate is H1; among the m second signal lines GS2, a separation distance between two adjacent second signal lines GS2 in a region overlapping with the first connecting portion Rx1 is b2; and among the m second signal lines, a distance between at least one of the m second signal lines and the second electrode 263 in the direction perpendicular to the base substrate is H5, where b1>b2, H5>H1.

In at least one embodiment of the present disclosure, the first signal may be a data signal; and the second signal may be a scan signal.

In at least one embodiment of the present disclosure, the first extending portion of the first signal line is a straight line segment; and the first bending portion is an arc line segment.

For example, in some embodiments of the present disclosure, the first bending portion C1 may be a folding line, as long as it at least partially surrounds the light-transmitting region 201, which may also be understood as that, the extension direction of the first bending portion C1 is offset compared with the extension direction of the main body portion DS.

For example, in some embodiments of the present disclosure, the first extending portion Y1 is a straight line segment, which may be understood as that its extension direction is consistent with that of the main body portion DS; and the first bending portion C1 is an arc line segment, which may be understood as that its extension direction is offset compared with the extension direction of the main body portion DS.

In at least one embodiment of the present disclosure, a width of the first connecting portion Rx1 is greater than 10 µm; and a line width of at least one of the first signal lines ranges from 1 µm to 5 µm. For example, in some examples, the value range of the width of the first connecting portion Rx1 is from 20 µm to 110 µm.

For example, in some embodiments of the present disclosure, a shape of the first connecting portion Rx1 may be a rectangle, in this case, the width of the first connecting portion Rx1 may be a width of the rectangle. For another example, the shape of the first connecting portion Rx1 may be an arc block, and in this case, the width of the first connecting portion Rx1 may be an average width along a radial direction of the light-transmitting region 201.

In at least one embodiment of the present disclosure, the display panel further includes a first insulating layer 212, a second insulating layer 213, a third insulating layer 214, and a fourth insulating layer 232 arranged in a direction away from the substrate 100. A first extending portion Y1 of at least one of the n first signal lines DS is located between the third insulating layer 214 and the fourth insulating layer 232. For example, as shown in FIG. 12A and FIG. 12B, the first extending portion Y1 of the at least one of the n first signal lines DS and the first bending portion C1 have an integral structure, and the first extending portion Y1 of the at least one first signal line DS is located between the third insulating layer 214 and the fourth insulating layer 232.

In at least one embodiment of the present disclosure, as shown in FIG. 3D, FIG. 3F and FIG. 12C, the first extending portion Y1 of the at least one of the n first signal lines DS is located on a side of the fourth insulating layer 232 away from the base substrate 100; and the first extending portion Y1 is electrically connected with a first main body portion DS corresponding thereto through a via hole.

In at least one embodiment of the present disclosure, as shown in FIG. 3E, FIG. 3G, FIG. 12A to FIG. 12C, etc., at least one of the m second signal lines GS2 is located on a side of the third insulating layer 214 close to the base substrate 100.

In at least one embodiment of the present disclosure, as shown in FIG. 12A and FIG. 12C, in the direction perpendicular to the base substrate, a distance between the first connecting portion Rx1 and the second electrode 263 is H2, where H2>H5>H1.

In at least one embodiment of the present disclosure, for example, the first connecting portion Rx1 is provided in a same layer as the second connecting line compensating portion TB1; and as shown in FIG. 12A, the distance between the first connecting portion Rx1 and the second electrode 263 is substantially equal to a distance between the second connecting line compensating portion TB1 and the second electrode 263.

In at least one embodiment of the present disclosure, the pixel drive circuit unit in the pixel display region may adopt a low-temperature polysilicon semiconductor drive circuit, for example, 7T1C circuit drive; or may also adopt an oxide semiconductor drive circuit, for example, 3T1C; or may also adopt a LTPO (both low-temperature polysilicon and oxide) drive circuit, for example, 6T1C, 7T1C, 8T1C, 8T2C, 9T1C, 9T2C and other circuits, which will not be limited in this embodiment.

For example, when adopting an LTPO drive circuit, a conductive layer, or a transfer layer, or a layer change structure in the display panel may be located in a same layer or made of a same material as a source-drain electrode of a low-temperature polysilicon TFT; or may also be located in a same layer or made of a same material as a source-drain electrode of an oxide TFT; or may also be located in a same layer or made of a same material as a gate electrode of a low-temperature polysilicon TFT or an oxide TFT, which will not be limited in the embodiments of the present disclosure.

For example, when an LTPO drive circuit is adopted, a light-shielding layer may be added; the light-shielding layer is configured to shield an oxide TFT channel; and meanwhile, the light-shielding layer may also be arranged in the peripheral region 202, and may be ring-shaped to improve an imaging effect.

In at least one embodiment of the present disclosure, for example, when an LTPO drive circuit is adopted, a projection of the light-shielding layer on the base substrate at least partially overlaps with a projection of a first dummy block RB1-1 in a touch layer on the base substrate.

It should be noted that, the distance according to at least one embodiment of the present disclosure may be understood as a vertical distance between two objects in the direction perpendicular to the base substrate.

It should be noted that, "approximately", "substantially", "about", etc. according to the embodiments of the present disclosure indicate that an error range is considered, and a relevant value may fluctuate within a range of, for example, ±10%, ±15%, 20%, or ±25%.

Figure 15:
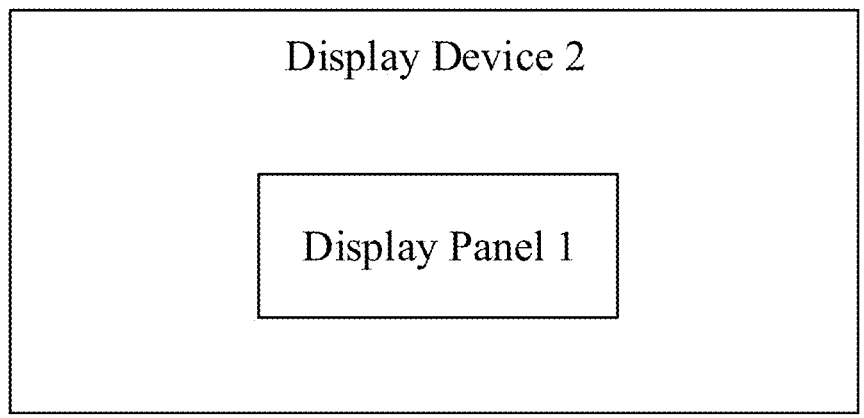
FIG. 15 is a schematic diagram of a display device provided by at least one embodiment of the present disclosure.

FIG. 15 is a schematic diagram of a display device provided by at least one embodiment of the present disclosure. At least one embodiment of the present disclosure provides a display device 2, and the display device may include the display panel 1 according to any one of the above-described embodiments.

For example, as shown in FIG. 15, the display device 2 may further include a flexible circuit board and a control chip. For example, the flexible circuit board is bonded to a bonding region of the display panel 1, and the control chip is mounted on the flexible circuit board, thereby being electrically connected with the display region; or, the control chip is directly bonded to the bonding region, thereby being electrically connected with the display region.

For example, the control chip may be a central processing unit, a digital signal processor, a system on chip (SoC), etc. For example, the control chip may also include a memory, or may also include a power supply module, etc., and implement functions of power supply and signal input and output through separately provided wires, signal lines, and the like. For example, the control chip may also include a hardware circuit and computer executable codes. The hardware circuit may include a conventional very large-scale integration (VLSI) circuit or a gate array, and an existing semiconductor such as a logic chip, a transistor, or other discrete components; and the hardware circuit may also include a field programmable gate array, a programmable array logic, a programmable logic device, etc.

For example, the display device 2 provided by at least one embodiment of the present disclosure may be a mobile phone, a tablet personal computer, a television, a monitor, a laptop, a digital photo frame, a navigator, and any other product or component having a display function.

The following statements should be noted.

(1) The accompanying drawings involve only the structure(s) in connection with the embodiment(s) of the present disclosure, and other structure(s) can be referred to common design(s).

(2) In case of no conflict, features in one embodiment or in different embodiments can be combined to obtain new embodiments.

The above are only specific implementations of the present disclosure, but the protection scope of the present disclosure is not limited thereto. Any person skilled in the art can easily conceive of changes or substitutions within the technical scope disclosed in the present disclosure, which shall cover within the protection scope of this disclosure. Therefore, the protection scope of the present disclosure should be based on the protection scope of the claims.

What is claimed is:

1. A display panel, comprising a base substrate, a plurality of pixel drive circuit units, and n first signal lines,
   wherein the display panel further comprises a light emitting element, the light emitting element comprises a first electrode, a light emitting layer, and a second electrode, the first electrode is on a side of the n first signal lines away from the base substrate, and is electrically connected with at least one pixel drive circuit unit of the plurality of pixel drive circuit units, the second electrode is on a side of the first electrode away from the base substrate, the light emitting layer is between the first electrode and the second electrode, and the light emitting element comprises one type among a red light emitting element, a green light emitting element, and a blue light emitting element;
   the base substrate comprises a light-transmitting region, a display region at least partially surrounding the light-transmitting region, and a peripheral region between the display region and the light-transmitting region;
   the plurality of pixel drive circuit units are at least partially in the display region;
   the n first signal lines are configured to supply a first signal to the plurality of pixel drive circuit units;
   at least one of the n first signal lines comprises a first main body portion located in the display region, a first extending portion and a first bending portion located in the peripheral region, the first extending portion is electrically connected with the first main body portion, and the first bending portion at least partially surrounds the light-transmitting region, and is farther away from the first main body portion than the first extending portion;

among the n first signal lines, a distance between first extending portions of two adjacent first signal lines is greater than a distance between first bending portions of the two adjacent first signal lines; and at least one of the plurality of pixel drive circuit units comprises a low temperature polysilicon thin film transistor and an oxide transistor;

the display panel further comprises: a first insulating layer, a second insulating layer, a third insulating layer, and a fourth insulating layer arranged in a direction away from the base substrate, wherein the plurality of pixel drive circuit units each comprise a low temperature polysilicon thin film transistor and an oxide transistor, one of the low temperature polysilicon thin film transistor and the oxide transistor is electrically connected with the light emitting element, and the light emitting element is on a side of the fourth insulating layer away from the base substrate;

the second electrode comprises a first sub-portion and a second sub-portion in the peripheral region, an orthogonal projection of the first sub-portion on the base substrate at least partially overlaps with an orthogonal projection of the fourth insulating layer on the base substrate, an orthogonal projection of the second sub-portion on the base substrate does not overlap with the orthogonal projection of the fourth insulating layer on the base substrate;

an orthogonal projection overlap area between the first sub-portion and first extending portions of the n first signal lines on the base substrate is S3, an orthogonal projection overlap area between the second sub-portion and first bending portions of the n first signal lines on the base substrate is S4, and

S3>S4.

2. The display panel according to claim 1, further comprising a touch layer, wherein the touch layer comprises a first touch signal line in the display region and a first connecting portion in the peripheral region, the first connecting portion is electrically connected with the first touch signal line;

an orthogonal projection overlap area between the first connecting portion and first extending portions of the n first signal lines on the base substrate is S1, and an orthogonal projection overlap area between the first connecting portion and first bending portions of the n first signal lines on the base substrate is S2, $S1 \geq S2$, S1 is greater than zero, and n is an integer greater than 1, among the n first signal lines, a length of a first extending portion of at least one of the n first signal lines is L1, in a direction perpendicular to the base substrate, a distance between the first extending portion of at least one of the n first signal lines and the second electrode is H1, and a formula is satisfied: $L1*H1=k*(S1/n)$, k is a natural number ranging from 1 to 20.

3. The display panel according to claim 2, wherein a vertical distance between the first connecting portion and the second electrode is H2, an area of a first extending portion of at least one of the n first signal lines is A1, and an area of the first connecting portion is A2, $H2 \geq (1/k1)*(A2/nA1)*H1$, and k1 is a natural number ranging from 10 to 100.

4. The display panel according to claim 3, further comprising:

a barrier structure between the display region and the light-transmitting region;

an encapsulation layer between the light emitting element and the touch layer, and a fifth insulating layer in the peripheral region, wherein the encapsulation layer at least comprises a first organic encapsulation layer, and the fifth insulating layer is on a side of the first organic encapsulation layer away from the base substrate; and a first groove, wherein the first groove is on a side of the barrier structure away from the display region, a thickness of the fifth insulating layer in the first groove is H8, and $H8 \leq H2$.

5. The display panel according to claim 3, further comprising: a barrier structure between the display region and the light-transmitting region, a second groove, and a second dummy block, wherein the second groove is on a side of the barrier structure away from the display region, the second dummy block is at least partially in the second groove, the second dummy block is farther away from the display region than the second electrode, and the second dummy block is in a floating connection.

6. The display panel according to claim 1, wherein a first extending portion of at least one of the n first signal lines is between the third insulating layer and the fourth insulating layer.

7. The display panel according to claim 6, wherein the low temperature polysilicon thin film transistor comprises an active layer located on a side of the first insulating layer near the base substrate, a gate electrode located on the first insulating layer, and a source-drain electrode located on the third insulating layer; and the first extending portion of at least one of the n first signal lines is on a same layer as the source-drain electrode of the low temperature polysilicon thin film transistor, or is made of a same material as the source-drain electrode of the low temperature polysilicon thin film transistor.

8. The display panel according to claim 6, wherein the oxide transistor comprises an active layer on a side of the first insulating layer near the base substrate, a gate electrode located on the first insulating layer, and a source-drain electrode located on the third insulating layer; and the first extending portion of at least one of the n first signal lines is on a same layer as the source-drain electrode of the oxide transistor, or is made of a same material as the source-drain electrode of the oxide transistor.

9. The display panel according to claim 8, further comprising a light-shielding layer, wherein the active layer comprises a source electrode region, a drain electrode region, and a channel region between the source electrode region and the drain electrode region; and the light-shielding layer is arranged in the display region and is configured to shield the channel region of the active layer of the oxide transistor.

10. The display panel according to claim 9, further comprising: a touch layer, an encapsulation layer between the light emitting element and the touch layer, and a fifth insulating layer in the peripheral region, wherein the touch layer comprises a first touch signal line in the display region and a first connecting portion in the peripheral region, the first connecting portion is electrically connected with the first touch signal line;

an orthogonal projection overlap area between the first connecting portion and first extending portions of the n first signal lines on the base substrate is S1, and an orthogonal projection overlap area between the first connecting portion and first bending portions of the n first signal lines on the base substrate is S2, S1≥S2, S1 is greater than zero, and n is an integer greater than 1, among the n first signal lines, a length of a first extending portion of at least one of the n first signal lines is L1, in a direction perpendicular to the base substrate, a distance between the first extending portion of at least one of the n first signal lines and the second electrode is H1, and a formula is satisfied: L1*H1=k*(S1/n), k is a natural number ranging from 1 to 20, wherein the encapsulation layer at least comprises a first organic encapsulation layer, and the fifth insulating layer is on a side of the first organic encapsulation layer away from the base substrate;

the touch layer comprises a first dummy block, and the first dummy block comprises a first dummy sub-block at least partially provided on the fifth insulating layer; and a distance between the first connecting portion and the base substrate is less than a distance between the first dummy sub-block and the base substrate.

11. The display panel according to claim 10, wherein the fifth insulating layer comprises a first side face, the first dummy block is provided on the first side face, and an included angle between the first dummy block and a plane where the base substrate is located comprises a third slope angle a3, and a3≥5*a1≥a2.

12. The display panel according to claim 10, wherein the light-shielding layer and the first dummy block comprise a same material.

13. The display panel according to claim 1, wherein a first extending portion of at least one of the n first signal lines is on a side of the fourth insulating layer away from the base substrate, and the first extending portion is electrically connected with the first main body portion corresponding to the first extending portion through a via.

14. The display panel according to claim 1, wherein one first extending portion of the n first signal lines comprises a widened portion that is electrically connected with the display region;

the widened portion is arranged on a same layer as a source-drain electrode of the oxide transistor, or is made of a same material as the source-drain electrode of the oxide transistor; and a distance from the widened portion to the second sub-portion on a same first signal line is greater than a distance from a first extending overlapping portion or a first bending overlapping portion to the second sub-portion.

15. The display panel according to claim 1, further comprising:

a pixel defining layer, wherein the pixel defining layer is on a side of the fourth insulating layer away from the base substrate and comprises a plurality of pixel openings, and at least a portion of a light emitting layer of the light emitting element is in the plurality of pixel openings; and the fourth insulating layer comprises a thinned portion that is in the peripheral region and does not overlap with an orthogonal projection of the first signal lines on the base substrate, and a thickness of the thinned portion in a direction perpendicular to the base substrate is less than a thickness of the fourth insulating layer in the display region in the direction perpendicular to the base substrate.

16. The display panel according to claim 1, wherein at least one of the n first signal lines is configured to receive electric potential of a first voltage range, the first sub-portion is configured to receive electric potential of a second voltage range, and a maximum value of absolute values of the first voltage range is greater than a maximum value of absolute values of the second voltage range.

17. The display panel according to claim 16, wherein the first voltage range is from 0V to 8V; and the second voltage range is from −2V to −5V.

18. A display device, comprising the display panel according to claim 1.

19. A display panel, comprising a base substrate, a plurality of pixel drive circuit units, and n first signal lines, wherein the display panel further comprises a light emitting element, the light emitting element comprises a first electrode, a light emitting layer, and a second electrode, the first electrode is on a side of the n first signal lines away from the base substrate, and is electrically connected with at least one pixel drive circuit unit of the plurality of pixel drive circuit units, the second electrode is on a side of the first electrode away from the base substrate, the light emitting layer is between the first electrode and the second electrode, and the light emitting element comprises one type among a red light emitting element, a green light emitting element, and a blue light emitting element, wherein the base substrate comprises a light-transmitting region, a display region at least partially surrounding the light-transmitting region, and a peripheral region between the display region and the light-transmitting region;

the plurality of pixel drive circuit units are at least partially in the display region;

the n first signal lines are configured to supply a first signal to the plurality of pixel drive circuit units;

at least one of the n first signal lines comprises a first main body portion located in the display region, a first extending portion and a first bending portion located in the peripheral region, the first extending portion is electrically connected with the first main body portion, and the first bending portion at least partially surrounds the light-transmitting region, and is farther away from the first main body portion than the first extending portion;

among the n first signal lines, a distance between first extending portions of two adjacent first signal lines is greater than a distance between first bending portions of the two adjacent first signal lines; and the plurality of pixel drive circuit units each only comprise a low temperature polysilicon thin film transistor;

the display panel further comprises: a first insulating layer, a second insulating layer, a third insulating layer, and a fourth insulating layer arranged in a direction away from the base substrate, wherein the plurality of pixel drive circuit units each comprise the low temperature polysilicon thin film transistor, the low temperature polysilicon thin film transistor is electrically connected with the light emitting element, and the light emitting element is on a side of the fourth insulating layer away from the base substrate;

the second electrode comprises a first sub-portion and a second sub-portion in the peripheral region, an orthogonal projection of the first sub-portion on the base substrate at least partially overlaps with an orthogonal projection of the fourth insulating layer on the base substrate, an orthogonal projection of the second sub-portion on the base substrate does not overlap with the orthogonal projection of the fourth insulating layer on the base substrate;

an orthogonal projection overlap area between the first sub-portion and first extending portions of the n first signal lines on the base substrate is S3, an orthogonal projection overlap area between the second sub-portion and first bending portions of the n first signal lines on the base substrate is S4, and

S3>S4.

* * * * *